United States Patent
Nose

[19]

[11] Patent Number: 6,040,621
[45] Date of Patent: Mar. 21, 2000

[54] SEMICONDUCTOR DEVICE AND WIRING BODY

[75] Inventor: Sachiyuki Nose, Kyoto, Japan

[73] Assignee: Matsushita Electronics Corporation, Osaka, Japan

[21] Appl. No.: 09/045,832

[22] Filed: Mar. 23, 1998

[30] Foreign Application Priority Data

Mar. 26, 1997 [JP] Japan ................................ 9-073142

[51] Int. Cl.[7] .................. H01L 23/495; H01L 23/48; H01L 23/52
[52] U.S. Cl. .................. 257/666; 257/690; 257/691; 257/702; 257/676; 257/776
[58] Field of Search .................. 257/666, 690, 257/691, 702, 676, 776

[56] References Cited

U.S. PATENT DOCUMENTS

| | | | |
|---|---|---|---|
| 4,720,690 | 1/1988 | Popek et al. | 361/406 |
| 4,996,587 | 2/1991 | Hinrichsmeyer et al. | 257/685 |
| 5,523,622 | 6/1996 | Harada et al. | 287/734 |
| 5,559,316 | 9/1996 | Tomoda | 257/666 |
| 5,872,393 | 2/1999 | Sakai et al. | 257/664 |

FOREIGN PATENT DOCUMENTS

| | | |
|---|---|---|
| 0 293 838 | 12/1988 | European Pat. Off. . |
| 0 335 740 | 10/1989 | European Pat. Off. . |
| 0 375 461 | 6/1990 | European Pat. Off. . |
| 0 592 002 | 4/1994 | European Pat. Off. . |
| 0 614 219 | 9/1994 | European Pat. Off. . |
| 39 11 711 | 10/1990 | Germany . |
| 44 38 449 | 7/1996 | Germany . |
| 05102418 | 4/1993 | Japan . |
| 05160276 | 6/1993 | Japan . |

*Primary Examiner*—Mahshid Saadat
*Assistant Examiner*—Jhihan B. Clark
*Attorney, Agent, or Firm*—McDermott, Will & Emery

[57] ABSTRACT

A semiconductor device is provided with a wiring body including an insulating supporting substrate, and signal lines, power lines and ground lines printed on first and second surfaces of the insulating supporting substrate. The wiring body is mounted on a semiconductor chip, inside pads of the lines of the wiring body are connected with bonding pads on the semiconductor chip through first metal lines, and outside pads of the lines are connected with leads of a lead frame. Since the wiring body has a structure in which the lines are supported by the insulating supporting substrate, refined and various line patterns can be formed by using the wiring body, and an impedance matching function can also be attained. Thus, the invention provides a semiconductor device which can exhibit high noise resistance for a high frequency signal and a high operation speed and a wiring body to be disposed in a high frequency circuit.

50 Claims, 38 Drawing Sheets

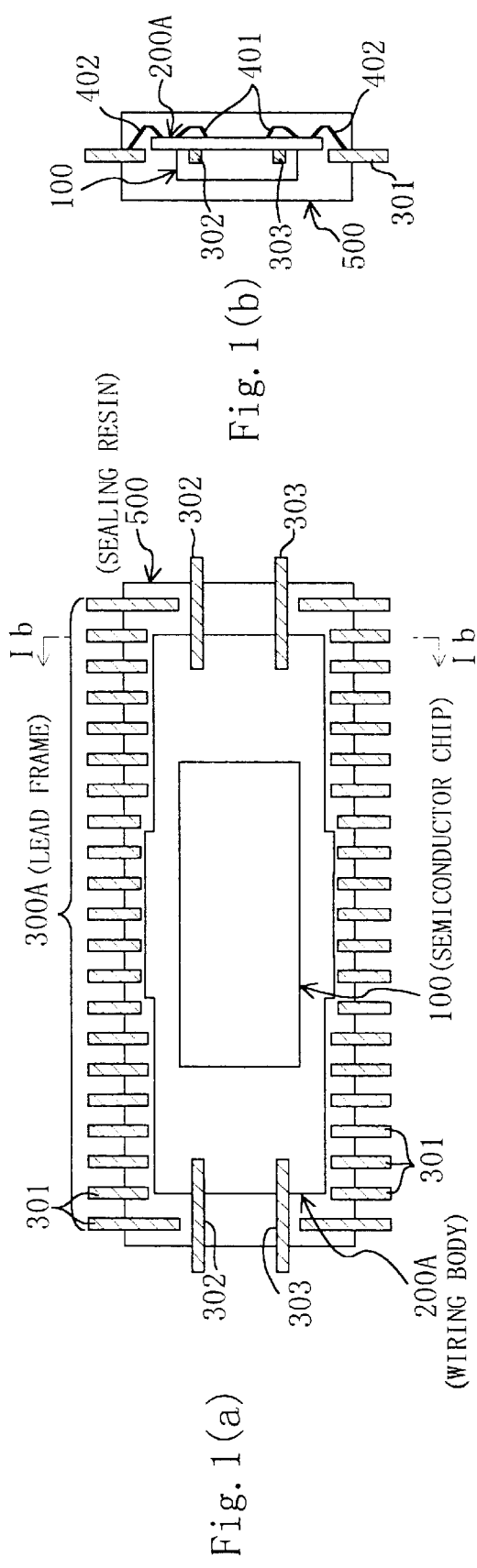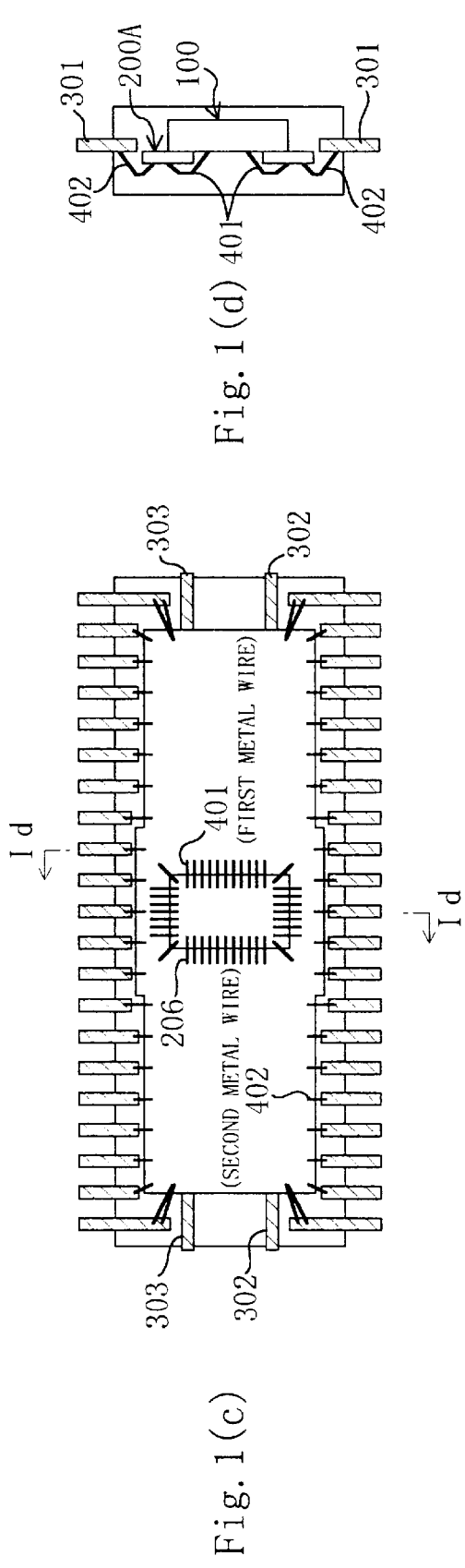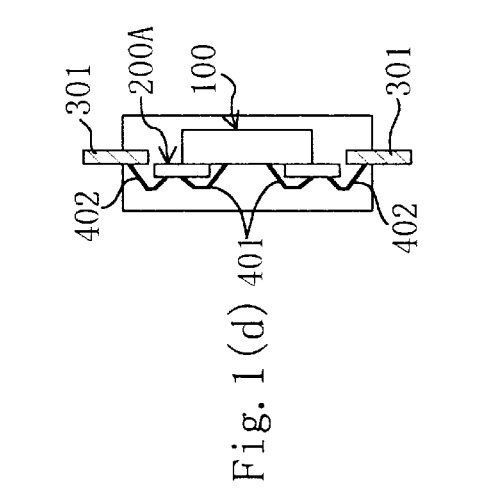

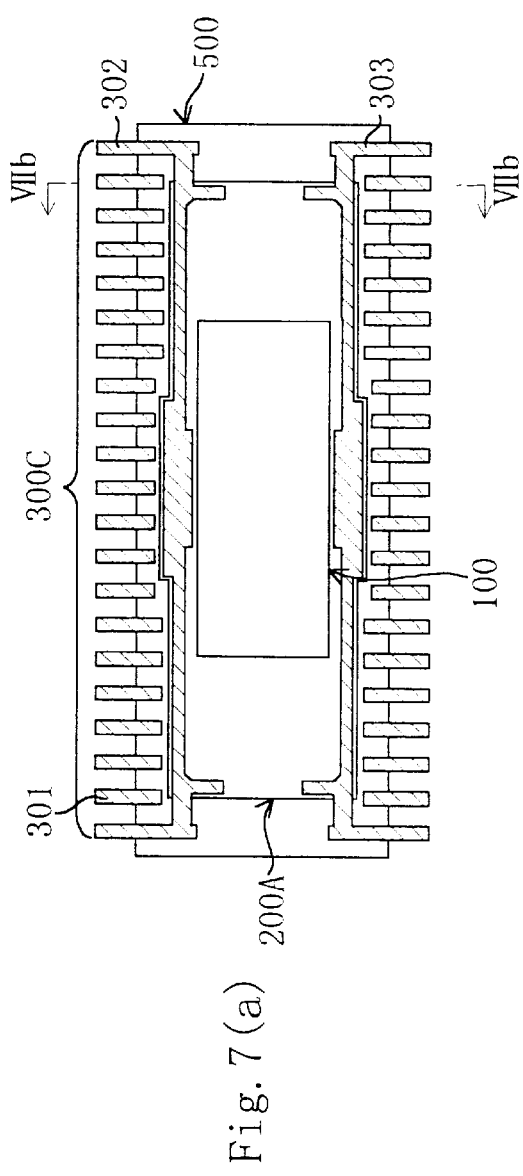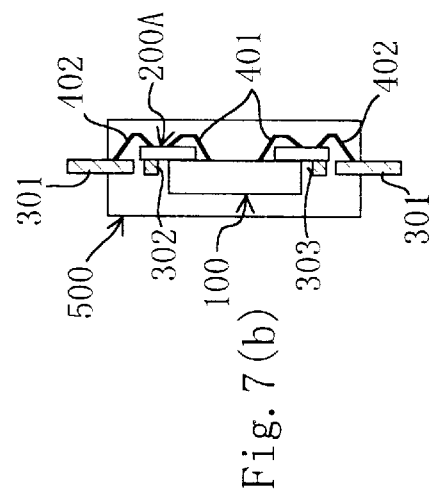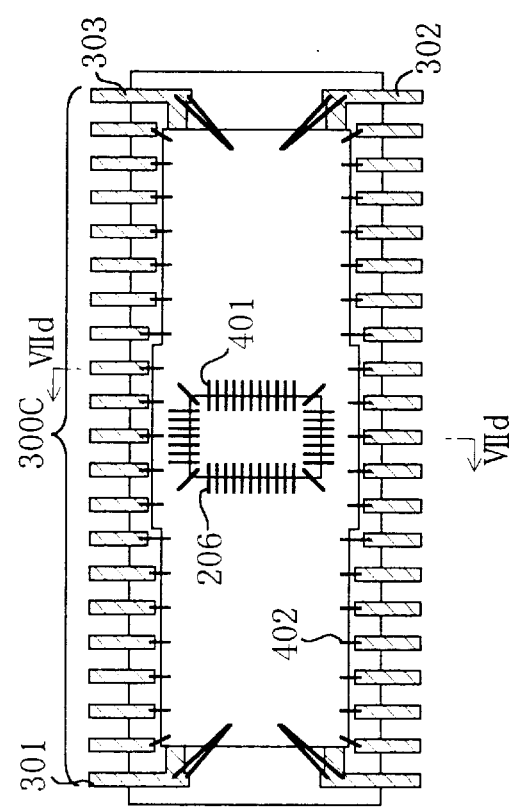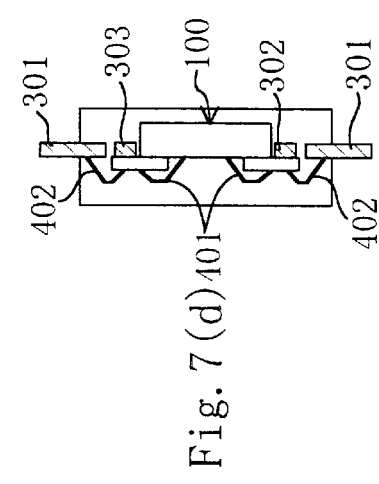

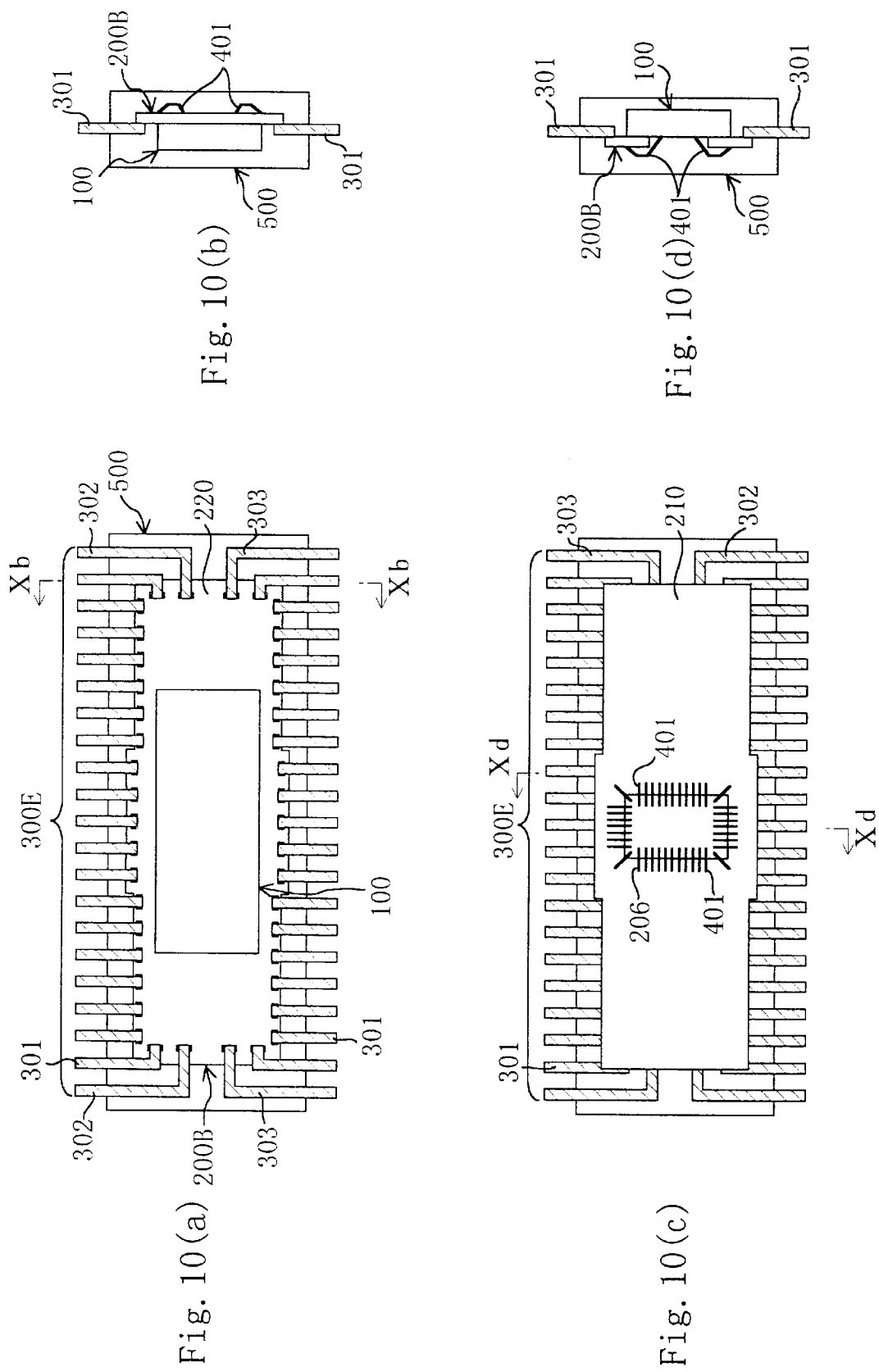

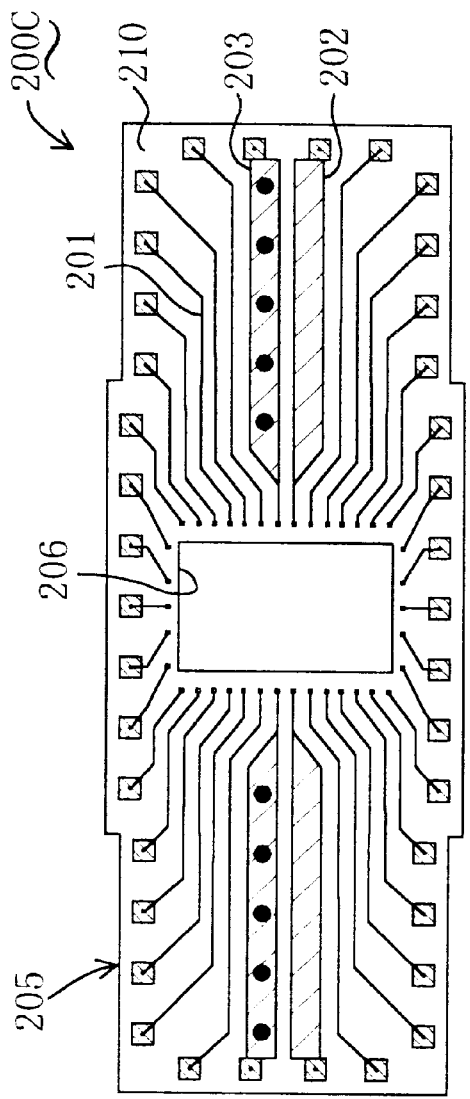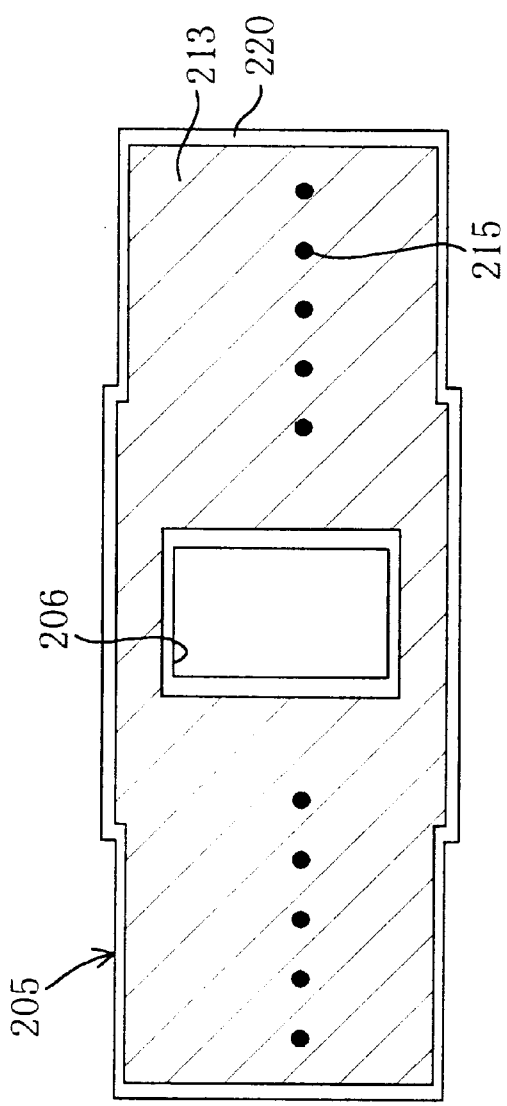
Fig. 13(a)
Fig. 13(b)

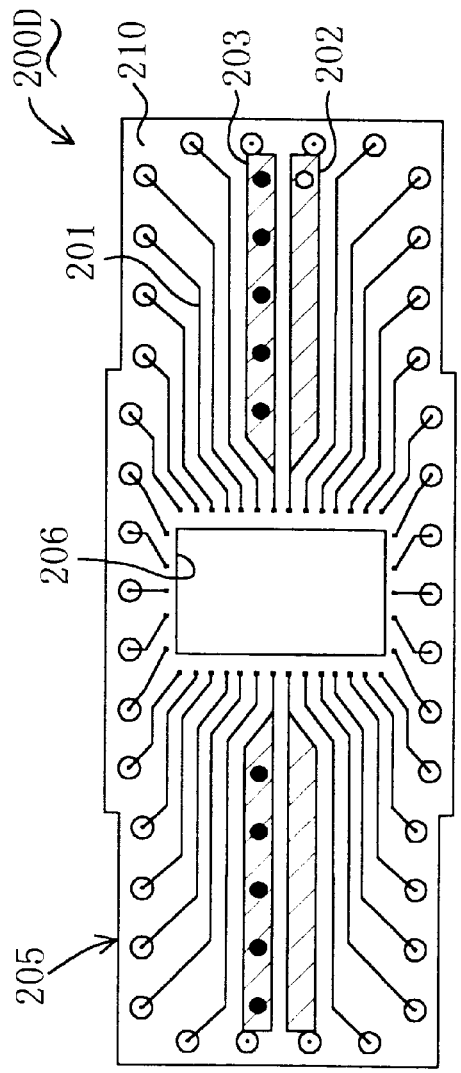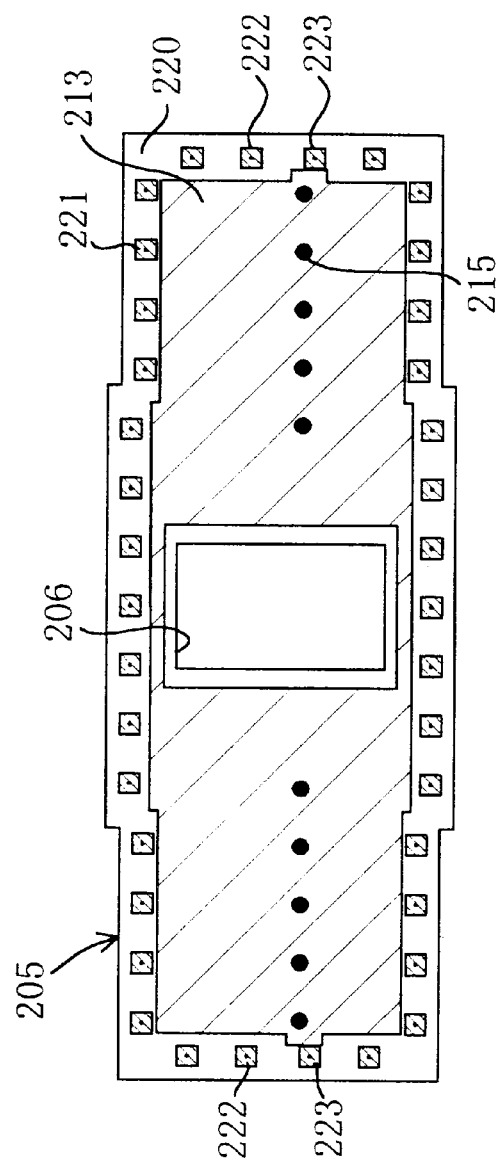
Fig. 14(a)
Fig. 14(b)

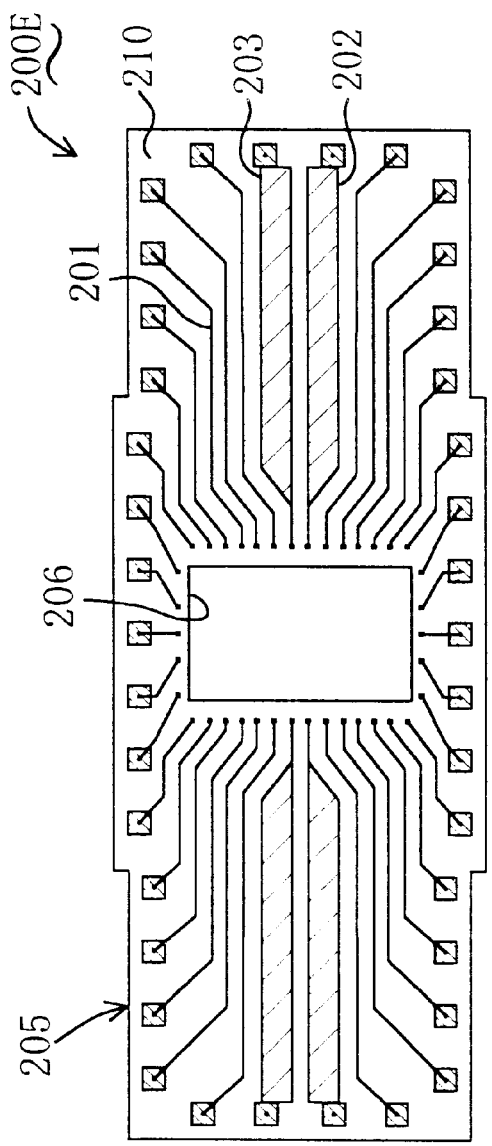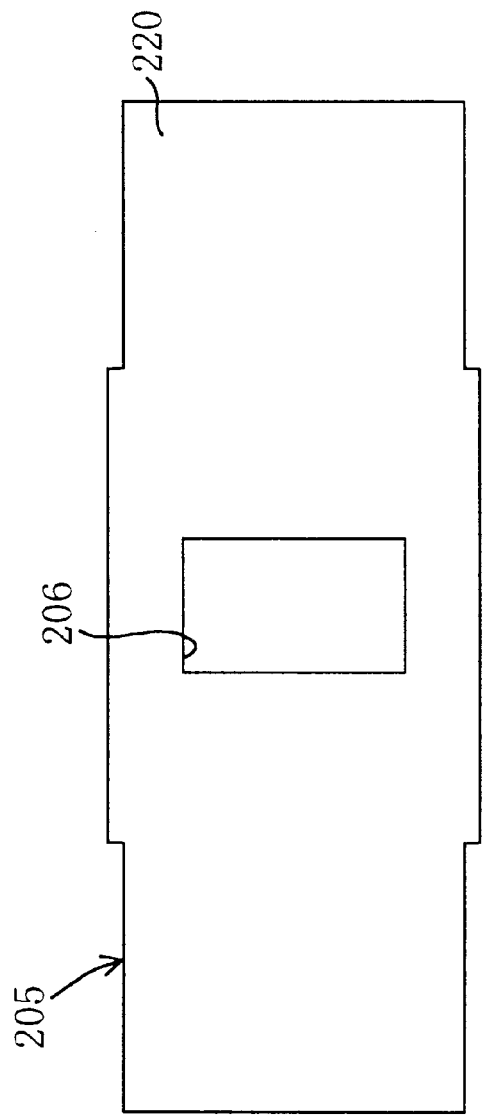
Fig. 15(a)
Fig. 15(b)

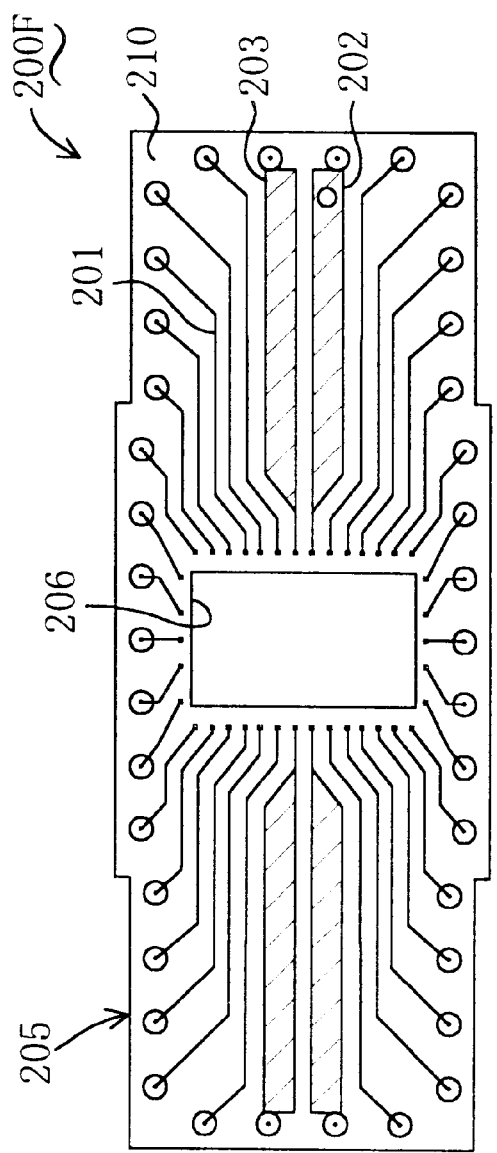
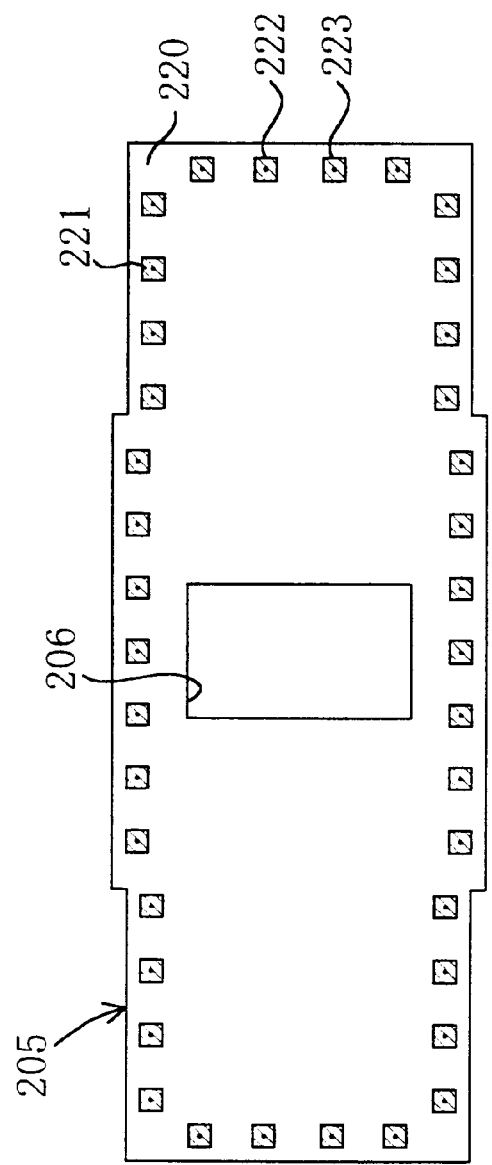
Fig. 16(a)
Fig. 16(b)

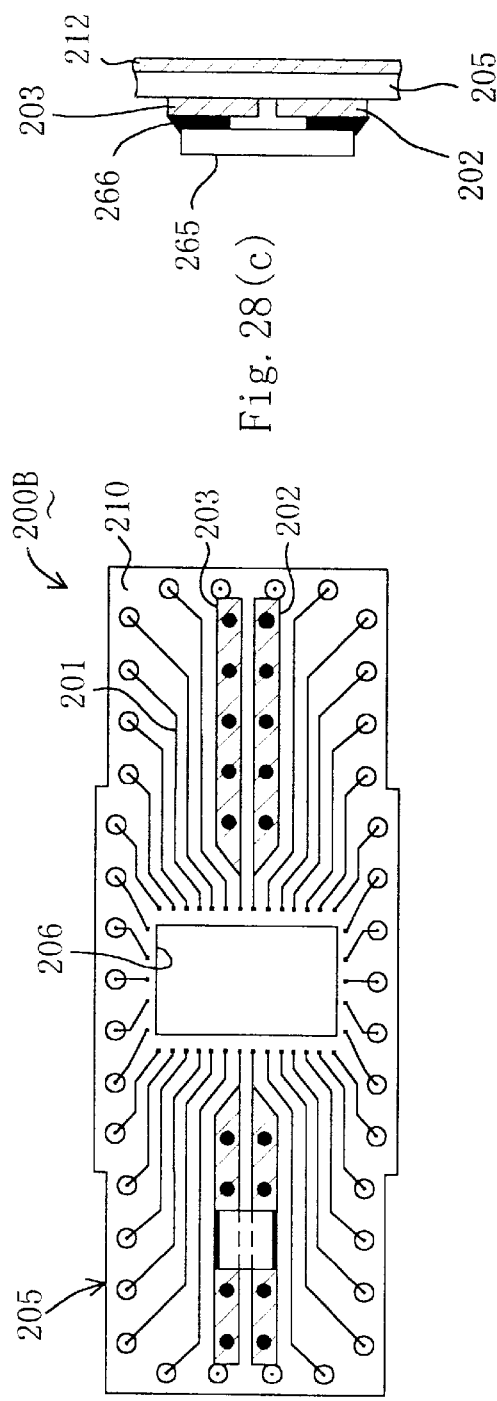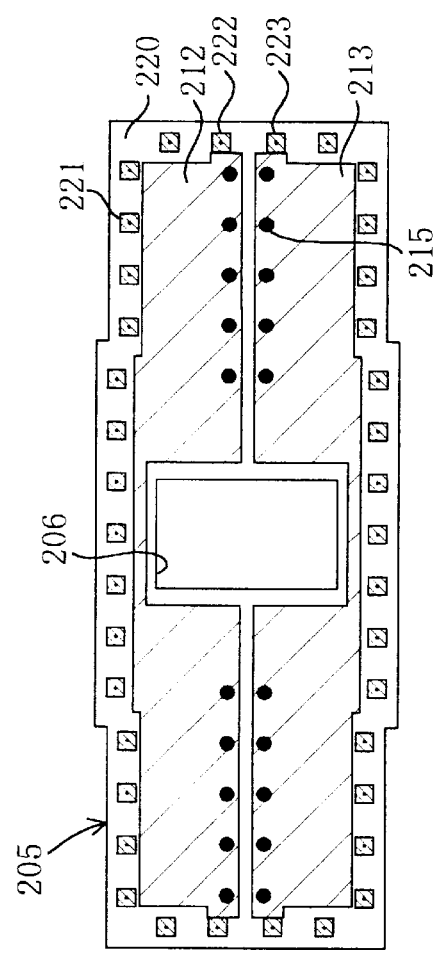

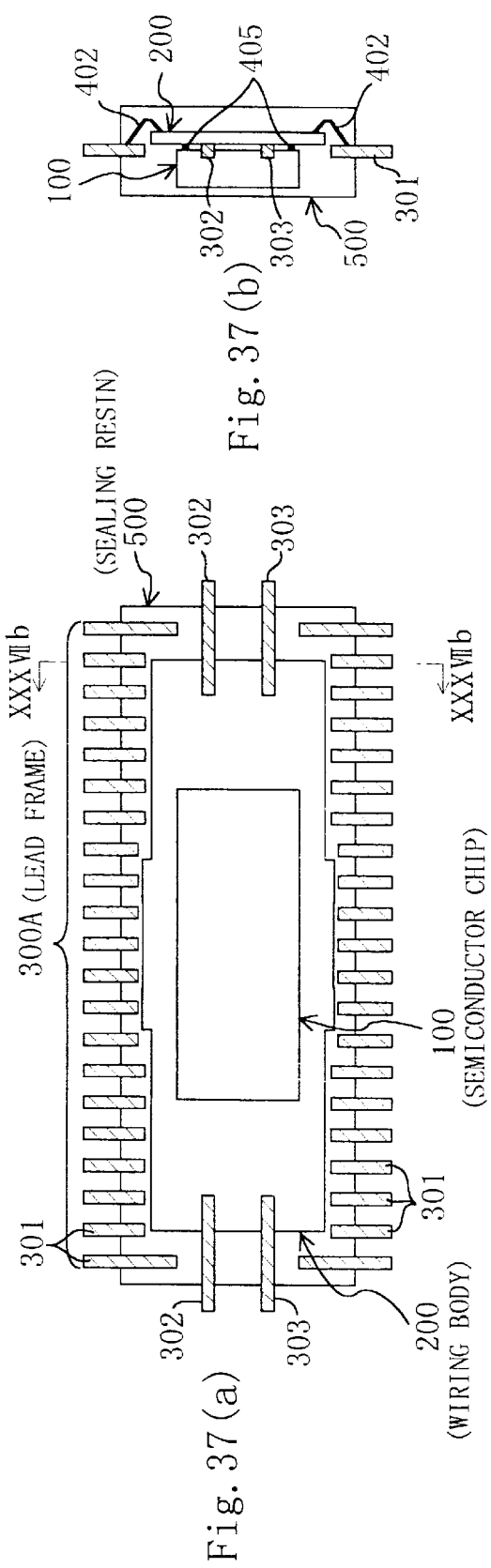
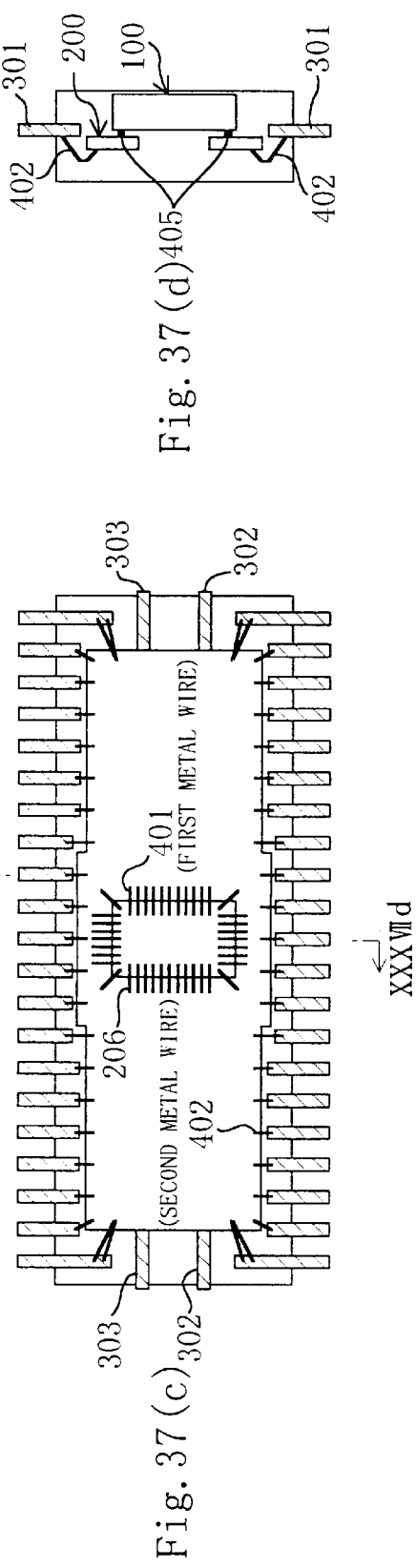

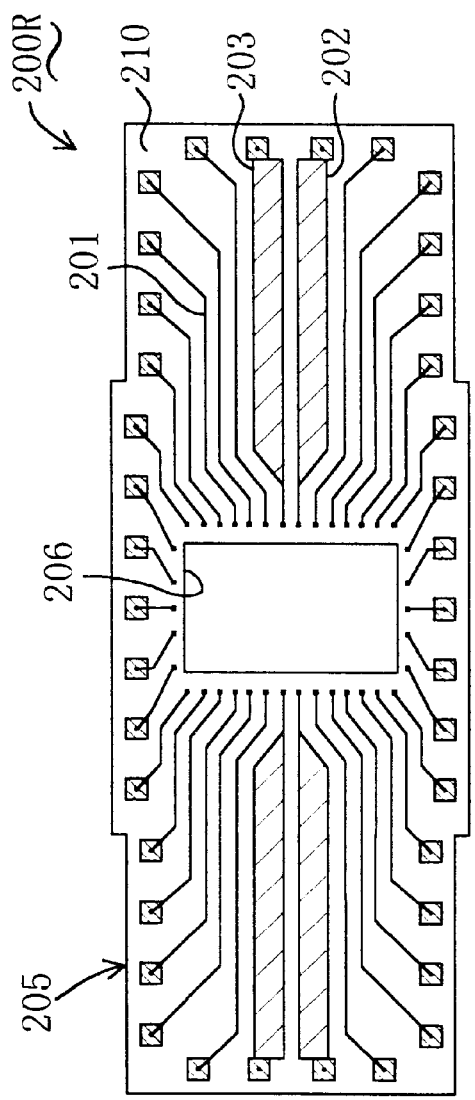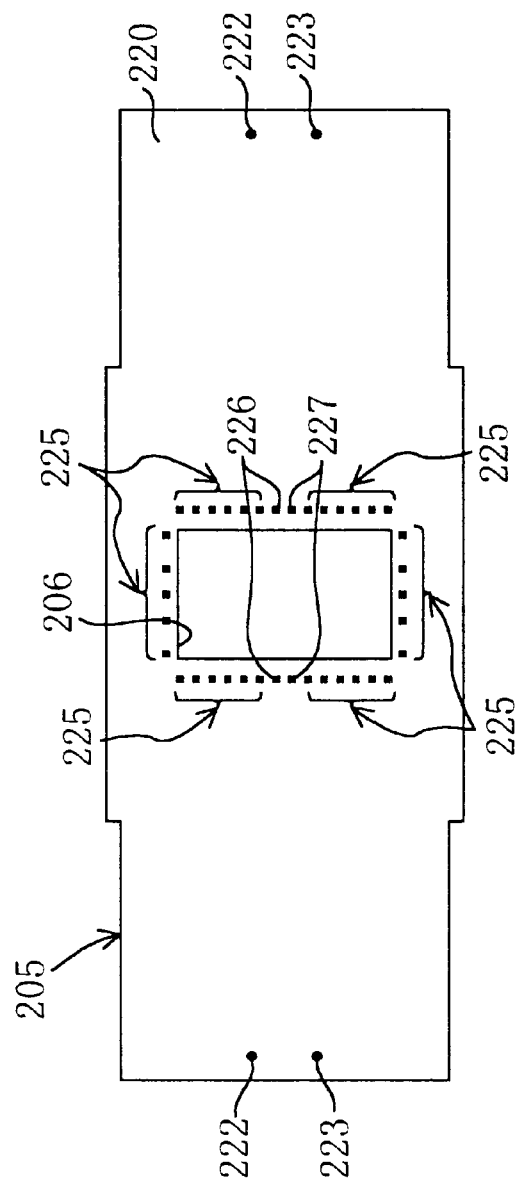
Fig. 38(a)
Fig. 38(b)

SEMICONDUCTOR DEVICE AND WIRING BODY

BACKGROUND OF THE INVENTION

The present invention relates to a semiconductor device including a semiconductor chip and leads connected with the semiconductor chip. In particular, it relates to a semiconductor device mounting a transistor dealing with a high frequency signal having an improved high frequency signal characteristic.

As a known structure of a general semiconductor device, a semiconductor chip is connected with a lead frame through bonding wires, the resultant is encapsulated with a resin, and a portion of the lead frame at the outside of the encapsulating resin is cut off.

FIG. 35 is a perspective view for showing the structure of a semiconductor device disclosed in Japanese Laid-Open Patent Publication No. 7-202111. As is shown in FIG. 35, a semiconductor chip 1002 is mounted on a die pad 1001 of a lead frame. A large number of outer leads 1003 extend from an outer frame (not shown) of the lead frame, and inner leads 1004 continuous with the outer leads 1003 extend toward the semiconductor chip 1002. Each of the tips of the inner leads 1004 is connected with each electrode pad 1005 on the semiconductor chip 1002 through a bonding wire 1006. The semiconductor chip 1002, the die pad 1001 and the inner leads 1004 placed in this state are encapsulated with an encapsulating resin 1010. However, the outer leads 1003 protrude beyond the encapsulating resin 1010 because the flow of the encapsulating resin 1010 is held back by dam bars 1007 connecting the outer leads 1003. Then, a part of the outer leads 1003 including the dam bars 1007 is cut off, so that the outer leads 1003 protruding beyond the encapsulating resin 1010 can be separated from one another. By using such a structure of the semiconductor device, signals can be sent and received between external equipment and elements such as a transistor included in the semiconductor chip 1002 through the outer leads 1003.

FIG. 36 is a plan view for showing the structure of a general lead frame disclosed in Japanese Laid-Open Patent Publication No. 6-151681. As is shown in FIG. 36, a die pad 1002 is supported by tie-bars 1008 at four corners thereof, and outer leads 1004 are respectively connected with an outer frame 1009.

As a result of improved integration of a semiconductor device, the dimension of a semiconductor chip is recently decreased, whereas the number of elements disposed in the semiconductor chip is increased. Also, a semiconductor device dealing with a high frequency signal is more frequently used.

Therefore, the aforementioned conventional semiconductor device have the following problems:

As the number of elements is increased in accordance with the improved integration, the number of electrode pads on a semiconductor chip is increased. Therefore, the number of inner leads and outer leads is naturally increased, and hence, the pitch between adjacent inner leads 1004 is unavoidably decreased. As a result, the inner leads 1004 can be made to come in contact with one another due to the flow of the encapsulating resin. In particular, a semiconductor device dealing with a high frequency signal has the following problems:

In general, voltage decrease e caused by a current i in an R-L-C serial circuit is represented by the following formula (1):

$$e = R \cdot i + L \cdot di/dt + (1/C) \int i \, dt \quad (1)$$

wherein R indicates a resistance, L indicates an inductance, and C indicates a capacitance. Generally, a system in a package is a distributed constant circuit. Also, the inductance L includes self-inductance and mutual inductance.

As is understood from the formula (1), when the current i vigorously varies with time, a value of L·di/dt is increased, and a voltage corresponding to the value of L·di/dt is generated. Accordingly, when two inner leads come close to each other, a voltage is decreased in one inner lead by mutual inductance in proportion to the variation with time of a current flowing through the other inner lead. In other words, a noise due to crosstalk and switching can become serious. In particular, in a semiconductor device, such as a multi-bit DRAM having a large capacity, where a large number of transistors therein are simultaneously and rapidly operated and a large number of signal terminals therein are simultaneously turned on/off, it is very difficult to decrease such noise due to crosstalk and switching by using the conventional lead frame.

Furthermore, in a semiconductor device dealing with a high frequency signal, a voltage of a lead connected with a power supply or ground is varied owing to a self-inductance of another lead connected with another signal as well as a mutual inductance with the power supply or the ground lead. As a result, a potential difference can be caused between the ground in the semiconductor chip and the ground of external equipment or between a supply voltage in the semiconductor chip and a supply voltage of external equipment. Accordingly, in a semiconductor device such as a multi-bit DRAM having a large capacity where a large number of transistors therein are simultaneously and rapidly operated and a large number of signals are simultaneously transferred through respective lines therein, the supply potential and the ground potential can be varied with time. Thus, a signal waveform can be degraded and malfunction of the elements can be caused.

Moreover, in a semiconductor device dealing with a high frequency signal, it is actually impossible to match impedance with a lead frame used.

Additionally, as another problem, the conventional semiconductor device is required to mount a path capacitor having a large capacitance between a power line and a ground line in order to remove power noise. This has obstructed realization of compactness of the semiconductor device.

SUMMARY OF THE INVENTION

A first object of the invention is providing a semiconductor device capable of a high speed operation and free from noise in a high frequency signal and variation in a ground or power potential, by interposing a wiring body including lines and an insulating supporting substrate for supporting the lines between leads and a semiconductor chip.

A second object of the invention is providing a high frequency semiconductor device with a general lead frame structure which can exhibit a stable performance free from variation in a ground or power potential by utilizing the wiring body.

A third object of the invention is providing a wiring body having a remarkable function to remove power noise to be disposed in a circuit including a high frequency semiconductor device.

A fourth object of the invention is providing a wiring body having a remarkable function to suppress variation in a ground or power potential to be disposed in a circuit including a high frequency semiconductor device.

In order to achieve the first object, the invention provides a first semiconductor device.

The first semiconductor device of this invention comprises a semiconductor chip having a first surface, a second surface and plural bonding pads on the first surface; a wiring body including a plate-shaped insulating supporting substrate and plural lines supported by the insulating supporting substrate, the wiring body being mounted on the first surface of the semiconductor chip; a bonding member for electrically connecting the bonding pads of the semiconductor chip with a part of each of the plural lines of the wiring body; and plural leads connected with another part of each of the plural lines of the wiring body.

By adopting this structure, a semiconductor device can be obtained on the basis of novel concept of board-on-chip different from the conventional concept of chip-on-board. For example, in a conventional resin encapsulated semiconductor device, there is a possibility of short-circuit of an electric signal and crosstalk because inner leads can be brought to be too close to each other or to be in contact with each other by a flow of a resin during resin encapsulation. In contrast, according to the structure of this invention, the wiring body is present in stead of the inner leads, and hence, a distance between the lines can retained constant, even though the wiring body can be slightly moved by a flow of an encapsulating resin in the resin encapsulation for manufacturing a resin encapsulated semiconductor device. In addition, even when the lines of the wiring body are refined, there arises no problem in the strength, and hence, a necessary distance can be always retained between the lines. Furthermore, in any type of semiconductor device other than the resin encapsulated semiconductor device, the lines of the wiring body never come too close to each other in usage. Moreover, since the wiring body is disposed between the semiconductor chip and the leads, the length of the leads can be largely decreased as compared with that in a conventional semiconductor device. Accordingly, the structure of this invention can easily realize decrease of inductance and prevention of the crosstalk also in a semiconductor device dealing with a high frequency signal.

Furthermore, in a power line or a ground line where a large current flows, the voltage decrease due to the self-inductance can be suppressed by increasing the width of the line, resulting in preventing the variation in the power or ground potential.

Moreover, since the insulating supporting substrate is thus used, the width, the pitch and the shape of the lines can be freely designed, and hence, an impedance matching function can be attained.

Preferably, the plural lines include a signal line, a power line and a ground line; the plural leads include a signal lead, a power lead and a ground lead; and the signal line is electrically connected with the signal lead, the power line is electrically connected with the power lead, and the ground line is electrically connected with the ground lead.

In this case, the aforementioned effects can be attained in various types of lines required in a semiconductor device.

The insulating supporting substrate of the wiring body can be provided with a first surface and a second surface, with the second surface of the insulating supporting substrate in contact with the first surface of the semiconductor chip, and the part of the signal line, power line and ground line connected with the bonding pads can be formed on the first surface of the insulating supporting substrate so as to be disposed in the vicinity of the bonding pads of the semiconductor chip.

Thus, since a part of lines can be disposed in the vicinity of the bonding pads of the semiconductor chip, electric bonding by using the bonding member can be eased, and inductance of the bonding member can be made as small as possible.

In one aspect, a narrow signal line including the part of the signal line can be formed on the first surface of the insulating supporting substrate, and a power line and a ground line, which are electrically connected with the part of the power line and ground line formed on the first surface, can be formed on the second surface of the insulating supporting substrate so as to be separated from each other and together occupy substantially an entire area of the second surface.

Thus, the power line and the ground line formed on the second surface of the insulating supporting substrate can function as a virtual ground, and hence, the resultant semiconductor device can attain high resistance against external noise. Also, the width of the power line and the ground line can be increased, resulting in decreasing the inductance. Furthermore, even when the power line and the ground line are connected with terminals from plural paths respectively having different resistance values, the power line and the ground line having a large width can level the variation in potential caused by a difference of the resistance values between the paths.

In another aspect, a narrow signal line, a wide power line and a wide ground line respectively including the part of the signal line, power line and ground line can be formed on the first surface of the insulating supporting substrate, and a power line and a ground line, which are electrically connected with the part of the power line and ground line formed on the first surface, can be formed on the second surface of the insulating supporting substrate so as to be separated from each other and together occupy substantially an entire area of the second surface.

Thus, not only the aforementioned effects can be attained but also the inductance of a power line and a ground line can be further decreased owing to the wide power lines and ground lines formed on the first surface. As a result, the variation in the power or ground potential can be more definitely prevented.

In still another aspect, a narrow signal line and a wide power line respectively including the part of the signal line and power line can be formed on the first surface of the insulating supporting substrate, and a ground line, which is electrically connected with the part of the ground line formed on the first surface of the insulating supporting substrate, can be formed substantially entirely on the second surface of the insulating supporting substrate.

Alternatively, a narrow signal line and a wide ground line respectively including the part of the signal line and ground line can be formed on the first surface of the insulating supporting substrate, and a power line, which is electrically connected with the part of the power line formed on the first surface of the insulating supporting substrate, can be formed substantially entirely on the second surface of the insulating supporting substrate.

Thus, not only the aforementioned effects can be attained but also terminals to be connected with a power supply and a ground can be formed in arbitrary positions on the first surface of the wiring body by, for example, forming a conductive material in through holes. As a result, the design flexibility for the line pattern can be remarkably improved.

In one aspect, a narrow signal line, a wide power line and a wide ground line respectively including the part of the signal line, lower line and ground line can be formed on the first surface of the insulating supporting substrate, and no line can be formed on the second surface of the insulating supporting substrate.

Thus, thermal deformation caused at a high temperature when a conductive film is formed on the second surface can be suppressed. Therefore, when the wiring body is to be rigidly fixed on the semiconductor chip, any problem caused by the thermal deformation can be suppressed.

The power line and the ground line can be formed to oppose each other with a narrow opposing area sandwiched therebetween on at least one of the first surface and the second surface of the insulating supporting substrate.

When this structure is adopted, there is a large capacitance component between the power line and the ground line. Therefore, power noise can be removed without providing the semiconductor device with a path capacitor or the like occupying a large area.

In this aspect, at least a part of the opposing area can be formed in a zigzag manner.

Thus, the function to remove power noise can be further improved.

The insulating supporting substrate can include a first substrate and a second substrate stacked on the first substrate; when an upper face of the second substrate, a lower face of the first substrate, and a lower face of the second substrate or an upper face of the first substrate are respectively designated as a first surface, a second surface and a third surface of the insulating supporting substrate, a narrow signal line including the part of the signal line, at least the part of the power line and at least the part of the ground line can be formed on the first surface of the insulating supporting substrate; a ground line, which is electrically connected with the ground line formed on the first surface, can be formed substantially entirely on one of the second surface and the third surface of the insulating supporting substrate, and a power line, which is electrically connected with the power line formed on the first surface, can be formed substantially entirely on the other of the second surface and the third surface of the insulating supporting substrate.

Thus, the wiring body can attain a structure in which two substrates of an insulating material and two conductive films working as the power line and the ground line are alternately stacked. Therefore, the thermal deformation caused at a high temperature can be suppressed. In addition, the ground line and the power line having a large area can also improve the resistance against noise.

The signal line can be plural in number, and between at least two of the plural signal lines, a noise preventing line electrically connected with at least either the power line or the ground line formed on the second surface can be formed.

Thus, in arbitrary two signal lines disposed on the sides of the noise removing line, one of the signal lines can be prevented from being electrically affected by variation with time of a current flowing through the other signal line. As a result, the voltage decrease and the like owing to the mutual inductance can be definitely avoided. Accordingly, the crosstalk between the signal lines and switching noise can be definitely prevented.

The insulating supporting substrate of the wiring body can be provided with at least either an opening or a notch, and the bonding pads of the semiconductor chip can be formed so as to be disposed on inside of the opening or notch.

Thus, the bonding pads can be freely disposed on the semiconductor chip, and the line pattern can be freely designed on the wiring body. As a result, variety of structures are applicable in accordance with a type of semiconductor device.

Preferably, the bonding member is one of a metal line, a bump and a metal thin plate.

Preferably, the signal lead, the power lead and the ground lead respectively stretch over the other part of the signal line, power line and ground line of the insulating supporting substrate, and the leads are connected with the other part of the lines by soldering, brazing, welding or using a conductive adhesive.

Thus, the inductance of the bonding between the lines of the wiring body and the leads can be decreased, resulting in stabilizing the potential.

The signal lead can be connected with the other part of the signal line of the insulating supporting substrate through one of a metal line, a bump and a metal thin plate.

Preferably, the other part of the signal line, power line and ground line are formed on the second surface of the insulating supporting substrate, the signal lead, the power lead and the ground lead respectively stretch over the other part of the signal line, power line and ground line formed on the second surface of the insulating supporting substrate, and the leads are connected with the other part of the lines by soldering, brazing, welding or using a conductive adhesive.

Thus, the leads and the lines can be directly connected without using bonding wires, and hence, the self-inductance at the bonding can be decreased. Therefore, this structure can ease the manufacture of a semiconductor device having a stable potential.

The insulating supporting substrate can be in the shape of a rectangular plate having a pair of longer sides and a pair of shorter sides in a plan view, the signal line and the signal lead are plural in number, the signal leads can be aligned to be perpendicular to the longer sides of the insulating supporting substrate and parallel to one another with tips thereof disposed in the vicinity of the longer sides, and the power lead and the ground lead can extend from the shorter sides of the insulating supporting substrate over the second surface of the insulating supporting substrate, so as to be respectively connected with the power line and the ground line formed on the second surface by soldering, brazing, welding or using a conductive adhesive.

Thus, the inductance and the resistance of the power line and the ground line can be decreased. Therefore, the voltage decrease represented by the formula (1) can be decreased, resulting in suppressing the variation in the power potential and the ground potential.

Preferably, at least either the power lead or the ground lead is formed in a belt shape crossing over the second surface of the wiring body.

Thus, the lines on the two surfaces and the leads are aligned in parallel in either the power line or the ground line. Therefore, a resistance component of the impedance can be particularly decreased. Also, the inductance can be decreased, and hence, the variation in the ground potential and the power potential can be more definitely prevented.

In one aspect, bottom portions of the power lead and the ground lead can be aligned in parallel to the signal leads.

In this aspect, the resultant semiconductor device has the so-called DIP structure in which all the leads are aligned at the sides of the semiconductor chip. Therefore, the semiconductor device can be conveniently mounted on a print substrate and the like.

In another aspect, each of the power lead and the ground lead can be provided with a cut portion formed by cutting off a dummy lead connecting between the power or ground lead and a part of an outer frame of a lead frame parallel to the shorter sides of the insulating supporting substrate.

Thus, the leads can be stably supported when they are bonded with the power line and the ground line through metal lines or metal thin plates.

The insulating supporting substrate can be made from an organic material including at least one of glass epoxy, polyimide, polyester, a benzocyclobutene resin, a BT resin and polyimide amide ether.

In this case, the wiring body can be supported by the flexible insulating supporting substrate, and hence, the wiring body can be easily dealt with during the assembly and manufacture.

Alternatively, the insulating supporting substrate can be made from an inorganic material including at least one of alumina, silicon nitride, aluminum nitride, silicon carbide, beryllium oxide, silicon, an insulating film-coated metal and high purity glass.

In this case, since the insulating supporting substrate is made from a material having a high melting point, the leads and the lines can be connected by using a process, such as brazing, conducted at a high temperature, resulting in improving the reliability of the bonding.

Preferably, the lines are formed by printing a conductive film on the insulating supporting substrate.

Thus, the lines of the wiring body can be refined and the pattern of the lines can be variously designed, and in addition, the manufacturing cost can be decreased.

The first semiconductor device can further comprises a second wiring body including a substrate disposed on the first surface of the insulating supporting substrate and lines formed on an upper face of the substrate.

Thus, the number of terminals to be connected with external signals, power and ground can be increased by utilizing the lines of the second wiring body.

In this aspect, a part of each of the lines of the second wiring body can be connected with either the bonding pads of the semiconductor chip or the part of the lines of the wiring body.

The first semiconductor device can further comprise a fixing lead for supporting the wiring body at either the first surface or the second surface of the insulating supporting substrate.

In this aspect, the fixing lead can function as at least one of a power lead and a ground lead.

Thus, the wiring body can be easily fixed during the manufacture of the semiconductor device by assembling the wiring body and a lead frame. Therefore, the bonding between the wiring body and the leads can become more reliable.

The first semiconductor device can further comprise an encapsulating resin for encapsulating the semiconductor chip, the wiring body, the bonding member and a part of the leads close to the wiring body.

Thus, even in an inexpensive resin encapsulated semiconductor device, the lines can be prevented from being too close to each other or coming in contact with each other during the resin encapsulation. As a result, the crosstalk can be prevented and the inductance can be decreased.

The first semiconductor device can further comprise a ferroelectric chip disposed over the ground line and the power line.

Also, the first semiconductor device can further comprise a chip capacitor disposed over the ground line and the power line.

In this manner, the resultant semiconductor device can attain a remarkable function to remove power noise.

In one aspect, a part of the wiring body can be provided with a microstrip line consisting of the signal line, the insulating supporting substrate functioning as a dielectric film and the ground line.

In another aspect, a part of the wiring body is provided with a coplanar line consisting of the signal line, the insulating supporting substrate functioning as a dielectric film and the ground line.

In this manner, the transmitting characteristic of a high frequency signal flowing through the lines can be improved, and a good impedance matching performance can be attained.

In one aspect, a second wiring body can be disposed on the second surface of the semiconductor chip, and the second wiring body can include a plate-shaped insulating supporting substrate having a first surface and a second surface opposing the first surface; and first and second conductive films respectively formed on the first and second surfaces of the insulating supporting substrate and functioning as at least one of a ground line and a power line.

In this aspect, one of the first and second conductive films of the second wiring body can function as a ground line with the other functioning as a power line, both of the first and second conductive films of the second wiring body can function as a ground line, or both of the first and second conductive films of the second wiring body can function as a power line.

Thus, the resultant semiconductor device can be free from the variation in the power potential and the ground potential and can deal with a high frequency signal.

In order to achieve the second object, the invention provides a second semiconductor device.

A second semiconductor device of this invention comprises a semiconductor chip including a high frequency semiconductor element and plural bonding pads connected with the semiconductor element; leads connected with the bonding pads through bonding wires; and a wiring body for supporting the semiconductor chip, wherein the wiring body includes a plate-shaped insulating supporting substrate having a first surface and a second surface opposing the first surface; and first and second conductive films respectively formed on the first and second surfaces of the insulating supporting substrate and functioning as at least one of a ground line and a power line.

In the second semiconductor device, one of the first and second conductive films of the wiring body can function as a ground line with the other functioning as a power line, both of the first and second conductive films of the wiring body can function as a ground line, or both of the first and second conductive films of the wiring body can function as a power line.

In this manner, also in a semiconductor device having a conventional general lead frame structure, the variation in the power potential and the ground potential can be prevented and a high frequency signal can be stably processed by utilizing the wiring body including the power line or the ground line formed substantially entirely on the surfaces thereof.

In order to achieve the third object, the present invention provides a first wiring body.

A first wiring body of this invention disposed in a circuit where a high frequency signal flows, comprises a plate-shaped insulating supporting substrate having a first surface and a second surface opposing the first surface; a signal line formed on at least one of the first surface and the second surface of the(insulating supporting substrate; and a power line and a ground line formed on at least one of the first surface and the second surface of the insulating supporting substrate with a substantially constant narrow opposing area sandwiched therebetween on the same surface.

When this structure is adopted, there is a large capacitance component between the power line and the ground line. Therefore, power noise can be removed without providing the circuit with a path capacitor or the like occupying a large area. Accordingly, the resultant wiring body is applicable to various types of semiconductor devices including a circuit where a high frequency signal flows.

In this wiring body, at least a part of the opposing area can be formed in a zigzag manner.

Thus, the function to remove power noise can be further improved.

On both of the first surface and the second surface, the power line and the ground line can have a substantially constant narrow opposing area therebetween.

Thus, the both surfaces of the insulating supporting substrate can be provided with a capacitance, and hence, the function to remove power noise can be further improved.

The signal line, the power line and the ground line can be formed on the first surface of the insulating supporting substrate, and a ground line, which is electrically connected with the ground line formed on the first surface, can be formed substantially entirely on the second surface of the insulating supporting substrate.

Alternatively, the signal line, the power line and the ground line can be formed on the first surface of the insulating supporting substrate, and a power line, which is electrically connected with the power line formed on the first surface, can be formed substantially entirely on the second surface of the insulating supporting substrate.

Thus, the resultant wiring body can include a signal line having high noise resistance. Furthermore, since terminals to be connected with power and ground can be formed at arbitrary positions on the first surface of the wiring body by, for example, forming a conductive material in through holes, the design flexibility for the line pattern can be remarkably improved.

In order to achieve the fourth object, the present invention provides a second wiring body.

The second wiring body of this invention disposed in a circuit where a high frequency signal flows, comprises a plate-shaped insulating supporting substrate having a first surface and a second surface opposing the first surface; and first and second conductive films respectively formed on the first and second surfaces of the insulating supporting substrate and functioning as at least one of a ground line and a power line.

Thus, the resultant wiring body can stably process a high frequency signal without the variation in the power potential or the ground potential in the circuit including a semiconductor device and the wiring body.

BRIEF DESCRIPTION OF THE DRAWINGS

FIGS. 1(a) through 1(d) are a plan view of a semiconductor device according to a first embodiment taken on the side of a second surface, a cross sectional view thereof taken on line Ib—Ib, a plan view thereof taken on the side of a second surface, a cross sectional view thereof taken on line Id—Id, respectively;

FIGS. 7(a) through 7(d) are a plan view of a semiconductor device according to a third embodiment taken on the side of a second surface, a cross sectional view thereof taken on line VIIb—VIIb, a plan view thereof taken on the side of a first surface, and a cross sectional view thereof taken on line VIId—VIId, respectively;

FIGS. 10(a) through 10(d) are a plan view of a semiconductor device according to a fourth embodiment taken on the side of a second surface, a cross sectional view thereof taken on line Xb—Xb, a plan view thereof taken on the side of a first surface, and a cross sectional view thereof taken on line Xd—Xd, respectively;

FIGS. 13(a) and 13(b) are plan views of a wiring body according to a first modification taken on the side of a first surface and on the side of a second surface, respectively;

FIGS. 14(a) and 14(b) are plan views of a wiring body according to a second modification taken on the side of a first surface and on the side of a second surface, respectively;

FIGS. 15(a) and 15(b) are plan views of a wiring body according to a third modification taken on the side of a first surface and on the side of a second surface, respectively;

FIGS. 16(a) and 16(b) are plan views of a wiring body according to a fourth modification taken on the side of a first surface and on the side of a second surface, respectively;

FIGS. 28(a) through 28(c) are a plan view of a wiring body according to an eighth embodiment taken on the side of a first surface, a plan view thereof taken on the side of a second surface, and a partially enlarged cross sectional view of an area for a chip capacitor therein, respectively;

FIGS. 37(a) through 37(d) are a plan view of a semiconductor device according to a thirteenth embodiment taken on the side of a second surface, a cross sectional view thereof taken on line XXXVIIb—XXXVIIb, a plan view thereof taken on the side of a first surface, and a cross sectional view thereof taken on line XXXVIId—XXXVIId, respectively; and FIGS. 38(a) and 38(b) are plan views of an insulating supporting substrate of a wiring body of the thirteenth embodiment taken on the side of a first surface and on the side of a second surface, respectively.

DETAILED DESCRIPTION OF THE INVENTION

Figure 33:
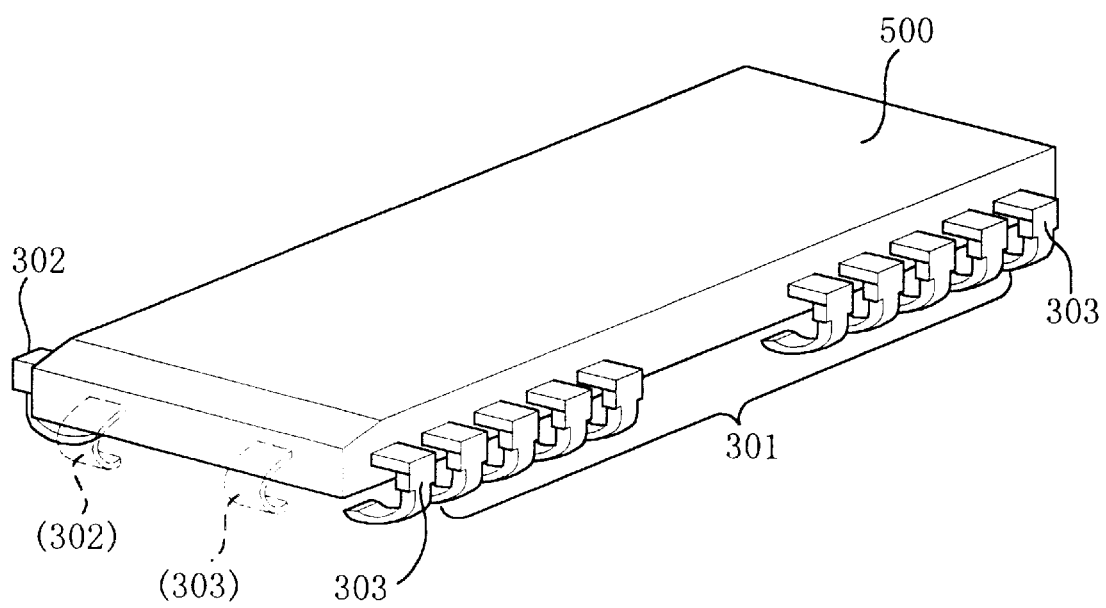
FIG. 33 is a perspective view for showing the entire structure commonly adopted by the semiconductor devices of the respective embodiments.

A semiconductor device described in each of the following embodiments basically has a three-dimensional structure as is shown in FIG. 33. Specifically, the semiconductor device includes a semiconductor chip (not shown) in a package encapsulated with an encapsulating resin 500, and a large number of signal leads 301, power leads 302 and ground leads 303 protrude from the side faces of the encapsulating resin 500. However, depending upon the type of the semiconductor device, the power leads 302 and the ground leads 303 protrude from the end faces of the encapsulating resin 500 as is shown with broken lines in FIG. 33. Although members within the encapsulating resin 500 are not shown in FIG. 33, the encapsulating resin 500 is transparentized in drawings referred to in the following embodiments and modifications, so as to show the members disposed therein.

Embodiment 1

A first embodiment of the invention will now be described with reference to FIGS. 1(a) through 1(d), 2(a), 2(b), 3(a) through 3(c) and 4.

FIGS. 1(a) through 1(d) show the structure of a semiconductor device of the first embodiment, wherein FIG. 1(a) is a plan view taken on the side of a second surface of a semiconductor chip and the like, FIG. 1(b) is a cross sectional view taken on line Ib—Ib of FIG. 1(a), FIG. 1(c) is a plan view taken on the side of a first surface of the semiconductor chip and the like, and FIG. 1(d) is a cross sectional view taken on line Id—Id of FIG. 1(c).

As is shown in FIGS. 1(a) through 1(d), the semiconductor device comprises a semiconductor chip 100 including elements such as a transistor, a lead frame 300A for electrically connecting the elements in the semiconductor chip 100 with external members, a wiring body 200A including lines for electrically connecting the lead frame 300A with the elements in the semiconductor chip 100, first metal lines 401 for connecting the lines in the wiring body 200A with bonding pads of the semiconductor chip 100, second metal lines 402 for connecting leads of the lead frame 300A with the lines of the wiring body 200A, and an encapsulating resin 500 for encapsulating these members.

As is shown in FIGS. 1(a) and 1(c), the tips of the leads of the lead frame 300A are aligned along the outline of the wiring body 200A, and these leads are roughly divided into signal leads 3(b)) disposed along the longer sides of the wiring body 200A and power leads 302 and ground leads 303 extending from the shorter sides of the wiring body 200A to points above the second surface 220 of the wiring body 200A.

Figure 3A:
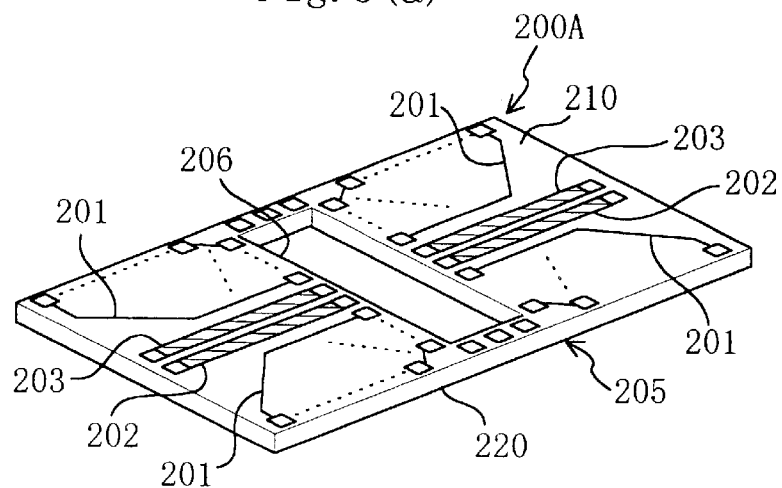
FIGS. 3(a) through 3(c) are perspective views for showing procedures for stacking the wiring body and a semiconductor chip in the first embodiment.
Figure 3B:
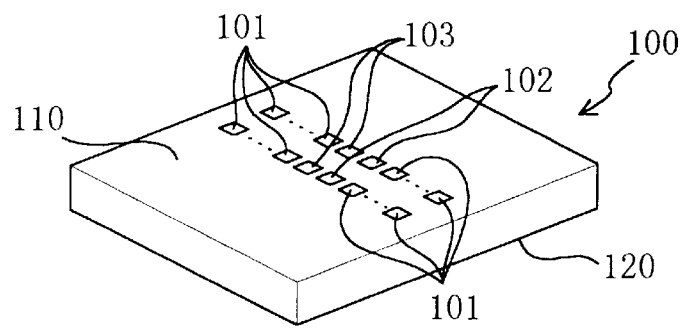

Also, as is shown in FIGS. 1(b), 1(c) and 1(d), the first metal lines 401 connect signal bonding pads (shown with a reference numeral 101 in FIG. 3(b)) of the semiconductor chip 100 with pads of signal lines 201 of the wiring body 200A, power bonding pads (shown with a reference numeral 102 in FIG. 3(b)) with pads of power lines 202 of the wiring body 200A, and ground bonding pads (shown with a reference numeral 103 in FIG. 3(b)) with pads of ground lines 203 of the wiring body 200A. Furthermore, the second metal lines 402 connect the signal leads 301 with pads formed at outer ends of the respective lines of the wiring body 200A. Also, the power leads 302 and the ground leads 303 are respectively connected by soldering with a power line 212 and a ground line 213 on the second surface 220 of the wiring body 200A, so that the power leads 302 and the ground leads 303 can also fix and support the wiring body 200A.

Now, the detailed structure of the wiring body 200A and the state obtained by stacking the wiring body 200A and the semiconductor chip 100 will be described.

Figure 2A:
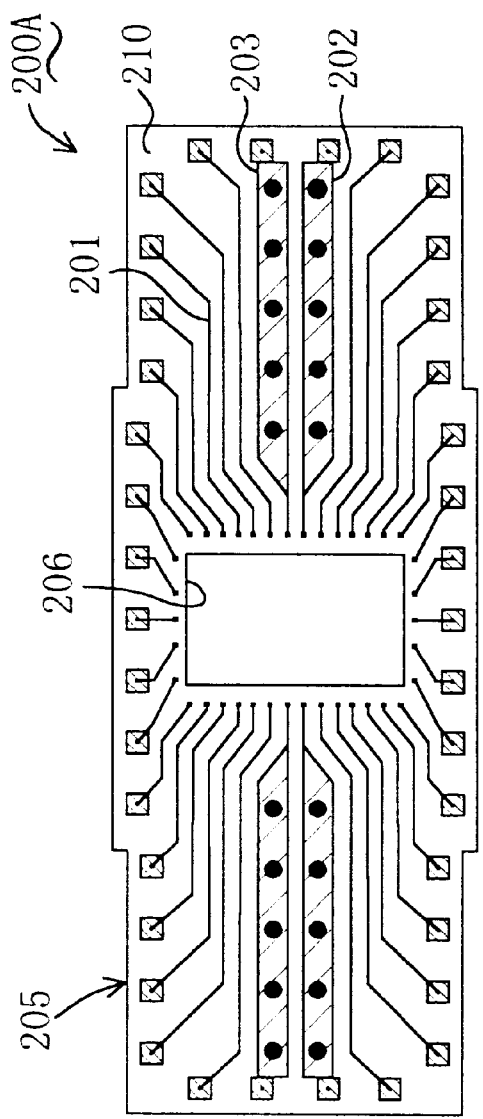
FIGS. 2(a) and 2(b) are plan views of a wiring body of the first embodiment taken on the side of a first surface and on the side of a second surface, respectively.
Figure 2B:
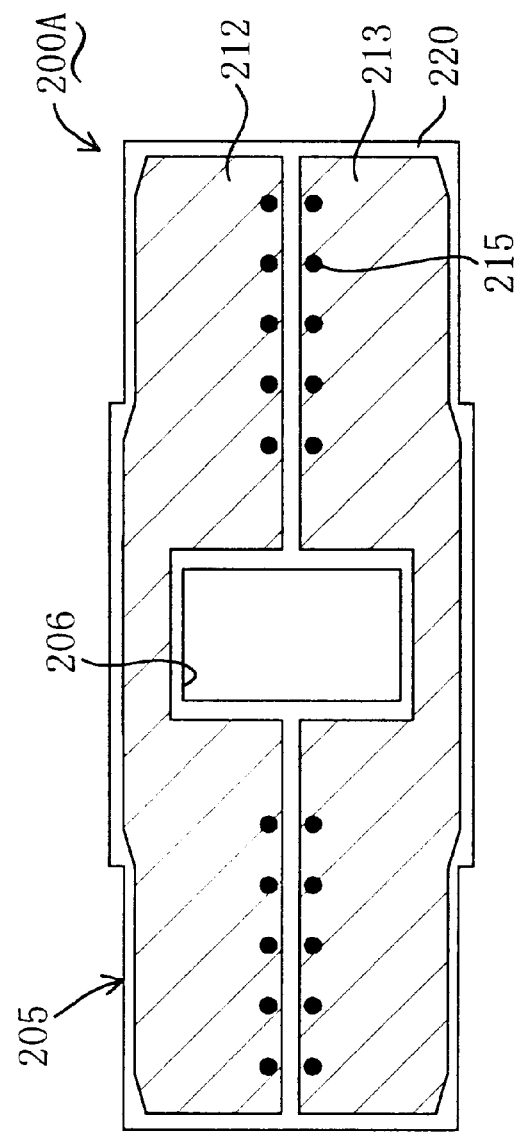

FIGS. 2(a) and 2(b) are plan views of an insulating supporting substrate 205 of the wiring body 200A taken on the side of the first surface 210 and on the side of the second surface 220, respectively. The wiring body 200A includes the lines and the insulating supporting substrate 205 for supporting the lines. The insulating supporting substrate 205 has a substantially rectangular shape including a rectangular opening 206 at the center thereof. As is shown in FIG. 2(a), on the first surface 210 of the insulating supporting substrate 205 are formed, by printing, a large number of lines extending from the vicinity of the outer sides to the vicinity of the opening 206, namely, the narrow signal lines 201, the wide power lines 202, the wide ground lines 203 and the like. The both ends of each of the lines 201, 202 and 203 are provided with the pads for wire bonding. Furthermore, on the second surface 220 are formed the power line 212 and the ground line 213 each having a large width occupying substantially a half of the area of the second surface. The power line 212 and the ground line 213 on the second surface 220 are respectively electrically connected with the power lines 202 and the ground lines 203 on the first surface 210 through a conductive material formed in through holes 215. In any of this and the following embodiments, the conductive material can be entirely filled in the through hole 215 or can merely cover the inside wall of the through hole 215.

Figure 3C:
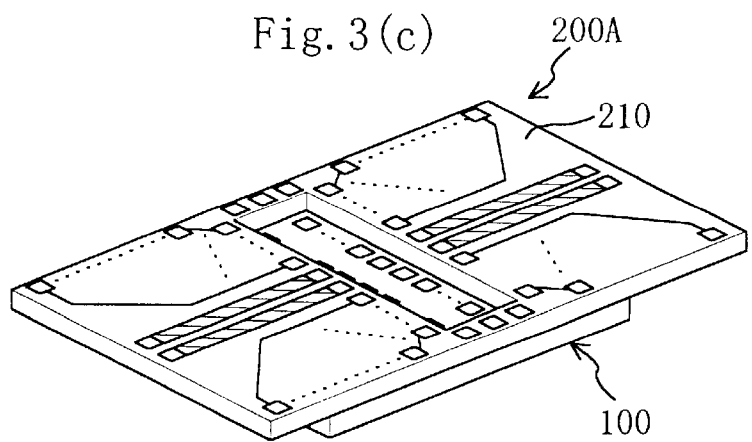

FIGS. 3(a) through 3(c) are perspective views for showing the structures of the semiconductor chip 100 and the wiring body 230A to be stacked. FIG. 3(a) is a perspective view of the aforementioned wiring body 200A, and FIG. 3(b) is a perspective view of the semiconductor chip 100. As is shown in FIG. 3(b), on a first surface 110 of the semiconductor chip 100, in an area to be surrounded with the opening 206 of the wiring body 200A, a large number of bonding pads are formed to be aligned along the edge of the opening 206. These bonding pads are roughly divided into the signal bonding pads 101 connected with transistors in the semiconductor chip, the power bonding pads 102 connected with power terminals in the semiconductor chip and the ground bonding pads 103 connected with ground terminals in the semiconductor chip. As is shown in FIG. 3(c), the first surface 110 of the semiconductor chip 100 and the second surface 220 of the wiring body 200A are adhered to each other, thereby forming a stacked body.

Figure 4:
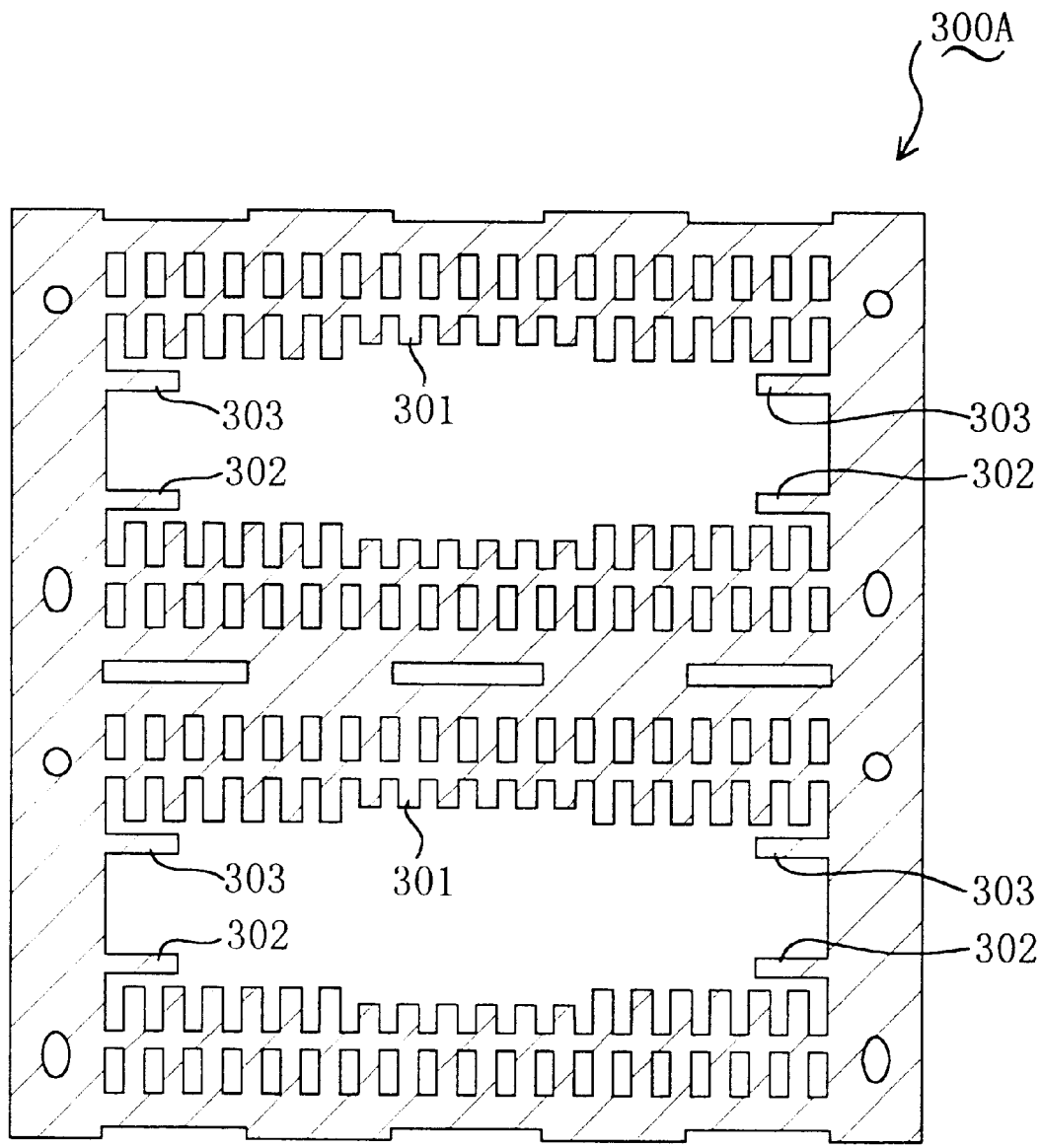
FIG. 4 is a plan view of a lead frame of the first embodiment.

FIG. 4 is a plan view of the lead frame 300A used in this embodiment. Although merely two chip areas are shown in FIG. 4, a large number of chip areas can be formed continuously in the longitudinal direction in FIG. 4.

The bonding pads 101 through 103 of the semiconductor chip 100 and the leads of the lead frame 300A of FIG. 4 are connected with the respective lines 201 through 203 of the wiring body 200A through the first and second metal lines 401 and 402, respectively. Then, the resultant stacked body and the lead frame are encapsulated with the encapsulating resin 500. Thus, the semiconductor device having the structure as is shown in FIGS. 1(a) through 1(d) can be obtained, whereas the lines of the wiring body 200A are omitted in FIGS. 1(a) and 1(c) for the sake of simplification. Furthermore, FIGS. 1(a) through 1(d), 2(a), 2(b), 3(a) through 3(c) and 4 are shown merely for describing this embodiment, and actually a very large number of lines are formed in complicated patterns. Accordingly, the number of metal lines shown in FIGS. 1(a) and 1(c), the number of lines shown in FIGS. 2(a) and 2(b) and the number of leads shown in FIG. 4 do not accord with one another, but actually these lines and leads are formed in number according to the necessary number of signal terminals.

When the power leads 302 and the ground leads 303 are respectively connected with the power line 212 and the ground line 213 through the second metal lines 402, the wiring body 200A is fixed and supported by using an insulating adhesive.

In each of this and the following embodiments, the lines and the leads can be connected through any of the following in stead of soldering: brazing by using metal solder having a high melting point; resistance welding (such as spot welding) in which a lead and a pad is connected, with a current allowed to flow therebetween, by using Joule heat, with the leads and the pads formed out of a combination of electrode-positionable metals, such as Au and Au, Au and Sn, Au and Ag, and Ag and Pd; welding such as laser welding; and adhesion by using a conductive adhesive. Also, the metal lines can be replaced with metal thin plates.

The semiconductor device of this invention is characterized by a wiring body 200 described in each of this and the following embodiments. Owing to this structure, the present semiconductor device can exhibit the following effects: In the case where printed lines are formed on an insulating supporting substrate 205 of such a wiring body 200, it is possible to form refined lines in various types of patterns. Specifically, since the lines are formed on the insulating supporting substrate 205 in the shape of a plate, even when the wiring body 200 is entirely moved during the resin encapsulation, the respective lines can be prevented from being independently moved differently from the leads in a lead frame. Also, since the lines can be thus refined, the pitch therebetween can be sufficiently large. The effects brought by the refined lines and the enlarged pitch will now be described.

The self-inductance L of each line is represented by the following formula (2):

$$L=(\mu o y/2\pi)[\ln\{2y/(a+b)\}+(\tfrac{1}{2})] \qquad (2)$$

wherein $\mu o$ indicates vacuum permeability, y indicates a length of a conductor, a indicates a width of the conductor and b indicates a thickness of the conductor.

Also, the mutual inductance LM of each line is represented by the following formula (3):

$$LM=(\mu o/2\pi)[y\ln\{(y+(y^2+d^2)^{1/2}/d\}-(y^2+d^2)^{1/2}+d] \qquad (3)$$

wherein d indicates a pitch between the lines. When a current i flows through an adjacent line, a voltage decrease corresponding to a value of -LM(di/dt) is caused, resulting in causing the crosstalk.

On the basis of the formula (2), when the width a of the line is decreased, the self-inductance L is increased, but the increase of the self-inductance L can be suppressed by increasing the thickness b of the line. In the case where the lines are formed by printing, their width and thickness can be freely set differently from those in a lead frame whose thickness is determined by a standard, and hence, there arises no problem even when the width is decreased. Furthermore, on the basis of the formula (3), when the pitch d between the lines is increased, the mutual inductance LM is decreased. Accordingly, the crosstalk can be prevented by using the wiring body 200A of this embodiment.

In addition, since the lines on the insulating supporting substrate 205 can be thus formed into a complicated pattern, which cannot be attained by using a lead frame, the impedance can be very easily adjusted.

Accordingly, by interposing such a wiring body 200 between the semiconductor chip and the leads, or by providing a signal transfer unit in a circuit dealing with a high frequency signal with such a wiring body 200, it is possible to manufacture a semiconductor device excellent in a high speed operation on a high frequency signal and in noise resistance. These effects are basically achieved by the present invention.

In particular, in the semiconductor device of the first embodiment, since the power leads 302 and the ground leads 303 are directly connected with the power line 212 and the ground line 213 on the wiring body 200A without using metal lines, the inductance can be suppressed to be a very small value. Therefore, the variation of the ground potential can be suppressed so as to definitely prevent degradation of a signal waveform and malfunction even when the semiconductor device includes rapidly operated transistors.

Figure 34A:
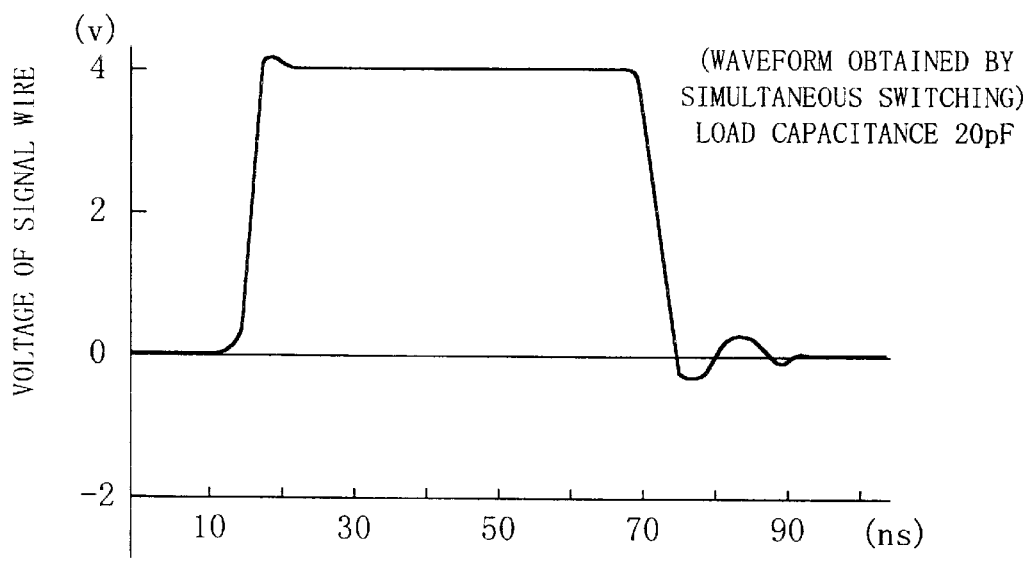
FIGS. 34(a) through 34(c) are diagrams for showing results of experiments conducted for comparison in ground noise between a conventional high frequency semiconductor device and the present high frequency semiconductor device.
Figure 34B:
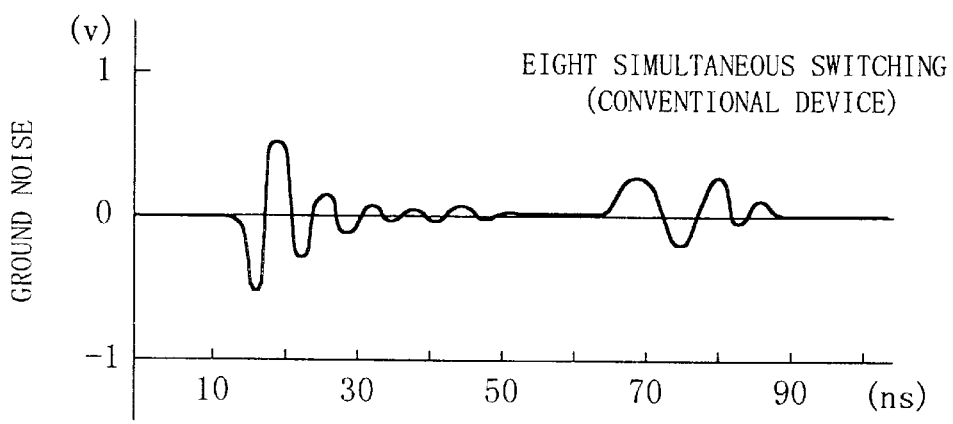
Figure 34C:
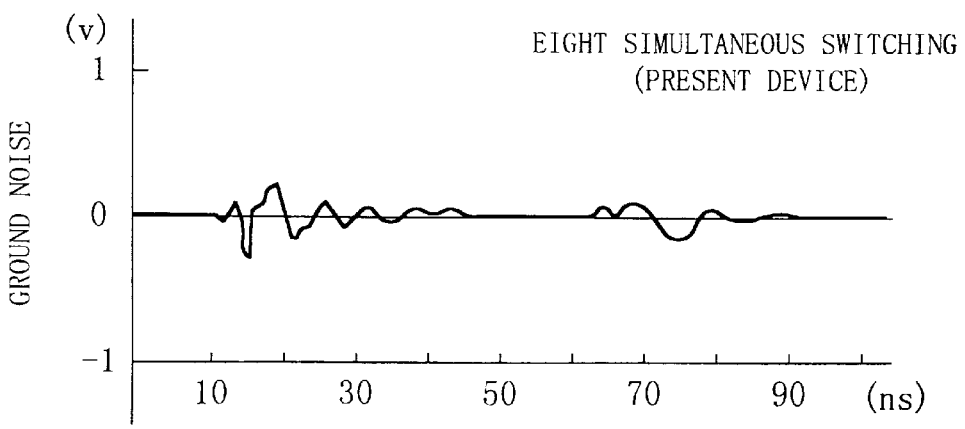
Figure 35:
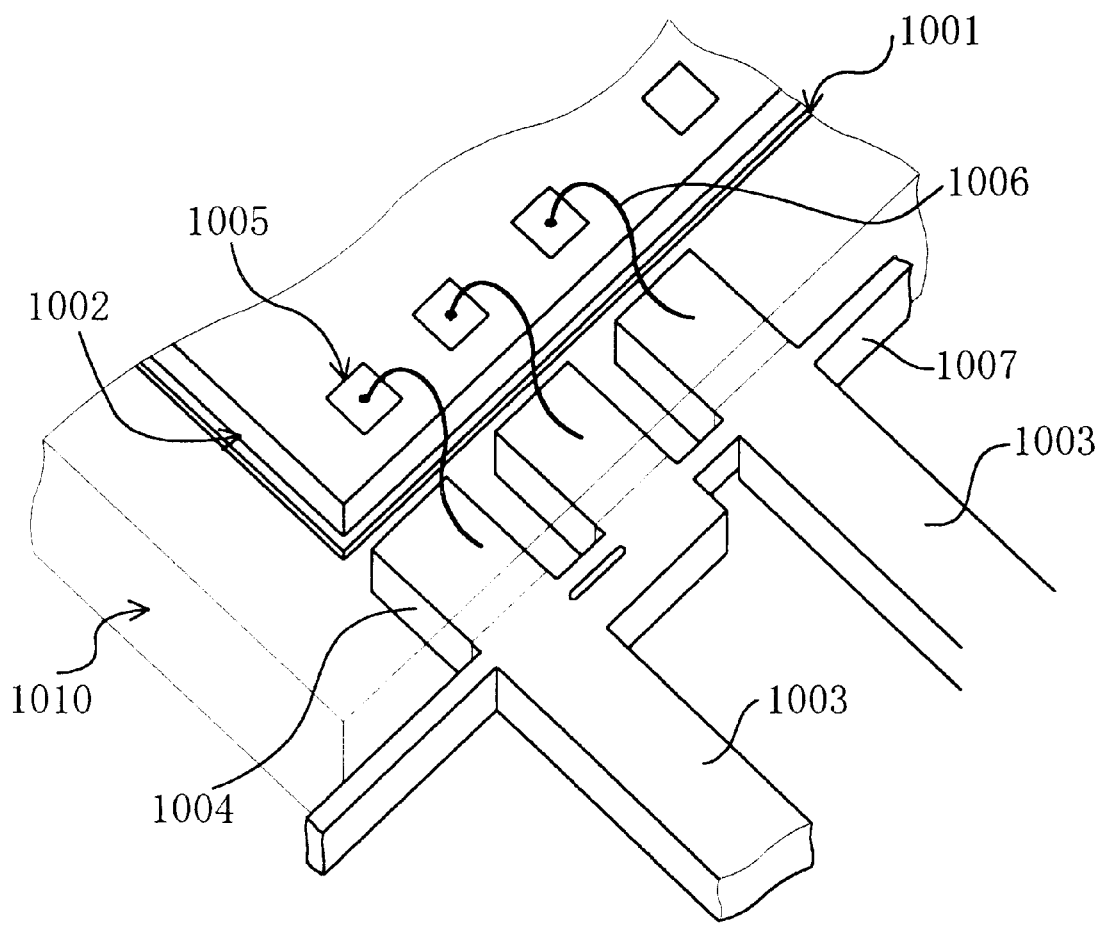
FIG. 35 is an enlarged perspective view of bonding between a lead frame and a semiconductor chip using a technique described in a known publication.
Figure 36:
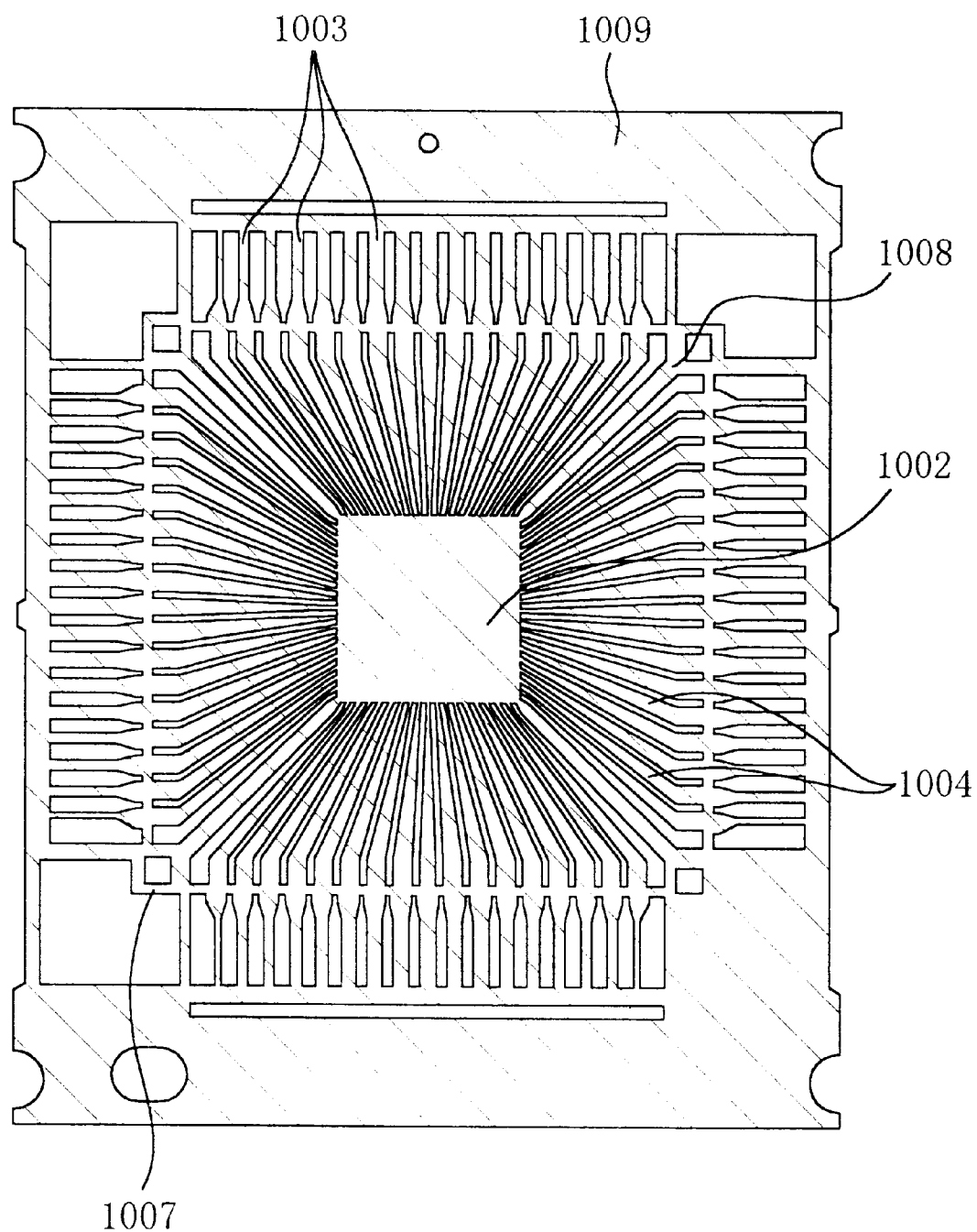
FIG. 36 is a plan view for showing the structure of a conventional general lead frame.

FIGS. 34(a) through 34(c) show results of experiments conducted for comparing ground noise in a conventional high frequency semiconductor device and that in the high frequency semiconductor device of this embodiment. FIG. 34(a) shows a waveform of a signal voltage supplied for the measurement, and FIGS. 34(b) and 34(c) show data on the ground noise caused through eight simultaneous switching, respectively in the conventional device and the present device. As is obvious from the comparison of the data shown in FIGS. 34(b) and 34(c), the ground noise is largely decreased in the present device.

Furthermore, in the semiconductor device of this embodiment, the power line 202 and the ground line 203 disposed on the first surface 210 and the power line 212 and the ground line 213 disposed on the second surface 220 are formed so as to have a very small distance therebetween. At this point, a capacitance C of a parallel plate capacitor including sufficiently long two conductive films opposing each other with a distance d therebetween and with an insulating material sandwiched therebetween is represented by the following formula (4):

$$C = (\epsilon/d) \cdot y \cdot b = (\epsilon/d) \cdot S \qquad (4)$$

wherein $\epsilon$ indicates a dielectric constant of the interposed dielectric material and S indicates an area of the opposing portions of the two conductive films. Specifically, as the distance d between the two conductive films is smaller, the capacitance C is larger, and the capacitance C can be adjusted by adjusting the area S, namely, the opposing area (See a structure shown in FIG. 20 referred to in a modification described below). Accordingly, power noise can be definitely avoided without providing a path capacitor, which is conventionally provided between a power line and a ground line. Therefore, the performance of the semiconductor device can be improved and the compactness thereof can be attained. Also, proportions occupied by the power line 212 and the ground line 213 on the second surface 220 are not necessarily the same but one of them cain be larger than the other.

Furthermore, it is found that the noise can be suppressed to a very low level by adjusting the number, the size and the positions of the through holes 215.

In each of this and the following embodiments and modifications, the insulating supporting substrate 205 of the wiring body 200 can be made from an organic material such as glass epoxy, polyimide, polyester, benzocyclobutene (BCB), a BT resin, and polyimide amide ether. When the lines are supported by such a flexible insulating supporting substrate, the wiring body can be easily dealt with in the manufacture. Also, the insulating supporting substrate 205 can be made from alumina, silicon nitride, aluminum nitride, silicon carbide, ceramic such as beryllium oxide, a silicon substrate, an insulating film-coated metal, that is, so-called enamel, or high purity glass. When the insulating supporting substrate 205 is made from such a material, the leads and the lines can be connected with ease by brazing because such a material has a higher melting point than the organic materials. Thus, the reliability Of the bonding can be improved.

Moreover, in each of this and the following embodiments and modifications, the adhesive used in fixing the semiconductor chip 100 on the wiring body 200 can be any of a thermosetting resin such as epoxy and polyimide, PPS, a thermoplastic resin such as polyamide imide ether, and a UV curing resin. Also, such an adhesive can include fine size fillers of quartz, hard glass, ceramic, a metal having a high melting point and including an insulated oxide film on its surface, or the like.

Furthermcre, in each of this and the following embodiments and modifications, the lines of the wiring body can be formed by printing a conductive material, by CVD, or by plating and patterning a metal film. Each of the lines is not required to be formed on the surface of the insulating supporting substrate, but a part or a larger part of the line can be buried in the insulating supporting substrate.

Embodiment 2

Figure 5B:
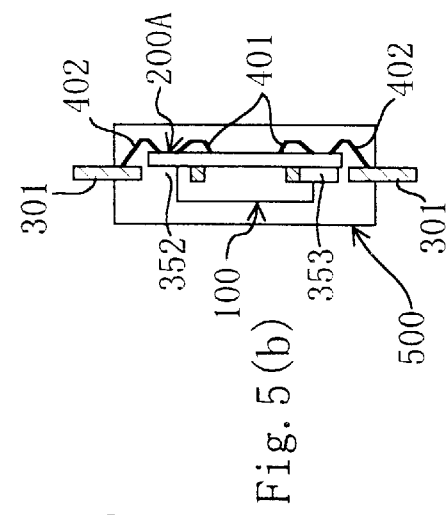
FIGS. 5(a) through 5(d) are a plan view of a semiconductor device according to a second embodiment taken on the side of a second surface, a cross sectional view thereof taken on line Vb—Vb, a plan view thereof taken on the side of a first surface, and a cross sectional view thereof taken on line Vd—Vd, respectively.
Figure 5A:
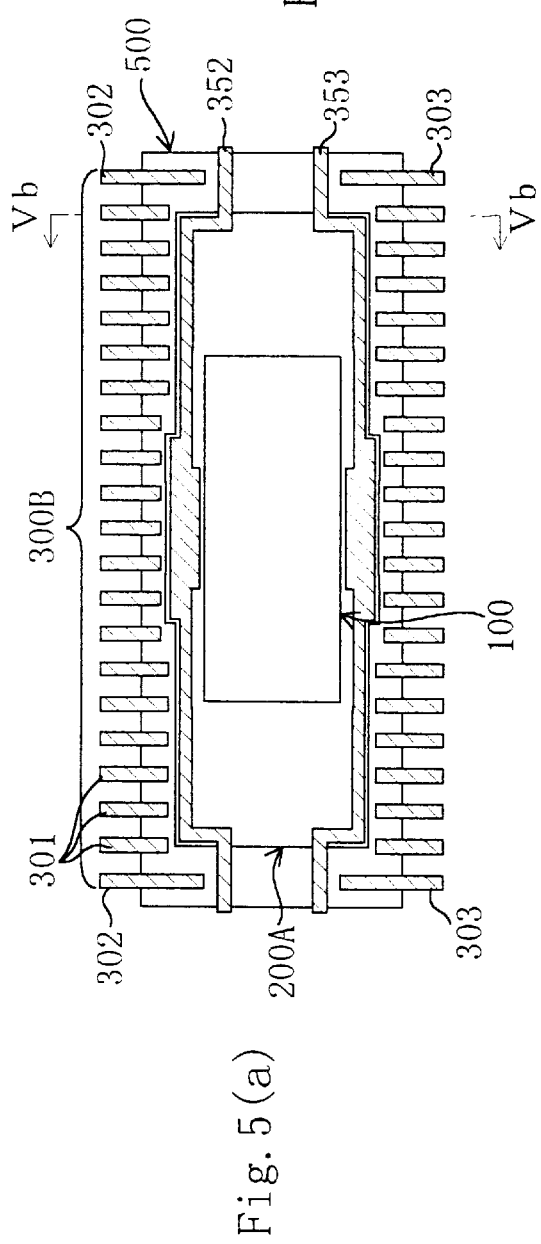
Figure 5D:
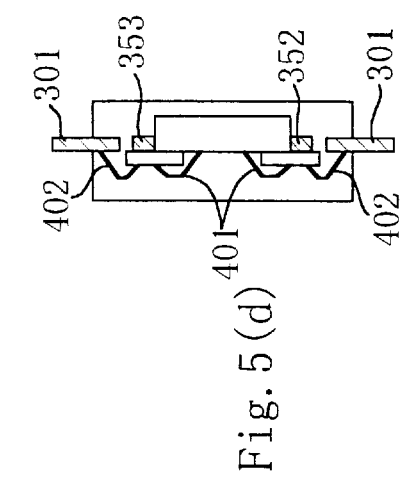
Figure 5C:
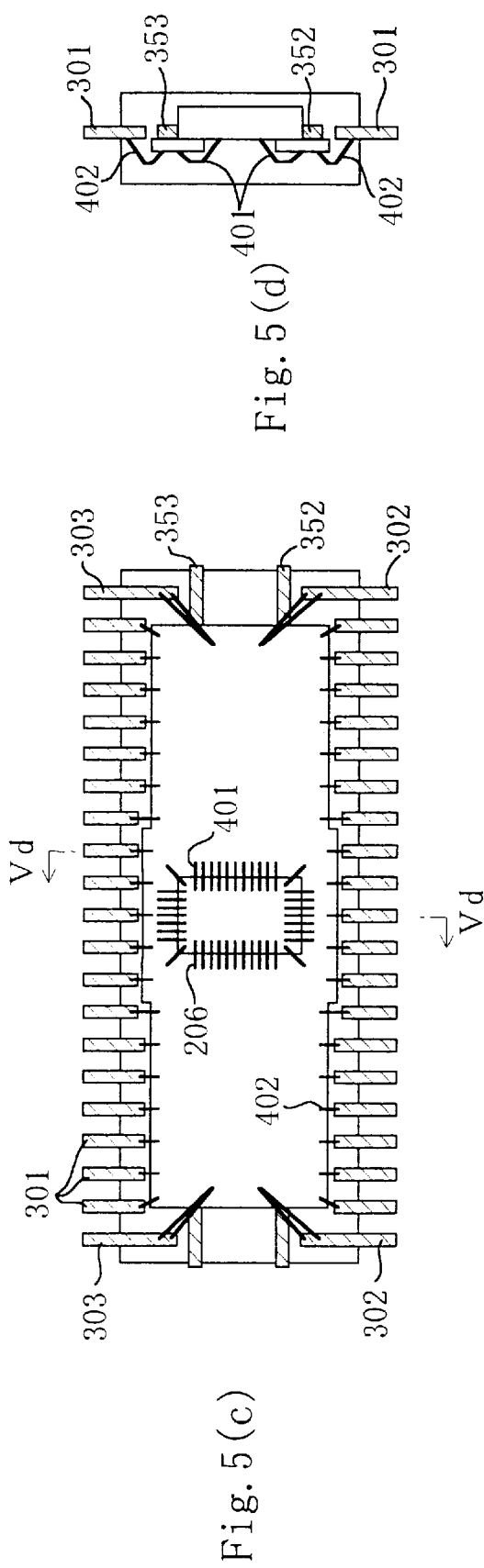

A semiconductor device according to a second embodiment will now be described with reference to FIGS. 5(a) through 5(d) and 6. FIGS. 5(a) through 5(d) show the structure of the semiconductor device of the second embodiment, wherein FIG. 5(a) is a plan view thereof taken on the side of a second surface of a semiconductor chip, FIG. 5(b) is a cross sectional view thereof taken on line Vb—Vb of FIG. 5(a), FIG. 5(c) is a plan view thereof taken on the side of a first surface of the semiconductor chip and FIG. 5(d) is a cross sectional view thereof taken on line Vd—Vd of FIG. 5(c).

Figure 6:
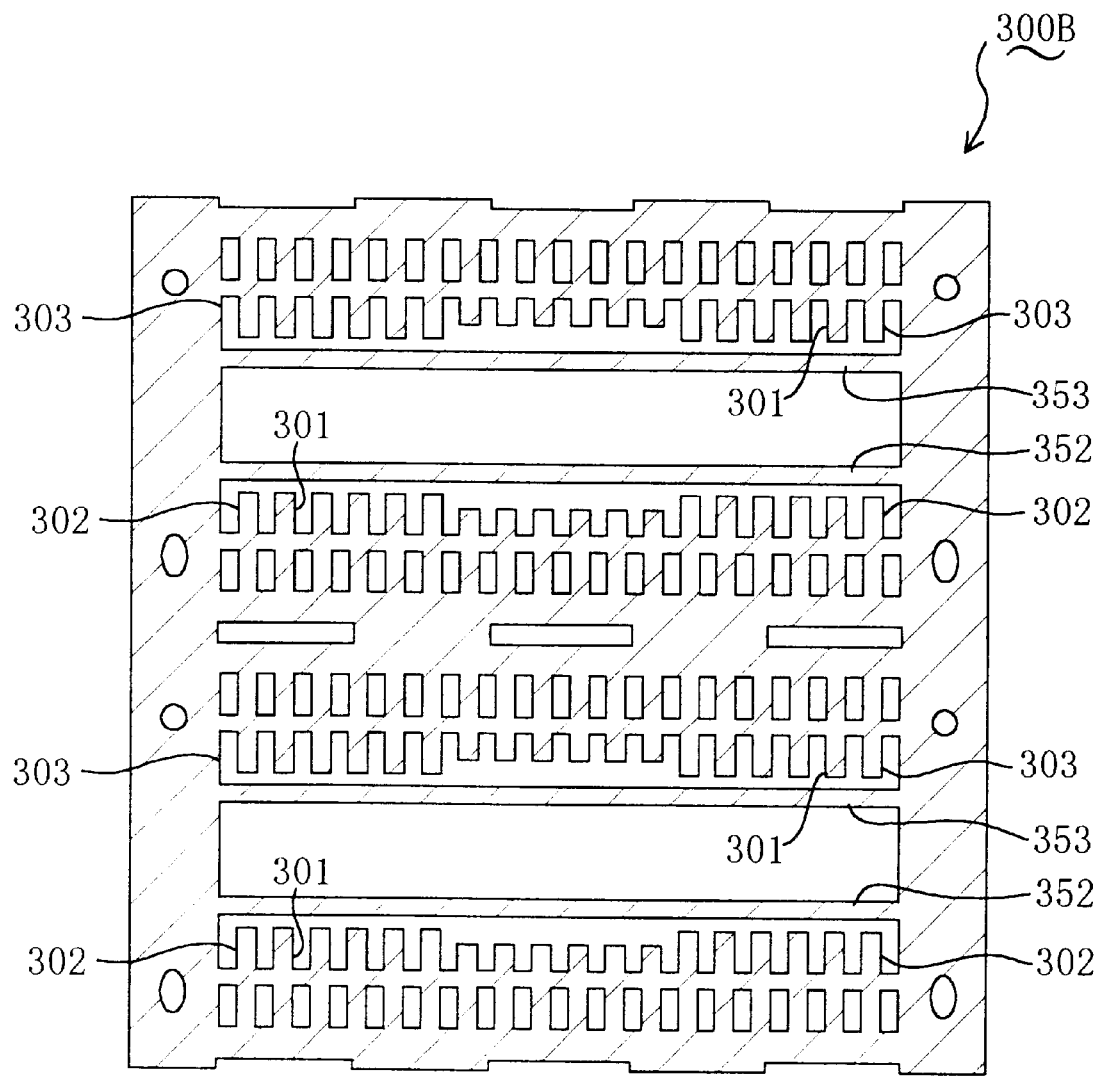
FIG. 6 is a plan view of a lead frame of the second embodiment.

As is shown in FIGS. 5(a) through 5(d), the semiconductor device of this embodiment has a basic structure substantially the same as that of the semiconductor device of the first embodiment and includes the same wiring body 200A. As a characteristic of this embodiment, as is shown in FIG. 6, a lead frame 300B of this embodiment is provided with beltshaped line fixing bars 352 and 353 each in pair, extending from a shorter side of the insulating supporting substrate 205 along the edge of a longer side thereof, so that the line fixing bars 352 and 353 can be respectively connected with the power line 212 and the ground line 213 on the second surface 220 of the wiring body 200A. At this point, the line fixing bars 352 and 353 are connected with the power line 212 and the ground line 213 generally by soldering, brazing, welding or using a conductive adhesive, whereas an insulating adhesive is also adoptable.

FIG. 6 is a diagram for showing the structure of the lead frame 300B used in this embodiment. As is shown in FIG. 6, the line fixing bars 352 and 353 connect two rails of the lead frame 300B. However, the line fixing bars 352 and 353 have simplified shapes in FIG. 6, and they actually have the shapes as is shown in FIG. 5(a).

The power leads 302 and the ground leads 303 are generally disposed at the outermost positions adjacent to the signal leads 301 aligned parallel to one another and along the two longer sides of the wiring body 200A. However, the positions and the number of these leads are not particularly specified in this embodiment. In other words, the power leads 302 and the ground leads 303 can be disposed at positions other than the outermost positions, and can be provided in larger number. In this embodiment, the power leads 302 and the ground leads 303 each in pair are connected with the pads of the power lines 202 and the ground lines 203 formed on the first surface 210 of the wiring body 200A through the second metal lines 402.

Also in this embodiment, the semiconductor chip 100 is stacked on the wiring body 200A in the same manner as in the first embodiment as is shown in FIGS. 3(a) through 3(c).

According to this embodiment, similarly to the first embodiment, the semiconductor device using the wiring body 200A of FIGS. 2(a) and 2(b) can attain high noise resistance, a high operation speed, and a good impedance matching performance.

In addition, since the continuous belt-shaped line fixing bars 352 and 353 are disposed so as to cross the wiring body 200A and extend between the shorter sides thereof, the wiring body 200A can be more stably and rigidly supported in assembling the semiconductor device, resulting in easing the manufacture. Moreover, the semiconductor device of this embodiment has a so-called DIP structure in which all the lead terminals protrude from the two longer sides of the semiconductor device after the resin encapsulation (with the line fixing bars 352 and 353 cut off in the vicinity of the surface of the encapsulating resin 500). Therefore, an automated assembling procedure for mounting on a print substrate and the like can be advantageously smoothly conducted.

It is noted that the line fixing bars 352 and 353 can be used as the power leads and the ground leads with the original power leads 302 and ground leads 303 used as sub-power leads and sub-ground leads. In such a case, the lines on the two surfaces and the leads are aligned in three parallel lines. Accordingly, a resistance component of the impedance can be particularly decreased. Furthermore, since the inductance is also decreased, the variation in the ground potential and the power potential can be more definitely prevented. Moreover, the bonding of the wiring body 200A with the power line 212 and the ground line 213 can be made more stable and rigid, resulting in more definitely preventing the variation in the ground potential and the power potential.

Embodiment 3

A semiconductor device according to a third embodiment will now be described with reference to FIGS. 7(a) through 7(d) and 8. FIGS. 7(a) through 7(d) show the structure of the semiconductor device of the third embodiment, wherein FIG. 7(a) is a plan view thereof taken on the side of a second surface of a semiconductor chip, FIG. 7(b) is a cross sectional view thereof taken on line VIIb—VIIb of FIG. 7(a), FIG. 7(c) is a plan view thereof taken on the side of a first surface of the semiconductor chip, and FIG. 7(d) is a cross sectional view thereof taken on line VIId—VIId of FIG. 7(c).

As is shown in FIGS. 7(a) through 7(d), the semiconductor device of this embodiment has a basic structure substantially the same as that of the semiconductor device of the second embodiment. As a characteristic of this embodiment, a lead frame 300C of this embodiment includes a pair of power leads 302 and a pair of ground leads 303 integrated with the line fixing bars of the second embodiment.

Figure 8:
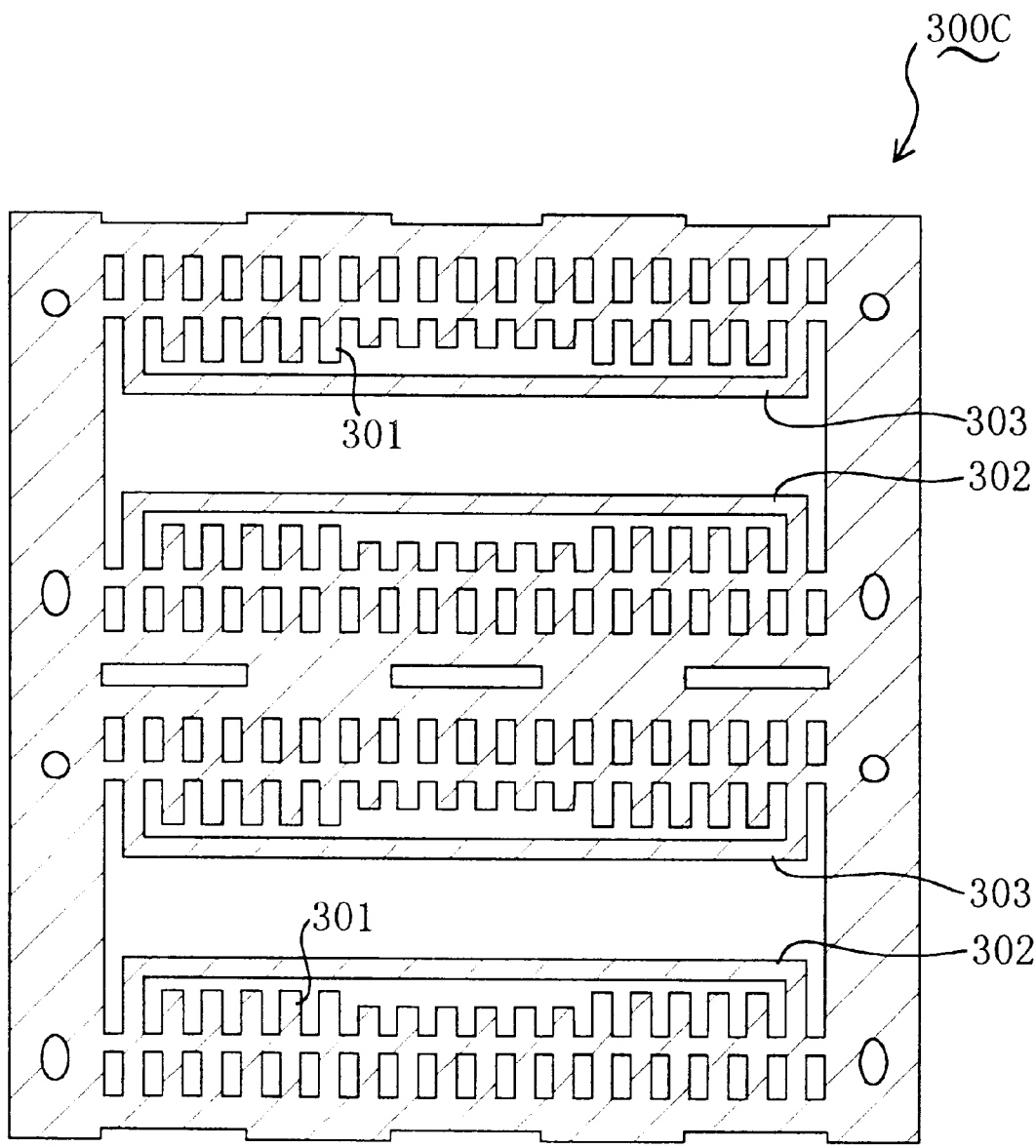
FIG. 8 is a plan view of a lead frame of the third embodiment.

FIG. 8 is a diagram for showing the structure of the lead frame 300C of this embodiment. As is shown in FIG. 8, the power leads 302 and the ground leads 303 do not connect the two rails of the lead frame 300C but connect an outer frame connecting the rails. The power leads 302 and the ground leads 303 are shown to have simplified shapes in FIG. 8 but they actually have shapes as is shown in FIG. 7(a).

Specifically, the power leads 302 and the ground leads 303 of this embodiment also have a function to support the wiring body 200A in assembling the wiring body 200A and the lead frame 300C similarly to the line fixing bars 352 and 353 of the semiconductor device of the second embodiment. In the lead frame 300C of this embodiment, differently from that of the first embodiment, the power leads 302 and the ground leads 303 do not extend straight at the outermost positions along the shorter sides of the insulating supporting substrate 205 but are bent at right angles so as to extend in parallel to the aligning direction of the signal leads 301. In other words, in the semiconductor device of this embodiment placed in the state shown in FIG. 33, all the leads 301 through 303 protrude from the side faces along the longer sides.

Also in this embodiment, the semiconductor chip 100 is stacked on the(wiring body 200A in the same manner as in the first embodiment as is shown in FIGS. 3(a) through 3(c).

According to this embodiment, similarly to the first embodiment, the semiconductor device using the wiring body 200A of FIGS. 2(a) and 2(b) can attain high noise resistance, a high operation speed, and a good impedance matching performance.

In addition, since the continuous belt-shaped power leads 302 and ground leads 303 are disposed so as to cross the wiring body 200A and extend between the shorter sides thereof, the lines on the two surfaces and the leads are aligned in three parallel lines. Accordingly, a resistance component of the impedance can be particularly decreased. Furthermore, since the inductance can be also decreased, the variation in the ground potential and the power potential can be more definitely prevented. Moreover, similarly to the second embodiment in which the power leads 302 and the ground leads 303 are continuously formed to connect the rails of the lead frame 300B so as to have the function to fix the wiring body, the lead frame 300C also has the function to fix the wiring body. Therefore, the lead frame 300C can be more stably and rigidly connected with the power line 212 and the ground line 213 of the wiring body 200A, resulting in more definitely preventing the variation of the ground potential and the power potential. In addition, the semiconductor device of this embodiment has the so-called DIP structure in which all the signal terminals protrude from the longer sides of the semiconductor device. Therefore, an automated assembling procedure for mounting on a print substrate and the like can be advantageously smoothly conducted.

Figure 9:
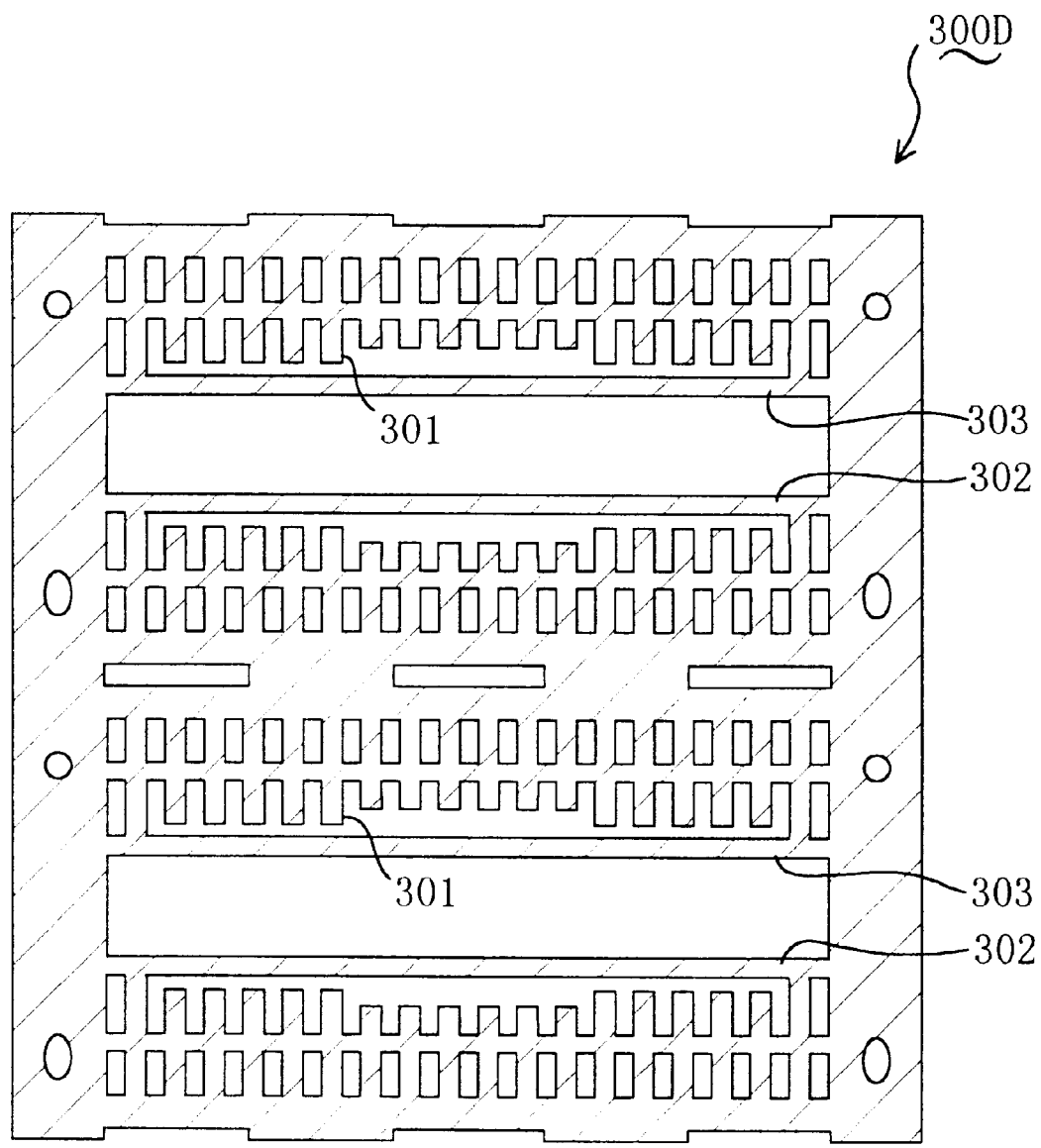
FIG. 9 is a plan view of a modification of the lead frame of the third embodiment.

The lead frame applicable to this embodiment is not limited to that having the structure as is shown in FIG. 8. FIG. 9 is a plan view of a lead frame 300D according to a modification of this embodiment. In the lead frame 300D of this modification, the power leads 302 and the ground leads 303 are connected also with the rails of the lead frame 300D. After the resin encapsulation, the rails of the lead frame 300D are cut off so as to be separated from the power leads 302 and the ground leads 303. When this structure is adopted, the strength of the power leads 302 and the ground leads 303 can be increased in the assembly, resulting in attaining an advantage that the lead frame 300D can be suppressed from being deformed during the assembly.

Embodiment 4

A semiconductor device according to a fourth embodiment will now be described with reference to FIGS. 10(a) through 10(d), 11(a), 11(b), and 12.

FIGS. 10(a) through 10(d) are diagrams for showing the structure of the semiconductor device of the fourth embodiment, wherein FIG. 10(a) is a plan view thereof taken on the side of a second surface of a semiconductor chip and the like, FIG. 10(b) is a cross sectional view thereof taken on line Xb—Xb of FIG. 10(a), FIG. 10(c) is a plan view thereof taken on the side of a first surface of the semiconductor chip and the like, and FIG. 10(d) is a cross sectional view thereof taken on line Xd—Xd of FIG. 10(c).

As is shown in FIGS. 10(a) through 10(d), the semiconductor device of this embodiment has a basic structure substantially the same as that of the semiconductor devices of the first through third embodiments shown in FIGS. 1(a) through 1(d) and the like. However, in the semiconductor device of this; embodiment, although the first metal lines 401 for connecting the lines of a wiring body 200B with the bonding pads of a semiconductor chip 100 are used, the second metal lines for connecting the leads of a lead frame 300E with the lines of the wiring body 200B are not provided.

Figure 11A:
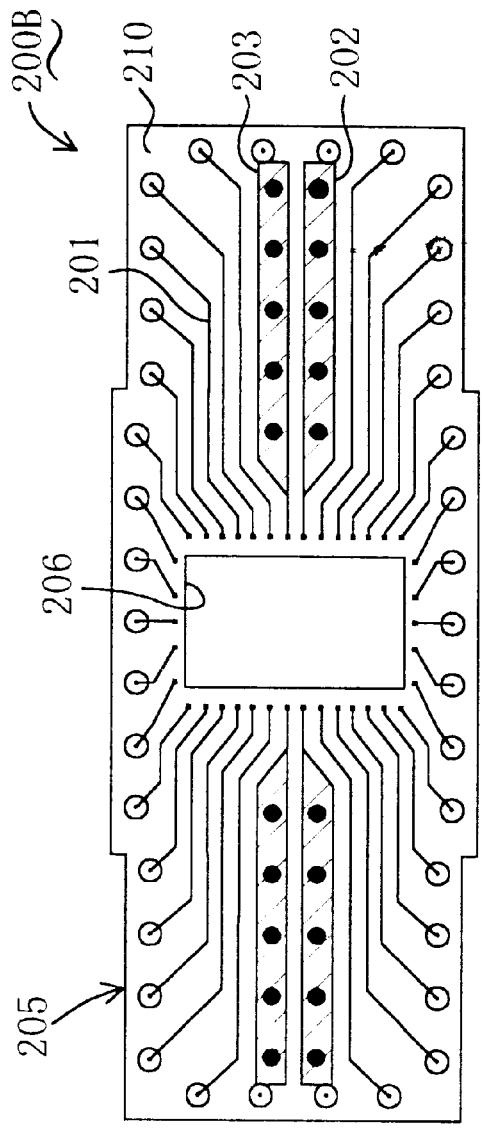
FIGS. 11(a) and 11(b) are plan views of a wiring body of the fourth embodiment taken on the side of a first surface and on the side of a second surface, respectively.
Figure 11B:
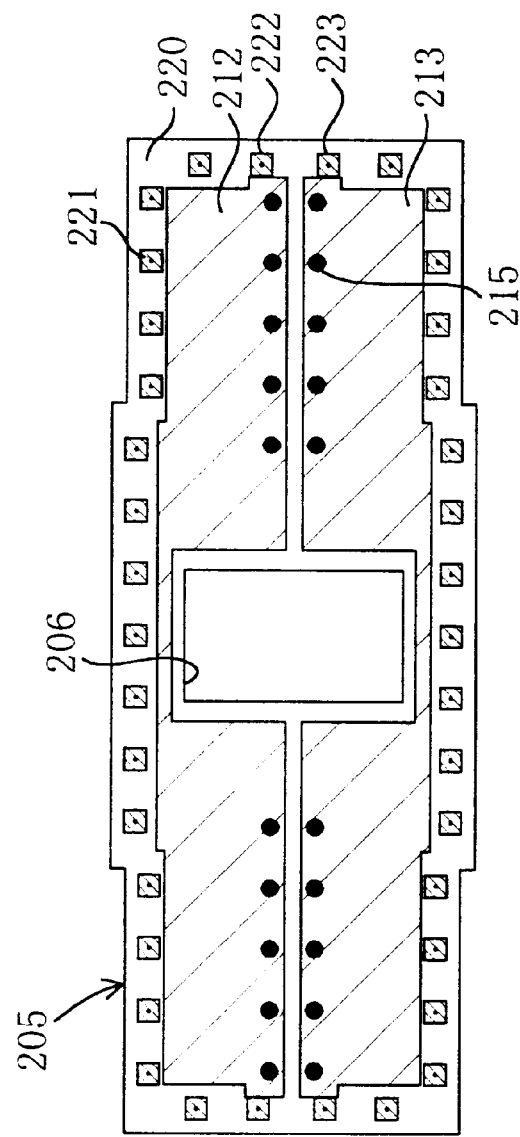

FIGS. 11(a) and 11(b) are plan views of the wiring body 200B taken on the side of a first surface 210 and on the side of a second surface 220 of an insulating supporting substrate 205. As is shown in FIG. 11(a), on the first surface 210 of the insulating supporting substrate 205 of the wiring body 200B are formed, by printing, a large numbers of lines extending from the vicinity of outer edges to the vicinity of an opening 206, namely, narrow signal lines 201, wide power lines 202, wide ground lines 203 and the like. This structure is the same as that of the wiring body 200A used in the first through third embodiments. However, in the wiring body 200B of this embodiment, outside pads of the lines 201, 202 and 203 are not provided on the first surface 210 as is shown in FIG. 11(b) but the second surface 220 of the insulating supporting substrate 205 is provided with signal line pads 221, power line pads 222 and ground line pads 223. Each of the signal line pads 221 is electrically connected with the end of the signal line 201 on this first surface 210 through a conductive material formed in a through hole. The power line pads 222 and the ground line pads 223 are respectively connected with a power line 212 and a ground line 213 formed on the second surface 220. The power line 212 and the ground line 213 on the second surface 220 are electrically connected with the power lines 202 and the ground lines 203 formed on the first surface 210 through a conductive material formed in respective through holes 215.

Figure 12:
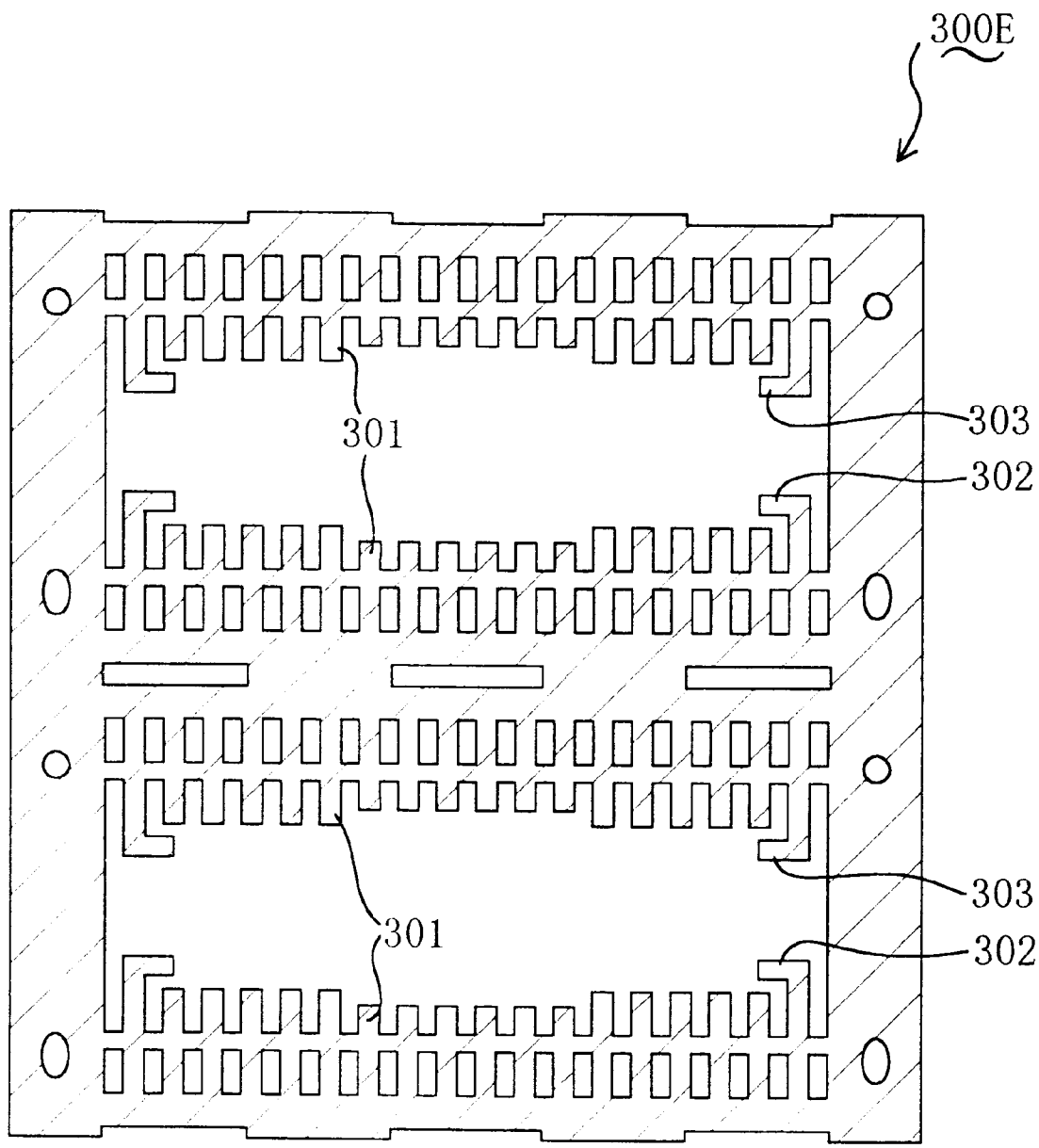
FIG. 12 is a plan view of a lead frame of the fourth embodiment.

FIG. 12 is a plan view for showing the structure of the lead frame 300E used in this embodiment.

Also in this embodiment, the semiconductor chip 100 is stacked on the wiring body 200B in substantially the same manner as in the first embodiment as is shown in FIGS. 3(a) through 3(c). Specifically, they are stacked by adhering a first surface 110 of the semiconductor chip 100 to the second surface 220 of the wiring body 200B.

With the lead frame 300E of FIG. 12 in contact with the second surface 220 of the wiring body 200B, the respective leads are connected with the pads of the wiring body 200B by soldering, brazing, welding, using a conductive adhesive or the like. Then, as is shown in FIG. 10(b) through 10(d), the signal bonding pads 101 of the semiconductor chip are connected with the pads of the signal lines 201 of the wiring body 200B, the power bonding pads 102 of the semiconductor chip 100 are connected with the pads of the power lines 202 of the wiring body 200B and the ground bonding pads 103 of the semiconductor chip 100 are connected with the pads of the ground lines 203 of the wiring body 200B respectively through the first metal lines 401.

Furthermore, the semiconductor chip 100, the wiring body 200B and the tips of the leads (i.e., inner leads) of the lead frame 300E are encapsulated with an encapsulating resin, and then dam bars and outer leads of the lead frame 300E are cut off. Thus, the semiconductor device having the structure as is shown in FIGS. 10(a) through 10(d) can be obtained.

In this embodiment, since the wiring body 200B is connected with the leads not through the second metal lines but by soldering, brazing, welding, using a conductive adhesive or the like, the inductance at the bonding of the signal lines can be further decreased as compared with that in the aforementioned embodiments.

Modification of wiring body

In each of the above-described embodiments, the entire structure of the semiconductor device is described, and a variety of modifications of the wiring body are applicable as follows:

(1) Modification 1:

FIGS. 13(a) and 13(b) are plan views of a wiring body 200C of a first modification taken on the side of a first surface 210 and on the side of a second surface 220 of an insulating supporting substrate 205, respectively. The wiring body 200C of this modification has the same structure on the first surface 210 as that of the wiring body 200A used in the first through third embodiments (shown in FIG. 2(a)), but has a different structure on the second surface 220. Specifically, on the second surface 220 of the wiring body 200C of this modification, no power line is formed but a ground line 213 is formed substantially on the entire area of the second surface 220. Accordingly, when this wiring body 200C is used, in the state as is shown in FIGS. 1(a) through 1(d) of the first embodiment, power leads 302 of a lead frame 300 are connected with power lines 202 on the first surface 210 of the wiring body 200C, and ground leads 303 are connected with the ground line 213 on the second surface 220 of the insulating supporting substrate 205 of the wiring body 200C.

When the structure of the wiring body 200C of this modification is adopted, the variation in the ground potential, which harmfully affects the operation of elements, can be advantageously definitely prevented.

(2) Modification 2:

FIGS. 14(a) and 14(b) are plan views of a wiring body 200D of a second modification taken on the side of a first surface 210 and taken on the side of a second surface 220 of an insulating supporting substrate 205, respectively. The wiring body 200D of this modification has the same structure on the first surface 210 as that of the wiring body 200B of the fourth embodiment (shown in FIG. 11(a)) but has a different structure on the second surface 220. Specifically, on the second surface 220 of the wiring body 200D of this modification, no power line is formed, but a ground line 213 is formed substantially on the entire area of the second surface 220. However, also in this modification, pads 221, 222 and 223 of respective lines for the electrical bonding with leads are all formed on the second surface 220. Therefore, also in the case where the wiring body 200D of this modification is adopted, leads 301, 302 and 303 of a lead frame 300 are connected with the pads 221, 222 and 223 formed on the second surface 220 of the wiring body 200D in the same manner as is shown in FIGS. 10(a) through 10(d) of the fourth embodiment by soldering, brazing, welding, using a conductive adhesive or the like.

When the structure of the wiring body 200D of this modification is adopted, the variation in the ground potential, which particularly harmfully affects the operation of elements, can be definitely prevented as in the first modification as well as the inductance at the bonding between the leads and the lines can be advantageously decreased.

(3) Modification 3:

FIGS. 15(a) and 15(b) are plan views of a wiring body 200E of a third modification taken on the side of a first surface 210 and taken on the side of a second surface 220 of an insulating supporting substrate 205, respectively. The wiring body 200E of this modification has the same structure on the first surfaces 210 as that of the wiring body 200A used in the first through third embodiments (shown in FIG. 2(a)), but has a different structure on the second surface 220. Specifically, on the second surface 220 of the wiring body 200E of this modification, neither a power line nor a ground line is formed, and these lines are formed on the first surface 210 alone. Accordingly, when the wiring body 200E of this modification is used, in the state as is shown in FIGS. 1(a) through 1(d) of the first embodiment, power leads 302 and ground leads 303 of a lead frame 300 are respectively connected with power lines 202 and ground lines 203 formed on the first surface 210 of the wiring body 200E.

In the structure of the wiring body 200E of this modification, since no conductive film is formed on the second surface 220, a stacked body formed by stacking the semiconductor chip 100 and the wiring body 200E can be definitely prevented from being deformed. Specifically, in adopting the structure where a conductive film is formed all over the second surface (namely, as in the wiring bodies 200A through 200D of the aforementioned embodiments and modifications), when the semiconductor chip and the wiring body are held at a high temperature of approximately 200° C. for the adhesion, they are adhered to each other with the wiring body expanded because of a difference in the coefficient of thermal expansion between the conductive film on the second surface and the insulating supporting substrate 205. Therefore, when the temperature is decreased to room temperature thereafter, the semiconductor chip can be deformed by a stress caused by shrinkage of the wiring body, and hence, it is necessary to provide any means to prevent them from peeling from each other. In contrast, since no conductive film is formed on the second surface 220 of the wiring body 200E of this modification, such deformation can be suppressed. In addition, there is no need to provide the means for preventing them from peeling from each other.

(4) Modification 4:

FIGS. 16(a) and 16(b) are plan views of a wiring body 200F of a fourth modification taken on the side of a first surface and on the side of a second surface of an insulating supporting substrate 205, respectively. The wiring body 200F of this modification has the same structure on the first surface 210 as that of the wiring body 200B of the fourth embodiment (shown in FIG. 11(a)) but has a different structure on the second surface 220. Specifically, on the second surface 220 of the wiring body 200F of this modification, neither a power line nor a ground line is formed, and these lines are formed on the first surface 210 alone. However, also in this modification, pads 221, 222 and 223 of respective lines for the electrical bonding with leads are all formed on the second surface 220. Therefore, also when the wiring body 200F of this modification is used, leads 301, 302 and 303 of a lead frame 300 are respectively connected with the pads 221, 222 and 223 formed on the second surface 220 of the wiring body 200F by soldering, brazing, welding, using a conductive adhesive or the like in the same manner as in the fourth embodiment shown in FIGS. 10(a) through 10(d).

When the structure of the wiring body 200F of this modification is adopted, since no conductive film is formed on the second surface 220 of the wiring body 200F as in the third modification, the aforementioned deformation can be prevented and there is no need to provide the means for preventing the wiring body and the semiconductor chip from peeling from each other. In addition, since the pads 221, 222 and 223 of all the lines for the bonding with the leads are formed on the second surface 220 of the wiring body 200F, the leads can be connected with the pads 221, 222 and 223 by soldering, brazing, welding, using a conductive adhesive or the like with ease as in the fourth embodiment shown in FIGS. 10(a) through 10(d), and the inductance can be decreased.

Figure 17A:
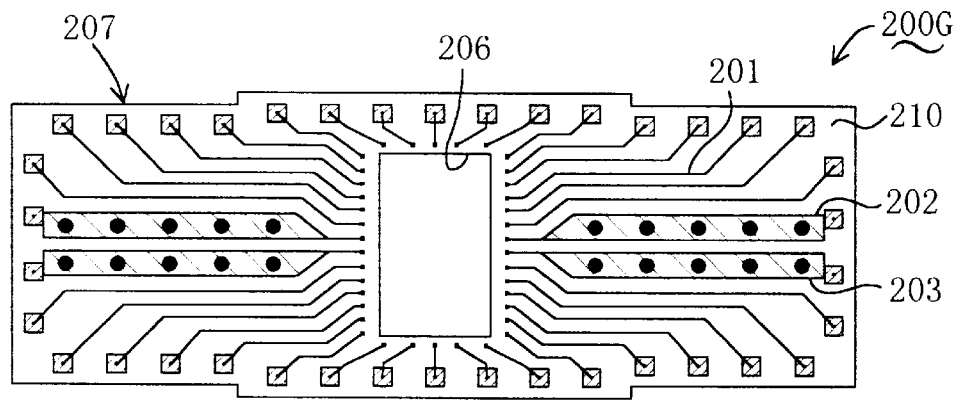
FIGS. 17(a) through 17(c) are plan views of a wiring body according to a fifth modification taken on the side of a first surface, on the side of a second surface and on the side of a third surface, respectively.
Figure 17B:
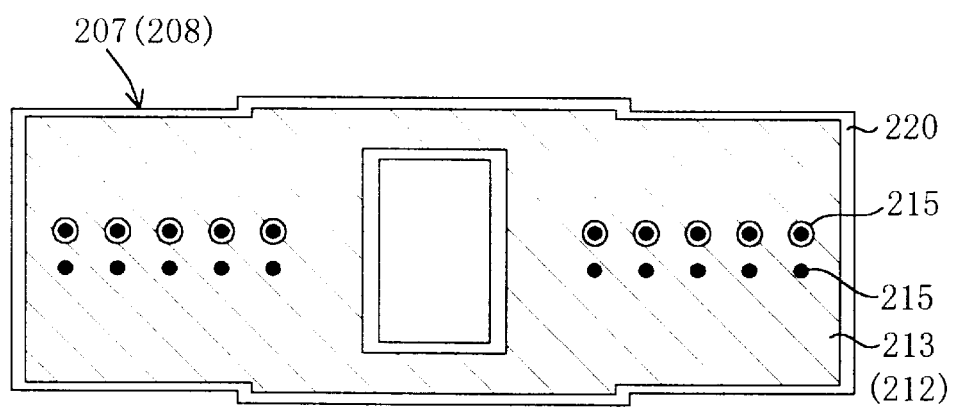
Figure 17C:
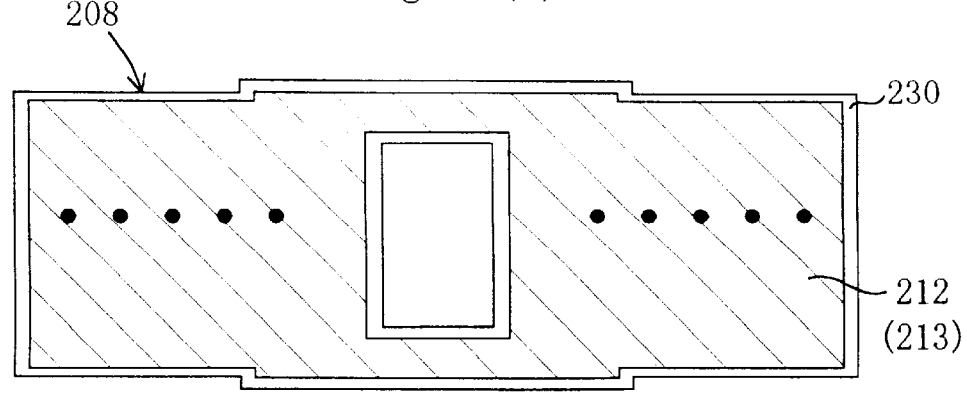

(5) Modification 5:

FIGS. 17(a) through 17(c) are plan views of a wiring body 200G of a fifth modification taken on the side of a first surface 210, on the side of a second surface 220 and on the side of a third surface 230, respectively. Any of the wiring bodies 200A through 200F of the aforementioned embodiments and modifications is obtained by forming lines on two surfaces of one substrate 205. However, the wiring body 200G of this modification includes two substrates 207 and 208 stacked each other. On the first surface 210, that is, the upper face of the upper substrate 207, signal lines 201, power lines 202, ground lines 203 and the like are formed, with each of the lines provided with pads at both ends thereof. On the second surface 220, that is, the lower face of the upper substrate 207 or the upper face of the lower substrate 208, a ground line 213 connected with the ground lines 203 formed on the first surface 210 is formed. On the third surface 230, that is, the lower face of the lower substrate 208, a power line 212 connected with the power lines 202 formed on the first surface 210 is formed. In other words, the wiring body 200G of this modification can be obtained by adding another substrate bearing the power line 212 to the wiring body 200C of the third modification shown in FIGS. 13(a) and 13(b).

In the wiring body 200G of this modification, a virtual ground is formed with a wide conductive film as described above, and hence, noise in the signal lines 201 can be prevented. In addition, since the wiring body 200G includes the two substrates 207 and 208 of an insulating material and the two conductive films 212 and 213 alternately stacked one another, thermal deformation can be prevented in forming a stacked body together with a semiconductor chip. Accordingly, they can be prevented from peeling from each other due to the thermal deformation as far as possible.

However, in the wiring body 200G of this modification, the power line 212 connected with the power lines 202 formed on the first surface 210 can be formed on the second surface 220 corresponding to the lower face of the upper substrate 207 or the upper face of the lower substrate 208, and the ground line 213 connected with the ground lines 203 formed on the first surface 210 can be formed on the third surface 230 corresponding to the lower face of the lower substrate 208. In such a case, the effect to prevent the crosstalk and the switching noise by using the virtual ground can also be exhibited.

Figure 18A:
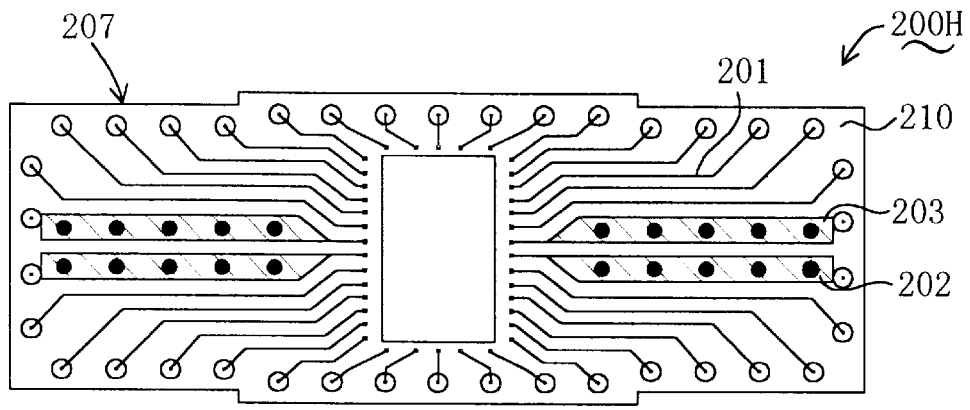
FIGS. 18(a) through 18(c) are plan views of a wiring body according to a sixth modification taken on the side of a first surface, on the side of a second surface and on the side of a third surface, respectively.
Figure 18B:
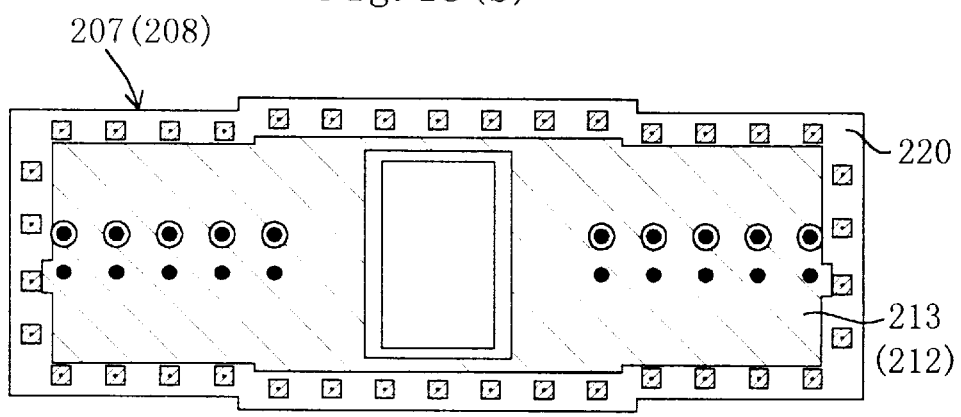
Figure 18C:
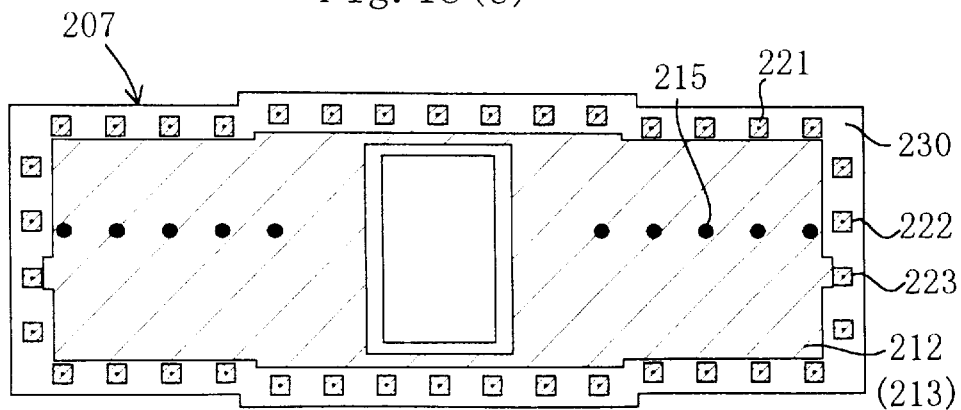

(6) Modification 6:

FIGS. 18(a) through 18(c) are plan views of a wiring body 200H of a sixth modification taken on the side of a first surface 210, on the side of a second surface 220 and on the side of a third surface 230, respectively. The wiring body 200H of this modification includes two substrates 207 and 208 stacked each other as in the wiring body 200G of the fifth modification. On the first surface 210 corresponding to the upper face of the upper substrate 207, signal lines 201, power lines 202, ground lines 203 and the like are formed, and these lines are provided with pads merely at their ends closer to an opening 206. On the second surface 220 corresponding to the lower face of the upper substrate 207 or the upper face of the lower substrate 208, a ground line 213 is formed. On the third surface 230 corresponding to the lower face of the lower substrate 208, a power line 212 and pads 221, 222 and 223 of the respective lines are formed. These lines and pads on the respective surfaces are electrically connected through a conductive material formed in respective through holes. In the wiring body 200H of this modification, leads of a lead frame can be electrically connected with the pads 221, 222 and 223 formed on the third surface 230 by soldering, brazing, welding, using a conductive adhesive or the like as in, for example, the fourth embodiment shown in FIGS. 10(a) through 10(d).

In the wiring body 200H of this modification, since a virtual ground can be formed with a wide conductive film as in the wiring body 200G of the fifth modification, the noise in the signal lines 201 can be prevented as well as the inductance at the bonding between the leads and the lines can be decreased. Also, since the wiring body 200H includes the two substrate 207 and 208 of an insulating material and the two conductive films 212 and 213 alternately stacked one another, the thermal deformation can be prevented in forming a stacked body together with a semiconductor chip. Accordingly, they can be prevented from peeling from each other due to the thermal deformation as far as possible.

In the wiring body 200H of this modification, the power line 212 connected with the power lines 202 formed on the first surface 210 can be formed on the second surface 220 corresponding to the lower face of the upper substrate 207 or the upper face of the lower substrate 208, and the ground line 213 connected with the ground lines 203 formed on the first surface 210 can be formed on the third surface 230 corresponding to the lower face of the lower substrate 208. In such a case, the effect to prevent the crosstalk and the switching noise by using the virtual ground can also be exhibited.

Figure 19A:
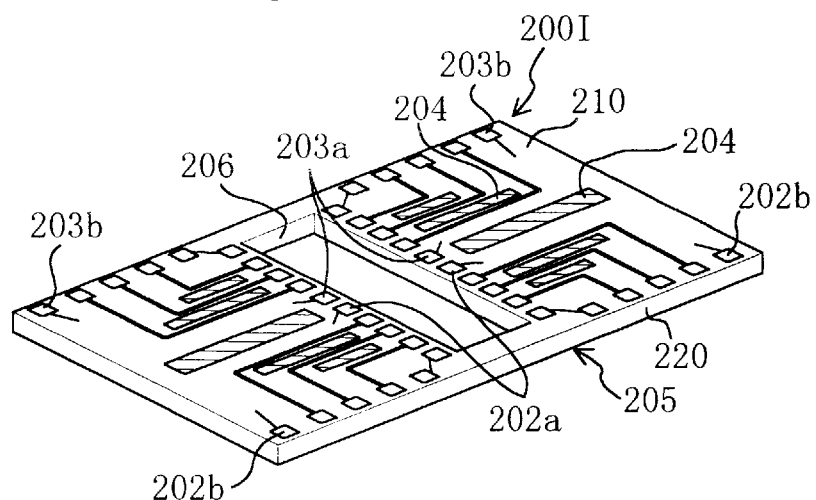
FIGS. 19(a) through 19(c) are perspective views for showing procedures for stacking a wiring body and a semiconductor chip in a seventh modification.
Figure 19B:
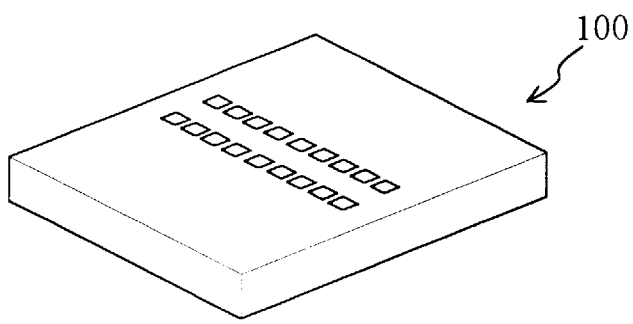
Figure 19C:
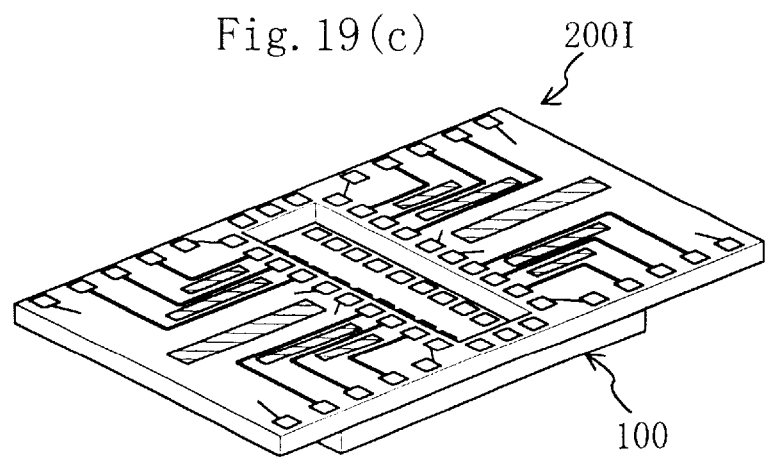

(7) Modification 7:

FIGS. 19(a) through 19(c) are perspective views for showing procedures for stacking a wiring body 200I of a seventh modification and a semiconductor chip 100. FIG. 19(a) is a perspective view of the wiring body 200I of this modification. The wiring body 200I has a rectangular opening 206 at the center thereof, and includes a substantially rectangular insulating supporting substrate 205 and lines formed on the insulating supporting substrate 205. As is shown in FIG. 19(a), on a first surface 210 of the wiring body 200I, a large number of lines, that is, signal lines 201, are formed so as to extend from the vicinity of the sides thereof to the vicinity of the opening 206, and each of the signal lines 201 is provided with pads for wire bonding at the both ends. However, on the first surface 210, outside and inside pads 202a and 202b of a power line and outside and inside pads 203a and 203b of a ground line alone are formed. Although not shown in the drawings, the power line and the ground line each occupying substantially a half area of the surface are formed on a second surface 220. The power line and the ground line on the second surface 220 are electrically connected with the pads 202a, 202b of the power line and the pads 203a and 203b of the ground line on the first surface 210 through a conductive material formed in through holes (not shown). As a characteristic of the wiring body 200I of this modification, between adjacent signal lines 201 on the first surface 210 of the insulating supporting substrate 205, a noise preventing line 204 is formed. Each noise preventing line 204 is connected with the power line or the ground line formed on the second surface 220 through a conductive material formed in a through hole (not shown).

After mounting the wiring body 200I on the semiconductor chip 100 of FIG. 19(b) so as to attain the state as is shown in FIG. 19(c), the bonding pads on the semiconductor chip and leads are electrically connected with the pads of the respective lines in the same manner as described in the aforementioned embodiments, and the resultant is encapsulated with a resin and the leads are cut off in the same manner as described in the embodiments. Thus, a semiconductor device can be completed.

Also according to this modification, similarly to any of the aforementioned embodiments, a semiconductor device having high noise resistance, a high operation speed and a good impedance matching performance can be realized. In addition, since the wiring body 200I of this modification includes the noise preventing lines 204 between the signal lines 201, the crosstalk be-ween the signal lines 201 can be definitely prevented.

The ground line can be formed on substantially the entire area of the second surface 210, and all the noise preventing lines can be connected with this ground line.

Figure 20:
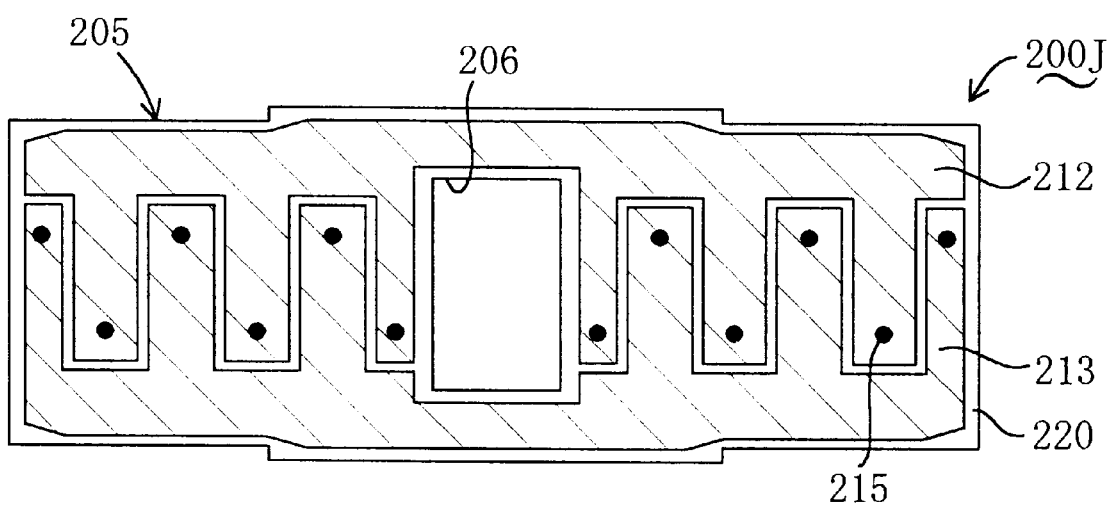
FIG. 20 is a plan view of a wiring body according to an eighth modification taken on the side of a second surface.

(8) Modification 8:

FIG. 20 is a plan view for showing the structure on a second surface 220 of a wiring body 200J of an eighth modification. The wiring body 200J has a structure on a first surface similar to that of the wiring body 200A of the first embodiment, and the structure on the first surface is herein omitted. As a characteristic of the wiring body 200J of this modification, a power line 212 and a ground line 213 formed on the second surface 220 are adjacent to each other with a zigzag boundary sandwiched therebetween. The power line 212 and the ground line 213 are respectively connected with power lines and ground lines formed on the first surface 210 through a conductive material formed in through holes 215.

In the wiring body 200J of this modification, since the power line 212 and the ground line 213 are adjacent to each other with the zigzag boundary sandwiched therebetween, the capacitance of a capacitor formed by these two lines 212 and 213 can be large. In other words, the capacitance can be adjusted in a wide range by setting various patterns such as this pattern. Accordingly, the resultant semiconductor device can exhibit a good noise reducing function.

Now, for attaining a noise reducing effect, a distance between the power line 212 and the ground line 213 is appropriately set as follows: For example, when a material for forming a power supply, a 0 line 212 and a ground line 213 is a Cu foil with a thickness of 50 $\mu$m (=5×10$^{-3}$ cm) and the length of a zigzag boundary area is 4 cm, the area of an opposing electrode is 20×10$^{-3}$ cm. At this point, when a distance between the lines is indicated as d, an appropriate distance d can be obtained as follows, whereas vacuum permittivity $\epsilon$o is assumed to be 8.854×10$^{-14}$ F/cm and relative permittivity $\epsilon$N of an encapsulating resin is assumed to be 4.2, and a distance d for attaining a capacitance C exceeding 0.1 $\mu$F is to be obtained through the following calculation:

$$d = \varepsilon \cdot S / C$$
$$= 8.854 \times 10^{-14} \times 4.2 \times 20 \times 10^{-3} / 1 \times 10^{-1}$$
$$= 7.4 \quad (\mu m)$$

Specifically, in order to obtain the capacitance C exceeding 0.1 $\mu$F, the power line 212 and the ground line 213 are required to oppose each other with a distance smaller than 7.4 $\mu$m. In this manner, a distance d for attaining a desired capacitance C can be set.

Figure 21A:
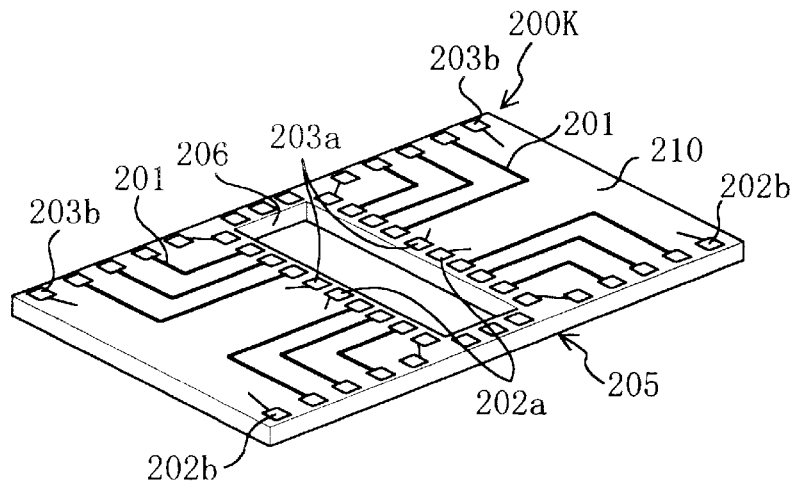
FIGS. 21(a) through 21(c) are perspective views for showing procedures for stacking a wiring body and a semiconductor chip in a ninth modification.
Figure 21B:
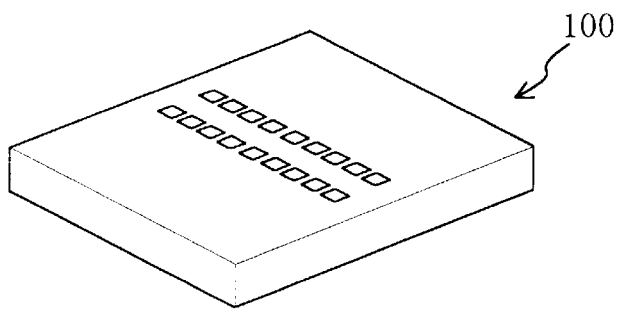
Figure 21C:
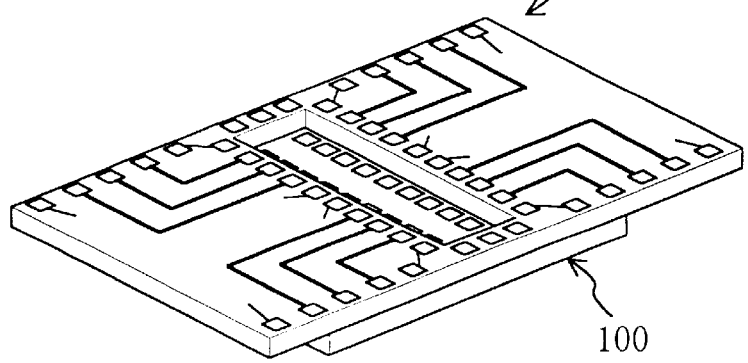

(9) Modification 9:

FIGS. 21(a) through 21(c) are perspective views for showing procedures for stacking a wiring body 200K of a ninth modification and a semiconductor chip 100. FIG. 21(a) is a perspective view of the wiring body 200K of this modification. The wiring body 200K has a rectangular opening 206 at the center thereof, and includes a substantially rectangular insulating supporting substrate 205 and lines formed thereon. As is shown in FIG. 21(a), on a first surface 210 of the insulating supporting substrate 205, a large number of lines, namely, signal lines 201, extending from the vicinity of the sides of the insulating supporting substrate 205 to the vicinity of the opening 206 are formed, and each of the signal lines 201 is provided with pads for wire bonding at the both ends. Also, in the vicinity of the sides of the insulating supporting substrate 205 and the opening 206, pads 202a and 202b of a power line and pad 203a and 203b of a ground line are formed. Although not shown in the drawings, on a second surface 220, the power line and the ground line each occupying substantially a half area of the second surface 220 are formed. The power line and the ground line on the second surface 220 are respectively electrically connected with the pads 202a, 202b, 203a and 203b formed on the first surface 210 through a conductive material formed in through holes. As a characteristic of the wiring body 200K of this modification, neither a power line nor a ground line is formed on the first surface 210.

After mounting the wiring body 200K on the semiconductor chip 100 of FIG. 21(b) so as to attain the state as is shown in FIG. 21(c)), the bonding pads on the semiconductor chip 100 and leads are electrically connected with the pads of the respective lines of the wiring body 200K in the same manner as described in the aforementioned embodiments, and the resultant is encapsulated with a resin and the leads are cut off in the same manner as described in the embodiments. Thus, a semiconductor device can be completed.

Also by adopting the wiring body 200K having the aforementioned structure, similarly to the aforementioned embodiments, the resultant semiconductor device can attain high noise resistance, a high operation speed and a good impedance matching performance. In particular, the wiring body 200K of this modification does not include a power line and a ground line having a large width on the first surface 210, and hence, the variety of possible patterns of the signal lines 201 on the first surface 210 can be advantageously increased.

Figure 22A:
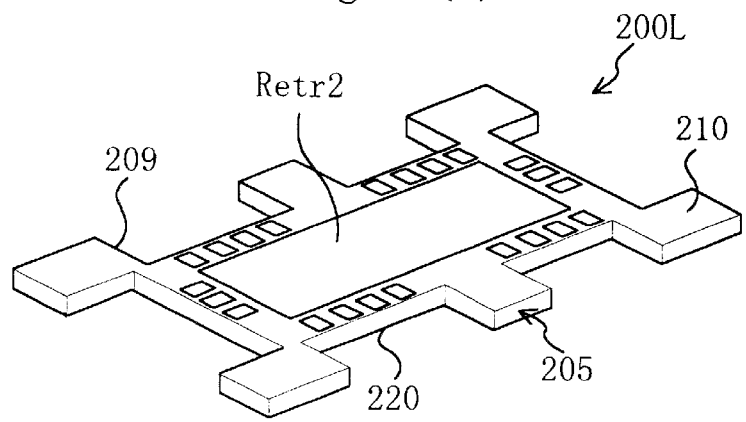
FIGS. 22(a) through 22(c) are perspective views for showing procedures for stacking a wiring body and a semiconductor chip in a tenth modification.
Figure 22B:
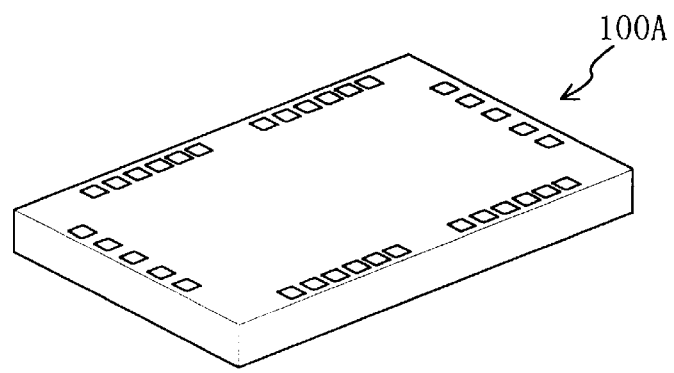
Figure 22C:
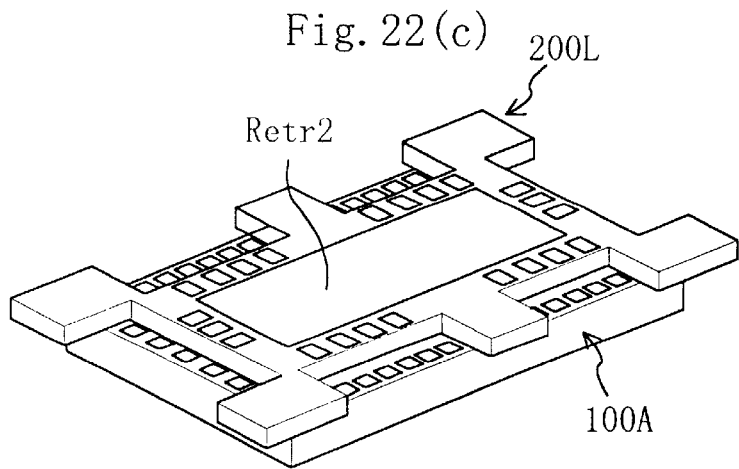

(10) Modification 10:

FIGS. 22(a) through 22(c) are perspective views for showing procedures for stacking a wiring body 200L of a tenth modification and a semiconductor chip 100A. FIG. 22(a) is a perspective view of the wiring body 200L of this modification. An insulating supporting substrate 205 of the wiring body 200L has basically a rectangular shape but is provided with a large number of notches 209 at its periphery. Furthermore, the center of a first surface 210 of the wiring body 200L works as an area Retr2 for a second semiconductor chip, where a semiconductor chip or another type of electronic element other than the semiconductor chip 100A of FIG. 22(b) can be mounted. In the wiring body 200L of this modification, the detailed structure of respective lines is not shown.

After mounting the wiring body 200L on the semiconductor chip 101A of FIG. 22(b) so as to attain the state as is shown in FIG. 22(c), the bonding pads on the semiconductor chip and leads are electrically connected with the pads of respective lines on the wiring body in the same manner as described in the aforementioned embodiments, and the resultant is encapsulated with a resin and the leads are cut off in the same manner as described in the embodiments. Thus, a semiconductor device can be completed.

Also by adopting the structure of the wiring body 200L of this modification, similarly to the aforementioned embodiments, the resultant semiconductor device can attain high noise resistance, a high operation speed and a good impedance matching performance. In particular, this modification is advantageous in using a semiconductor chip with a large area. In such a case, the areas for the lines and the pads and the pattern can be variously freely designed, and a semiconductor chip can be advantageously mounted on any or both of the first surface 210 and the second surface 220 of the wiring body 200L. Also, when one insulating supporting substrate 205 is provided with the notches 209 as those of this modification as well as the opening 206 as that of any of the wiring bodies 200A through 200K described in the aforementioned embodiments and modifications, the variety of possible line patterns can be further increased.

Figure 23A:
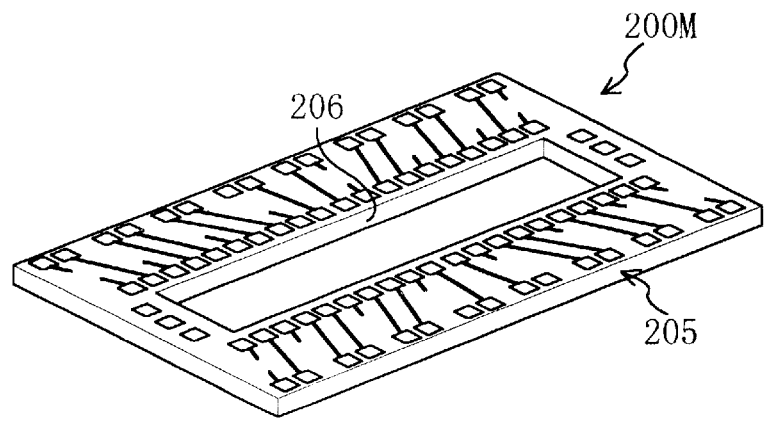
FIGS. 23(a) through 23(c) are perspective views for showing procedures for stacking a wiring body and a semiconductor chip in an eleventh modification.
Figure 23B:
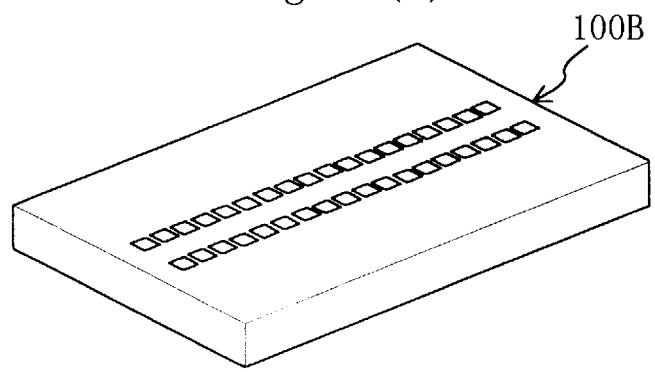
Figure 23C:
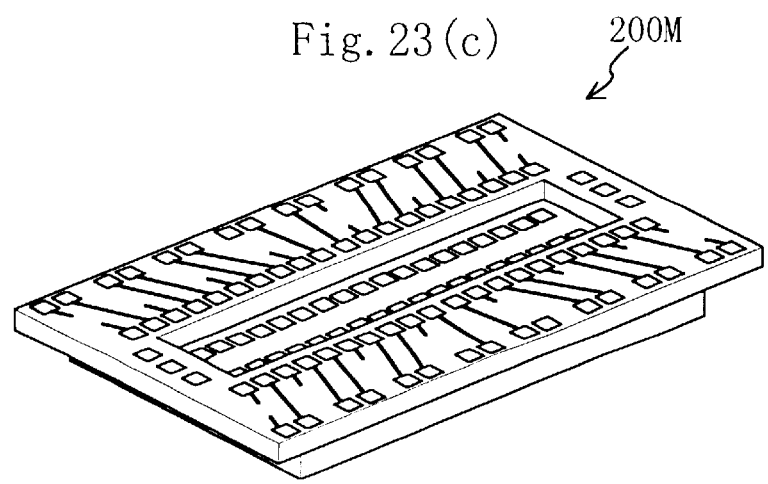

(11) Modification 11:

FIGS. 23(a) through 23(c) are perspective views for showing procedures for stacking a wiring body 200M of an eleventh modification and a semiconductor chip 100B. FIG. 23(a) is a perspective view of the wiring body 200M of this modification. The wiring body 200M has substantially the same structure as the wiring body 200K shown in FIG. 21(a) except that the longer sides of an opening 206 are parallel to the longer sides of an insulating supporting substrate 205. Accordingly, detailed description of the lines and the like is herein omitted.

After mounting the wiring body 200M on the semiconductor chip 100B of FIG. 23(b) so as to attain the state as is shown in FIG. 23(c), the bonding pads on the semiconductor chip and leads are electrically connected with the pads of respective lines on the wiring body in the same manner as described in the aforementioned embodiments, and the resultant is encapsulated with a resin and the leads are cut off in the same manner as described in the embodiments. Thus, a semiconductor device can be completed.

Also by adopting the structure of the wiring body 200M of this modification, similarly to the aforementioned embodiments, the resultant semiconductor device can attain high noise resistance, a high operation speed and a good impedancematching performance.

Embodiment 5

A semiconductor device according to a fifth embodiment, which includes a second wiring body 250 stacked on one of the wiring bodies 200A through 200M of the aforementioned embodiments and modifications, will now be described.

Figure 24A:
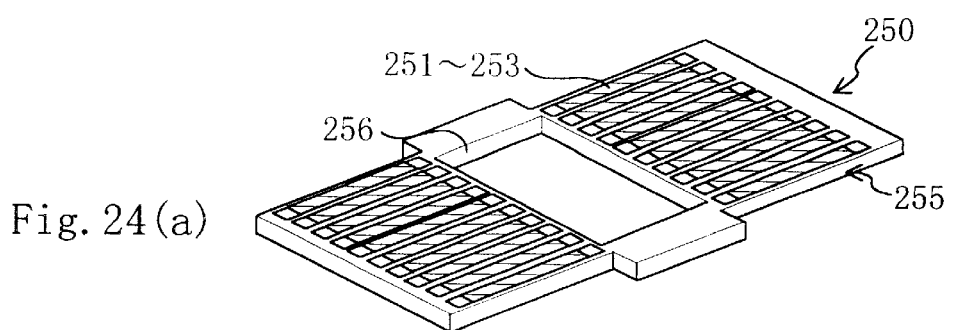
FIGS. 24(a) through 24(e) are perspective views for showing procedures for stacking two wiring bodies and a semiconductor chip in a fifth embodiment.

FIGS. 24(a) through 24(e) are perspective views for showing procedures for stacking the wiring body 250, one of the wiring bodies 200A through 200M, and a semiconductor chip 100. FIG. 24(a) is a perspective view of the second wiring body 250. The wiring body 250 has a rectangular opening 256 at the center thereof, and includes a substantially rectangular insulating supporting substrate 255 and signal lines 251, power lines 252 arid ground lines 253 formed by printing on the insulating supporting substrate 255. Each of the lines 251, 252 and 253 is provided with pads at the both ends.

Figure 24B:
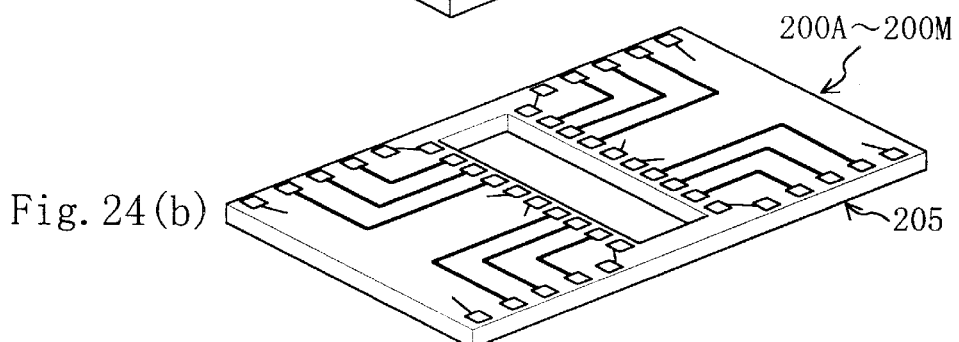
Figure 24C:
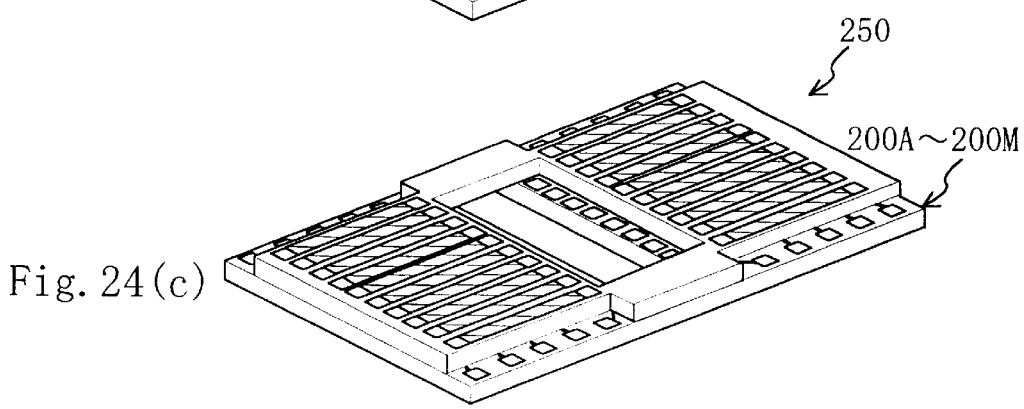

The second wiring body 250 is stacked on any of the wiring bodies 200A through 200M exemplified as is shown in FIG. 24(b), thereby forming a stacked wiring body as is shown in FIG. 24(c).

Figure 24D:
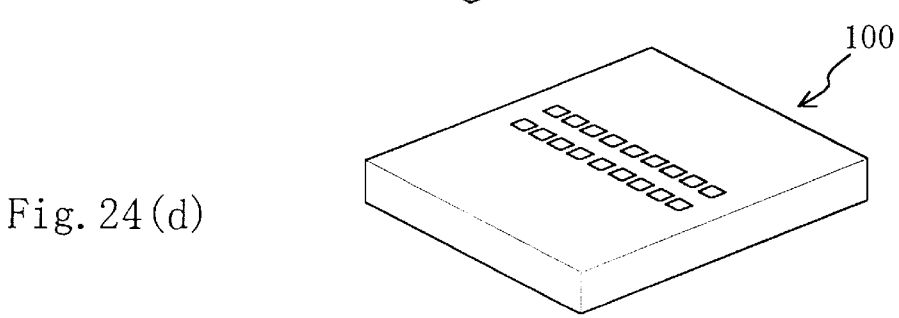
Figure 24E:
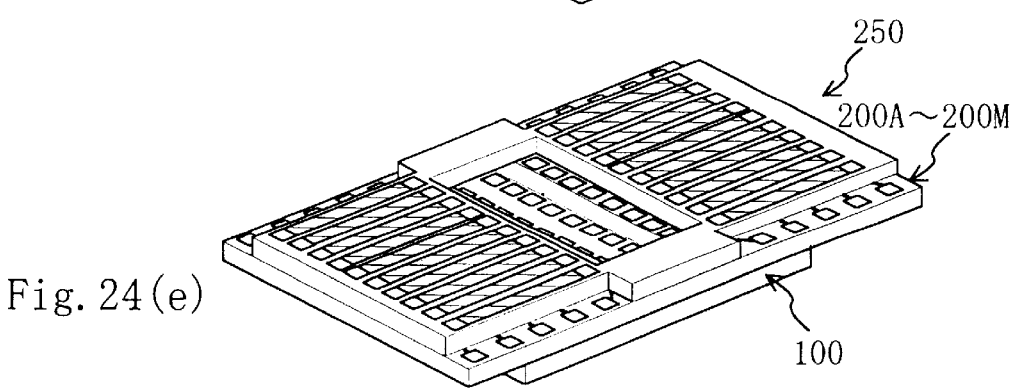

Furthermore, on the semiconductor chip 100 of FIG. 24(d), the stacked wiring body including one of the wiring bodies 200A through 200M and the second wiring body 250 is mounted as is shown in FIG. 24(e). Then, the bonding pads on the semiconductor chip 100 are connected with the pads of one of the wiring bodies 200A through 200M, and the pads of the two wiring bodies are connected with one another through metal lines or metal thin plates, and leads are electrically connected with the pads of the respective lines. Thereafter, the resultant is encapsulated with a resin and the leads are cut off in the same manner as described in the aforementioned embodiments. Thus, a semiconductor device can be completed.

The semiconductor device of this embodiment can attain, similarly to those of the aforementioned embodiments, high noise resistance, a high operation speed and a good impedance matching performance. In particular, by adopting the structure of this embodiment, signals can be sent to or received from a larger number of external equipment by using the lines 251, 252 and 253 formed on the second wiring body 250. As a result, the application of the semiconductor device can be expanded.

Embodiment 6

A semiconductor device according to a sixth embodiment will now be described with reference to FIGS. 25(a) through 25(d) and 26.

Figure 25:
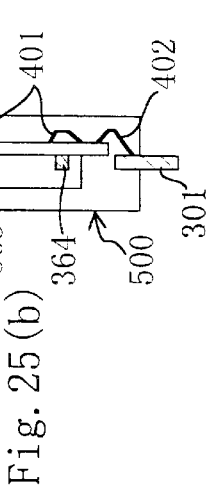
FIGS. 25(a) through 25(d) are a plan view of a semiconductor device according to a sixth embodiment taken on the side of a second surface, a cross sectional view thereof taken on line XXVb—XXVb, a plan view thereof taken on the side of a first surface, and a cross sectional view thereof taken on line XXVd—XXVd, respectively.
Figure 25:
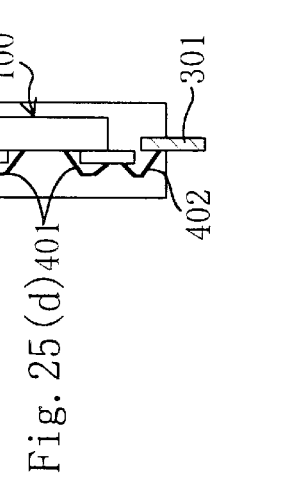
Figure 25:
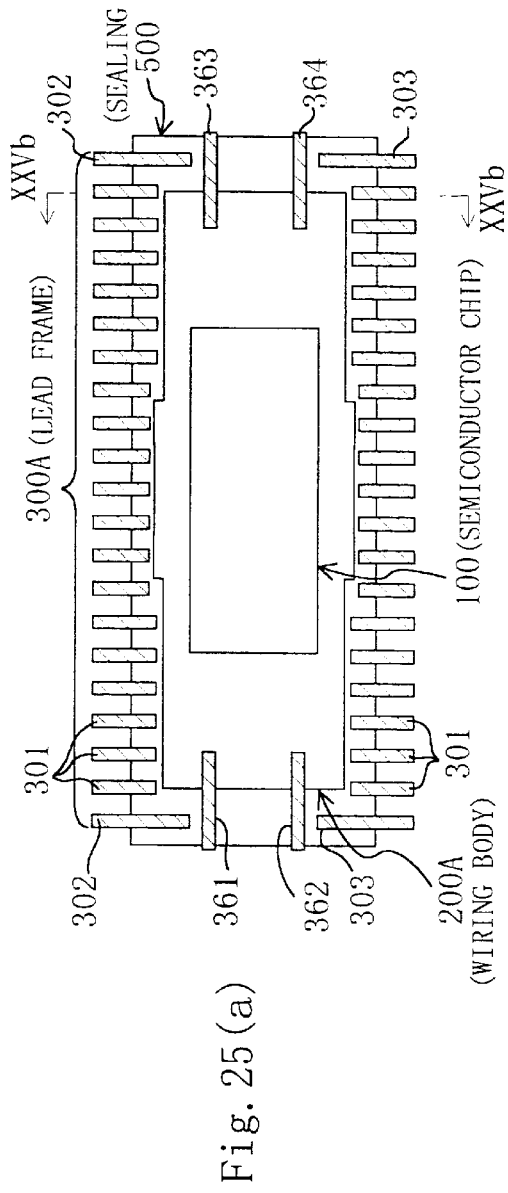
Figure 25:
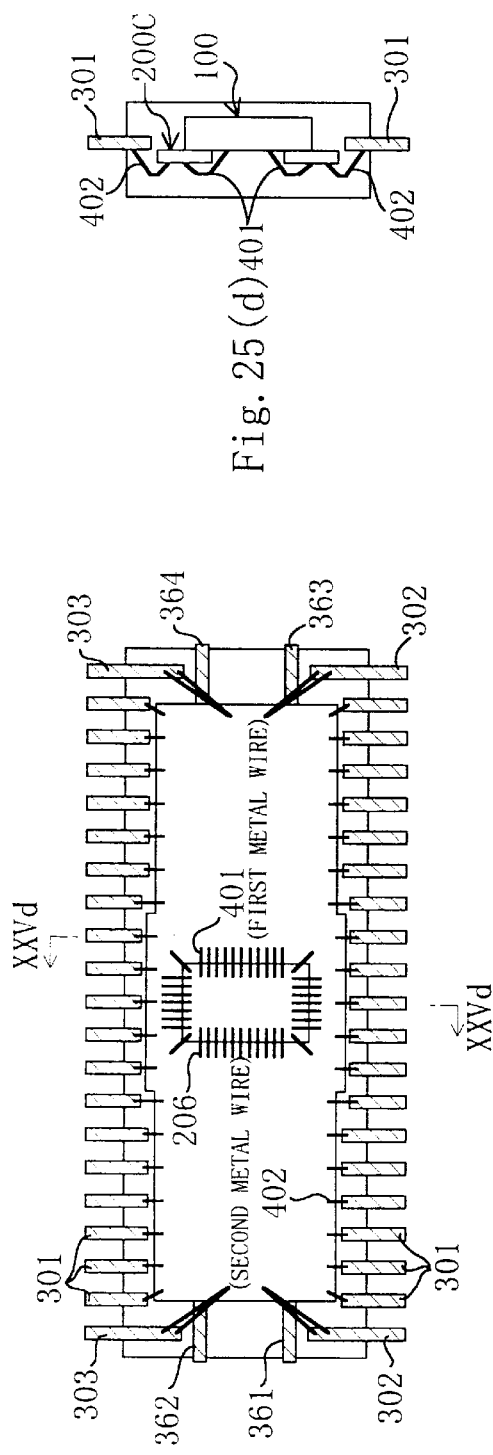

FIGS. 25(a) through 25(d) show the structure of the semiconductor device of the sixth embodiment, wherein FIGS. 25(a) is a plan view thereof taken on the side of a second surface of a semiconductor chip and the like, FIG. 25(b) is a cross sectional view thereof taken on line XXVb—XXVb of FIG. 25(a), FIG. 25(c) is a plan view thereof taken on the side of a first surface of the semiconductor chip and the like, and FIG. 25(d) is a cross sectional view thereof taken on line XXVd—XXVd of FIG. 25(c).

As is shown in FIGS. 25(a) through 25(d), the semiconductor device of this embodiment has a basic structure substantially the same as that of the semiconductor device of the first embodiment but includes the wiring body 200C of FIGS. 14(a) and 14(b), whereas the wiring body 200C can be replaced with any of the wiring bodies 200A, 200B and 200D through 200K. As a characteristic of this embodiment, the semiconductor device is provided with four line fixing leads 361 through 364 for supporting and fixing the insulating supporting substrate 205 at its shorter sides. The line fixing leads 361 through 364 are connected with the ground line 213 formed on the second surface 220 of the wiring body 200C by soldering, brazing, welding, or using a conductive adhesive, or they can be fixed with an insulating adhesive.

Power leads 302 and ground leads 303 are disposed adjacent to and on the outermost sides of signal leads 301 aligned in parallel to cone another along the two longer sides of the wiring body 200C. The power leads 302 and the ground leads 303 each in pair are respectively connected with pads of the power lines and the ground lines formed on the first surface 210 of the wiring body 200C through second metal lines 402.

Also in this embodiment, the semiconductor chip 100 and the wiring body 200C are stacked in the same manner as described in the first embodiment as is shown in FIGS. 3(a) through 3(c).

Figure 26:
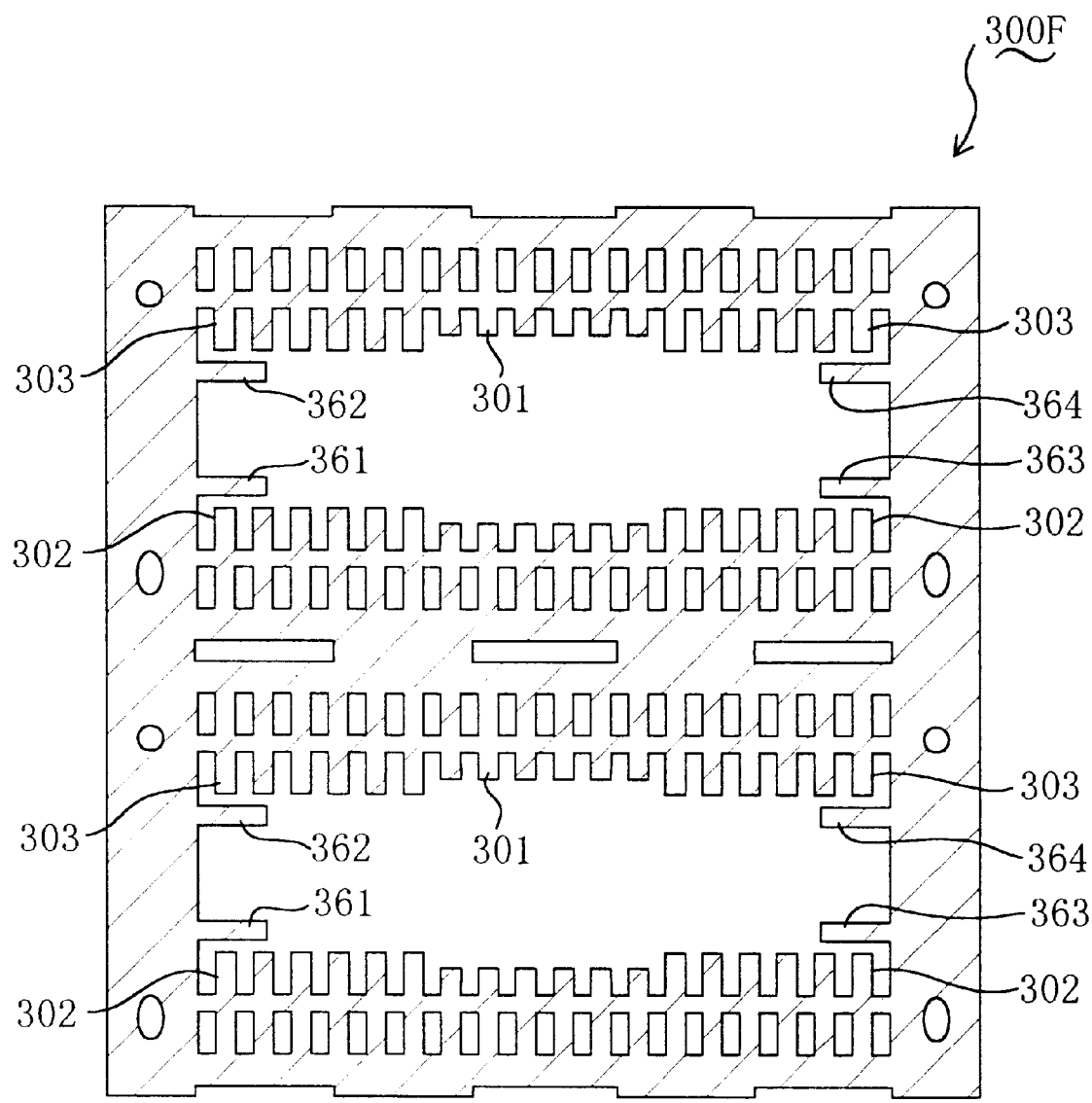
FIG. 26 is a plan view of a lead frame of the sixth embodiment.

FIG. 26 is a plan view of a lead frame 300F used in this embodiment, wherein merely two chip areas are shown but the lead frame cain includes a large number of chip areas continuously formed in the longitudinal direction in the drawing.

According to this embodiment, similarly to the first embodiment, the resultant semiconductor device can attain high noise resistance, a high operation speed and a good impedance matching performance.

In addition, since the semiconductor device is provided with the line fixing leads 361 through 364 each in pair for supporting and fixing the wiring body 200C at its shorter sides, the wiring body 200C can be more stably and rigidly supported in assembling the semiconductor device, resulting in easing the manufacture. Moreover, the semiconductor device of this embodiment has the so-called DIP structure in which all the lead terminals protrude from the two longer sides of the semiconductor device after the resin encapsulation (with the line fixing leads 361 through 364 cut off in the vicinity of the surface of an encapsulating resin 500). Therefore, an automated assembling procedure for mounting on a print substrate and the like can be very smoothly conducted.

In this embodiment, the lines and the leads can be connected through any of the following in stead of soldering: brazing by using metal solder having a high melting point; resistance welding in which a lead and a pad are connected with a current allowed to flow therebetween by using Joule heat, with the leads and the pads plated with Au; welding such as laser welding; and adhesion by using a conductive adhesive. Also, the metal lines can be replaced with metal thin plates.

In some of the aforementioned embodiments, the lead frame is provided with the line fixing leads or the line fixing bars, which are not necessarily provided. In other words, when any means for supporting and fixing the wiring body in an assembler or the like is provided in connecting the leads of the lead frame with the wiring body stacked on the semiconductor chip, the assembly cain be smoothly conducted.

In this embodiment and any of the aforementioned embodiments, the line fixing leads or the line fixing bars can support the wiring body at its first surface or its second surface. This also applies to the case where the ground leads and the power leads or the signal leads are used as the line fixing leads or the line fixing bars.

Furthermore, the power lines and the ground lines are not necessarily formed on the outside of the signal lines. In other words, the power lines and the ground lines can be disposed among a large number of signal lines. Also, in adopting the DIP structure, the power leads and the ground leads are not necessarily formed at the outermost positions.

Embodiment 7

A semiconductor device according to a seventh embodiment including a ferroelectric chip disposed over a power line and a ground line will now be described.

Figure 27C:
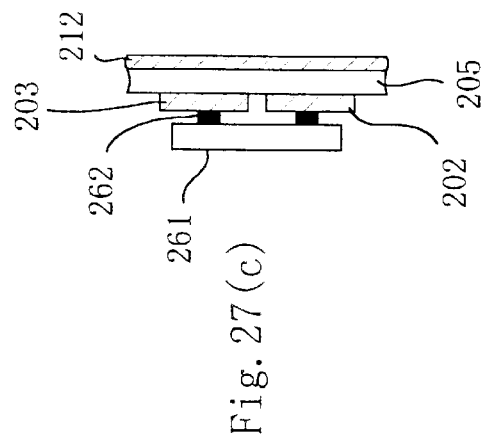
FIGS. 27(a) through 27(c) are a plan view of a wiring body according to a seventh embodiment taken on the side of a first surface, a plan view thereof taken on the side of a second surface, and a partially enlarged cross sectional view of an area for a ferroelectric chip therein, respectively.
Figure 27A:
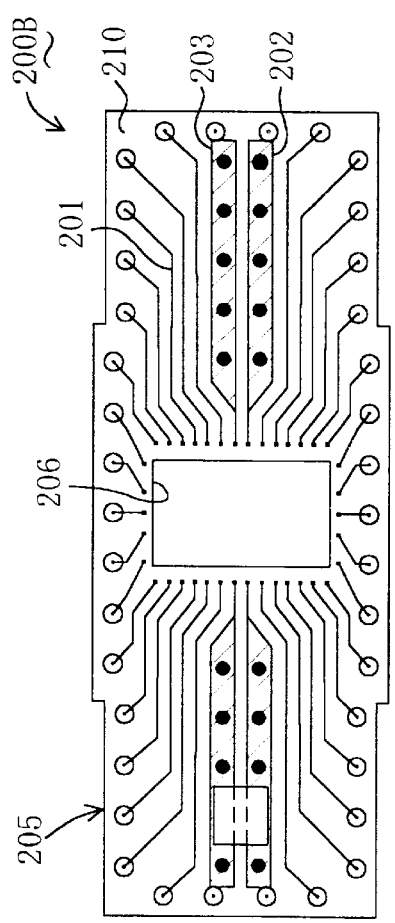
Figure 27B:
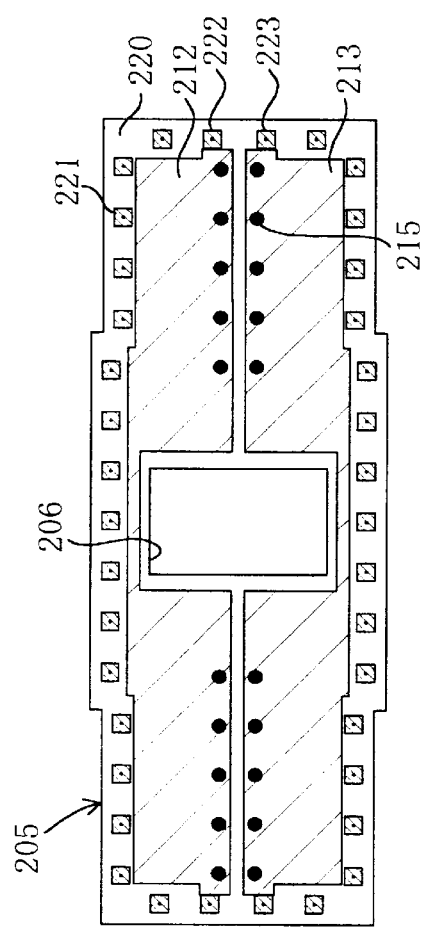

FIGS. 27(a) through 27(c) are a plan view of the semiconductor device of this embodiment taken on the side of a first surface of a wiring body, a plan view thereof taken on the side of a second surface, and an enlarged partial cross sectional view of an area for mounting a ferroelectric chip therein, respectively.

In this embodiment, a ferroelectric chip 261 is disposed over a power line 202 and a ground line 203 on the first surface 210 of the wiring body 200B of the fourth embodiment. The ferroelectric chip 261 is connected with the power line 202 and the ground line 203 through bumps 262. In other words, from a point of view as an electric circuit, a capacitor is interposed between the power line 202 and the ground line 203.

Since the ferroelectric chip 261 is thus provided over the power line 202 and the ground line 203 in this embodiment, power noise can be easily removed without externally providing a path capacitor to the semiconductor device. As a result, the semiconductor device can easily attain a good performance with small noise.

As a ferroelectric material for the ferroelectric chip 261 of this embodiment, PZT, barium titanate or the like can be used.

Furthermore, the ferroelectric chip 261 of this embodiment can be provided not only to the wiring body 200B of the fourth embodiment but also to any of the wiring bodies of the aforementioned embodiments at a portion where the power line and the ground line are close to each other. In such a case, the ferroelectric chip can be disposed on the second surface as well as on the first surface.

Embodiment 8

A semiconductor device according to an eighth embodiment including a chip capacitor over a power line and a ground line will now be described.

FIGS. 28(a) through 28(c) are a plan view of the semiconductor (device of this embodiment taken on the side of a first surface of a wiring body, a plan view thereof taken on the side of a second surface, and an enlarged cross sectional view of an area for mounting a chip capacitor therein, respectively.

In this embodiment, a chip capacitor 265 is disposed over a power line 202 and a ground line 203 on the first surface 210 of the wiring body 200B of the fourth embodiment. The chip capacitor 265 is connected with the power line 202 and the ground line 203 through calcined silver paste 266. In other words, from a point of view as an electric circuit, a capacitor is interposed between the power line 202 and the ground line 203 similarly to the seventh embodiment.

Also in this embodiment, similarly to the seventh embodiment, since the chip capacitor 265 is disposed over the power line 202 and the ground line 203, power noise can be easily removed without externally providing a path capacitor to the semiconductor device. As a result, the semiconductor device can easily attain a good performance with small noise.

The chip capacitor 265 of this embodiment can be provided not only to the wiring body 200B of the fourth embodiment but also to any of the wiring bodies of the aforementioned embodiments at a portion where the power line and the ground line are closes to each other. In such a case, the chip capacitor can be disposed on the second surface as well as on the first surface.

Embodiment 9

Figure 29:
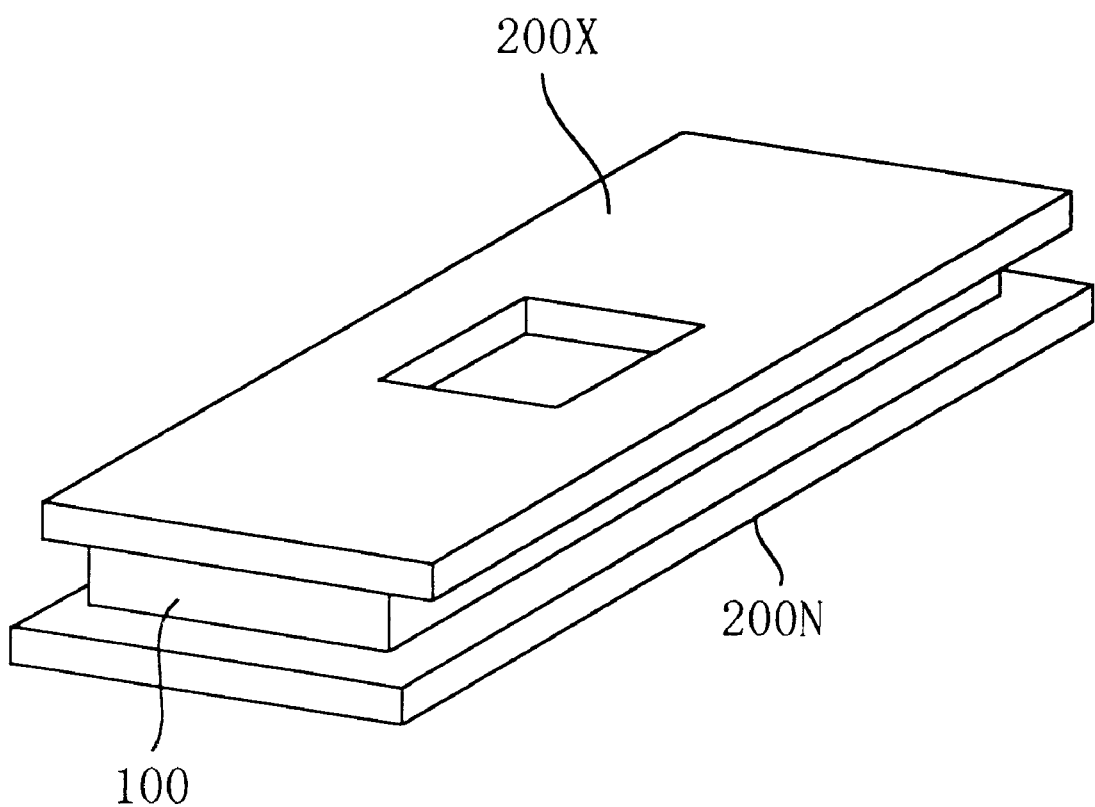
FIG. 29 is a schematic perspective view for showing the structure of a semiconductor device according to a ninth embodiment.

In a ninth embodiment, a semiconductor device including a wiring body in which a power line or a ground line is formed all over its Surfaces will be exemplified. FIG. 29 is a schematic perspective view of the semiconductor device of this embodiment, whereas lines and leads are omitted.

As is shown in FIG. 29, as a characteristic of the semiconductor device of this embodiment, a first wiring body 200X substantially the same as any of the wiring bodies described in the aforementioned embodiments is mounted on a first surface of a semiconductor chip 100, and a second wiring body 200N in which a power line or a ground line is formed substantially the entire areas of its both surfaces is mounted on a second surface of the semiconductor chip 100. The first wiring body 200X and the second wiring body 200N can include lines in various manners as described as follows:

As a first case, a power line is formed on substantially the entire area of one surface of the second wiring body 200N and a ground line is formed on substantially the entire area of another surface of the second wiring body 200N. In this case, the first wiring body 200X includes at least a signal line. However, the first wiring body 200X can additionally include a power line and a ground line as described in the aforementioned embodiments.

As a second case, a power line is formed on substantially the entire areas of the both surfaces of the second wiring body 200N. In this case, the first wiring body 200X includes at least a ground line and a signal line. However, the first wiring body 200X can additionally include a power line.

As a third case, a ground line is formed on substantially the entire areas of the both surfaces of the second wiring body 200N. In this case, the first wiring body 200X includes at least a power line and a signal line. However, the first wiring body 200X can additionally include a ground line.

According to this embodiment, the semiconductor device of any of the aforementioned embodiments can further include the second wiring body 200N including a ground line and/or a power line having a large area. Therefore, the ground line and the power line cart be more stabilized, resulting in obtaining a high frequency semiconductor device with little voltage variation. Furthermore, when the ground line or the power line having a large area is substantially entirely formed on both surfaces of the second wiring body 200N, currents flow in parallel from the both surfaces, and hence, an electric resistance value of the ground line or the power line can be decreased.

Embodiment 10

Figure 30:
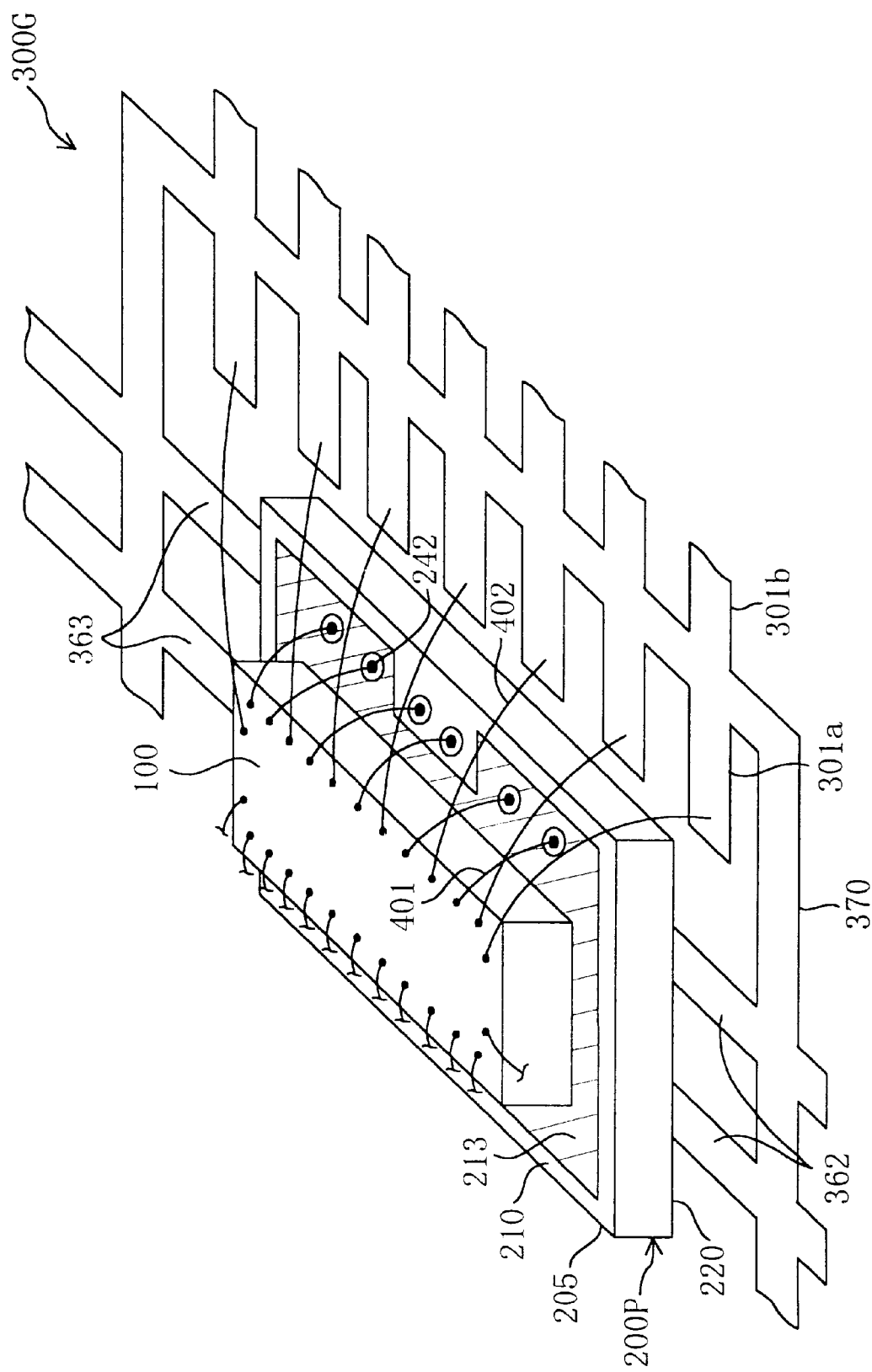
FIG. 30 is a schematic perspective view for showing the structure of a semiconductor device according to a tenth embodiment.

In a tenth embodiment, a high frequency semiconductor device including a general lead frame and a wiring body in which a power line or a ground line is formed on the entire areas of both surfaces will be exemplified. FIG. 30 is a schematic perspective view of the semiconductor device of this embodiment, whereas a part of lines and leads are omitted. Also, FIG. 3C shows the structure of the semiconductor device obtained before the resin encapsulation.

The semiconductor device of this embodiment includes, as is shown in FIG. 30, a wiring body 200P in which a ground line 213 is formed on substantially the entire area of a first surface 210 of an insulating supporting substrate 205 and a power line (not shown) is formed on substantially the entire area of a second surface 220; a semiconductor chip 100 mounted on the first surface 210 of the wiring body 200P; and a lead frame 300G for attaining signal bonding between bonding pads on the semiconductor chip 100 and lines on the wiring body 200P. The bonding pads on the semiconductor chip 100 are connected with the ground line 213 of the wiring body 200P and with power terminals 242 formed on the first surface 210 connected with the power line, on the second surface of the wiring body 200P through first metal lines 401. The lead frame 300G includes signal inner leads 301a, outer leads 301b continuous with the signal inner leads 301a, line fixing leads 362 connected with the power line on the second surface 220 of the wiring body 200P, line fixing leads 363 connected with ground terminals (not shown) formed on the second surface 220 connected with the ground line 213 of the wiring body 200P, and dam bars 370 for connecting the respective leads. The line fixing leads 362 not only support the wiring body 200P but also connect an external power line with the power line in the semiconductor device, and the line fixing leads 363 not only support the wiring body 200P but also connect an external ground line with the ground line in the semiconductor device. The bonding pads on the semiconductor hip 100 are connected with the signal inner leads 301*a* through second metal lines 402.

The semiconductor device of this embodiment has a general lead frame structure including the inner leads 301*a*. However, since the semiconductor device includes the wiring body 200P in which the ground line 213 is formed on substantially the entire area of one surface and the power line is formed on substantially the entire area of another surface, with the semiconductor chip 100 mounted on the wiring body 200P, the semiconductor device can achieve stable power line and ground line with little voltage variation. In a conventional semiconductor device, a member for supporting the semiconductor device is not the insulating supporting substrate 205 as in this embodiment but a lead frame, that is, a conductor. Therefore, it is impossible to provide the power line and the ground line on the respective surfaces. In contrast, such a structure can be realized in this embodiment owing to the characteristic of the wiring body 200P.

In this embodiment, the ground line alone or the power line alone can be formed on both the first surface 210 and the second surface 220 of the wiring body 200P. In such a case, an electric resistance value of the ground line or the power line can be decreased.

Embodiment 11

In an eleventh embodiment, a semiconductor device including a wiring body having an opposing area with a small width between a ground line and a power line formed on its first surface will be exemplified.

Figure 31A:
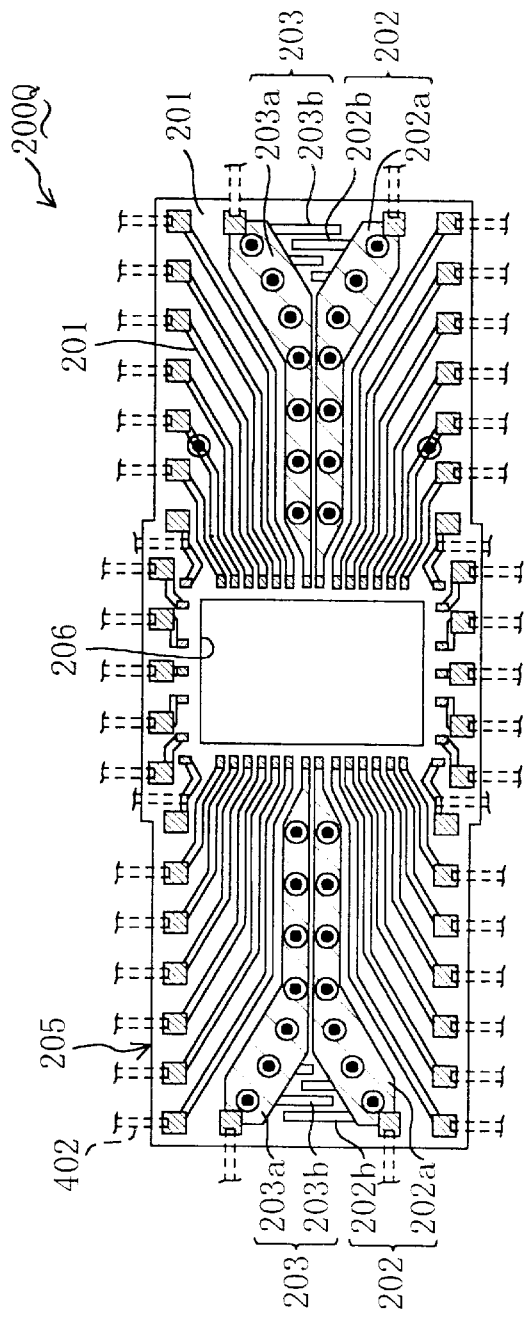
FIGS. 31(a) and 31(b) are plan views of a wiring body according to an eleventh embodiment taken on the side of a first surface and on the side of a second surface, respectively.
Figure 31B:
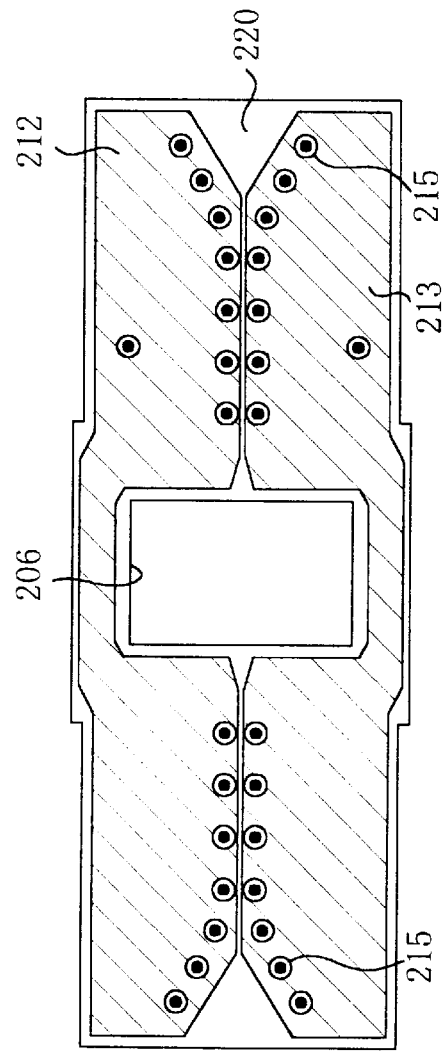

FIGS. 31(*a*) and 31(*b*) are plan views of the semiconductor device of this embodiment taken on the side of a first surface 210 of an insulating supporting substrate 205 of a wiring body 200Q and on the side of a second surface 220 thereof, respectively. As is shown in FIG. 31(*a*), on the first surface 210 of the insulating supporting substrate 205 of the wiring body 200Q, narrow signal lines 201 extending from the vicinity of the outer edges to the vicinity of an opening 206, wide power lines 202 and wide ground lines 203 extending adjacent to the power lines 202 are formed by printing. Also, as is shown in FIG. 31(*b*), on the second surface 220 of the insulating supporting substrate 205, a power line 212 and a ground line 213 are formed so as to substantially share the entire area of the second surface 220. The power line 212 and the ground line 213 formed on the second surface 220 are electrically connected with the power lines 202 and the ground lines 203 formed on the first surface 210 through a conductive material formed in through holes, respectively.

As a characteristic of the wiring body 200Q of this embodiment, on the first surface of the insulating supporting substrate 205, belt-shaped portions 202*a* and 203*a* of the power line 202 and the ground line 203 are not entirely parallel to each other from the center to the edge but separated from each other in the vertical direction in the vicinity of the edge as is shown in FIG. 31(*a*). Furthermore, the separated belt-shaped portions 202*a* and 203*a* are provided with line-shaped portions 202*b* and 203*b* extending upward and downward, respectively. The line-shaped portions 202*b* and 203*b* are formed to be mutually sandwiched, so that the power line 202 and the ground line 203 can oppose with a narrow zigzag opposing area sandwiched therebetween. As a result, the opposing area therebetween can be enlarged in its length.

In the wiring body 200Q of this embodiment, since the length of the narrow opposing area between the power line 202 and the ground line 203 formed on the first surface 210 of the wiring body 200Q is increased, the same effect as that attained by the wiring body 200J shown in FIG. 20 of the eighth modification of the wiring body can be exhibited. Specifically, the capacitance of a capacitor formed by the two lines 202 and 203 can be adjusted in a wide range, for example, can be increased, by forming various patterns, and hence, noise can be remarkably removed.

The wiring body 200Q of this embodiment can be used together with any of the lead frames 300A, 300B, 300C, 300D and 300E respectively shown in FIGS. 4, 6, 8, 10 and 12.

Embodiment 12

In a twelfth embodiment, a semiconductor device including a wiring body having a lined waveguide path for improving a transmitting characteristic of a high frequency signal will be exemplified.

Figure 32A:
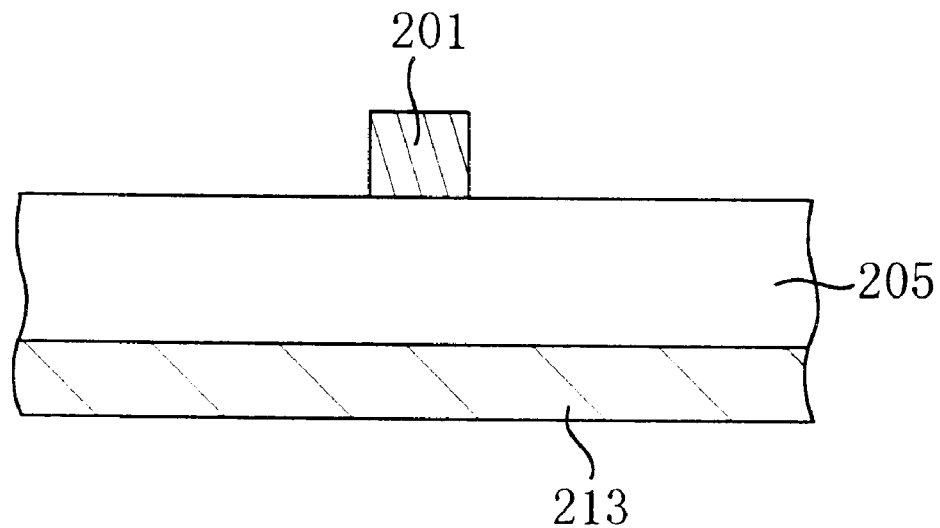
FIGS. 32(a) and 32(b) are partial cross sectional views of a microstrip line and a coplanar line according to a twelfth embodiment, respectively.
Figure 32B:
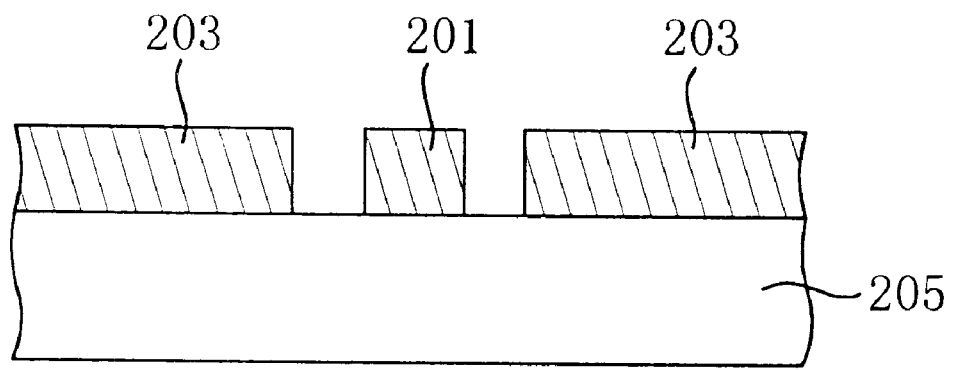

FIG. 32(*a*) is a cross sectional view for showing the structure of a microstrip line which can be formed in a part of any of the wiring bodies according to the aforementioned embodiments specifically, a microstrip line consisting of a ground line 213 on a back surface, a signal line 201 and an insulating supporting substrate 205 of a dielectric film can be formed by appropriately adjusting relative permittivity and a thickness of the insulating supporting substrate 205 and the width and the thickness of the signal line 201.

Also, FIG. 32(*b*) is a cross sectional view for showing the structure of a coplanar line which can be formed in a part of any wiring body. Specifically, a coplanar line using the underlying insulating supporting substrate 205 as a dielectric film can be formed by providing a signal line 201 and a pair of ground lines 203 sandwiching the signal line 201 on one surface of the insulating supporting substrate 205.

Embodiment 13

In a thirteenth embodiment, a semiconductor device in which a semiconductor chip and a wiring body are connected by using a bump will be described with reference to FIGS. 37(*a*) through 37(*d*), 38(*a*) and 38(*b*).

FIGS. 37(*a*) through 37(*d*) show the structure of the semiconductor device of the thirteenth embodiment, wherein FIG. 37(*a*) is a plan view taken on the side of a second surface of a semiconductor chip and the like, FIG. 37(*b*) is a cross sectional view thereof taken on line XXXVIIb—XXXVIIb of FIG. 37(*a*), FIG. 37(*c*) is a plan view thereof taken on the side of a first surface of the semiconductor chip and the like, and FIG. 37(*d*) is a cross sectional view thereof taken on line XXXVIId—XXXVIId of FIG. 37(*c*).

As is shown in FIGS. 37(*a*) through 37(*d*), the semiconductor device of this embodiment has a basic structure substantially the same as that of the semiconductor device shown in FIGS. 1(*a*) through 1(*d*). However, the semiconductor device of this embodiment does not include the first metal lines for connecting the lines of a wiring body 200R with the bonding pads of the semiconductor chip 100. Specifically, as a characteristic of this embodiment, the lines of the wiring body 200R and the bonding pads of the semiconductor chip 100 are connected through bumps 405 such as a solder bump.

FIGS. 38(*a*) and 38(*b*) are plan views of the wiring body 200R taken on the side of the first surface 210 of an insulating supporting substrate 205 and on the side of the second surface 220, respectively. As is shown in FIG. 38(a), on the first surface 210 of the insulating supporting substrate 205 of the wiring body 200R, a large number of lines extending from the vicinity of the outer edges to the vicinity of an opening 206, namely, narrow signal lines 201, wide power lines 202, wide ground lines 203 and the like, are formed by printing. This structure is the same as that of the wiring body 200A used in the first through third embodiments. However, in the wiring body 200R of this embodiment, inside pads of the lines 201, 202 and 203 are not provided on the first surface 210 as is shown in FIGS. 38(a) and 38(b). Also, neither a power line nor a ground line having a large width is formed on the second surface 220. On the second surface 220 of the insulating supporting substrate 205, signal line pads 225, power line pads 226 and ground line pads 227 are formed so as to be respectively connected with the signal lines 201, the power lines 202 and the ground lines 203 through a conductive mate(rial formed in through holes. Furthermore, in the vicinity of the edges of the shorter sides on the second surface 220 of the wiring body 200R, outside power line pads 222 and outside ground lines pads 223 are formed to be respectively connected with power leads 302 and ground leads 303. The power line pads 222 and the ground line pads 223 are respectively connected with the power lines 202 and the ground lines 203 formed on the first surface 210 through a conductive material formed in through holes.

In this embodiment, the semiconductor chip 100 and the wiring body 200R are stacked in a different manner from those in the aforementioned embodiments by the so-called flip-chip method. Specifically, the bumps are interposed between signal bonding pads on the semiconductor chip 100 (namely, members shown with a reference numeral 101 in FIG. 3(b)) and the signal line pads 225 of the wiring body 200R, between power bonding pads of the semiconductor chip (namely, members shown with a reference numeral 102 in FIG. 3(b)) and the power line pads 226 of the wiring body 200R, and between ground bonding pads of the semiconductor chip 100 (namely, members shown with a reference numeral 103 in FIG. 3(b)) and the ground line pads 227 of the wiring body 200R, and the semiconductor chip 100 and the wiring body 200R are mechanically adhered to each other with an adhesive or the like.

When the lead frame as is shown in FIG. 4 is used in this embodiment, the signal leads 301 are connected with pads formed at the cuter ends of the respective lines of the wiring body 200R through second metal lines 402. Also, the power leads 302 and the ground leads 303 are respectively connected with the power line pads 222 and the ground line pads 223 formed on the second surface 220 of the wiring body 200R by soldering, brazing, welding, using a conductive adhesive or the like.

Furthermore, after encapsulating the semiconductor chip 100, the wiring body 200R and the tips of the leads (inner leads) of the Lead frame with an encapsulating resin, the dam bars and the outer leads of the lead frame are cut off. Thus, the semiconductor device having the structure as is shown in FIGS. 37(a) through 37(d) can be completed.

In this embodiment, since the wiring body 200R and the bonding pads on the semiconductor chip 100 are connected through the bumps instead of the first metal lines, the inductance at the bonding of the signal lines can be further decreased as compared with that in the aforementioned embodiments.

In this embodiment, the pads disposed on the second surface 220 of the wiring body 200R are connected with the bonding pads on the first surface of the semiconductor chip 100 through the bumps. In stead, the wiring body 200A as is shown in FIGS. 2(a) and 2(b) can be used, so that the pads disposed on the first surface 210 of the wiring body 200A can be connected with the bonding pads of the semiconductor chip through the bumps.

What is claimed is:

1. A semiconductor device comprising:
 a semiconductor chip having a first surface, a second surface and plural bonding pads on said first surface;
 a wiring body including a plate-shaped insulating supporting substrate and plural lines supported by said insulating supporting substrate, said wiring body being mounted on said first surface of said semiconductor chip;
 a bonding member for electrically connecting said bonding pads of said semiconductor chip with a part of each of said plural lines of said wiring body; and
 plural leads connected with another part of each of said plural lines of said wiring body,
 wherein said plural lines include a signal line, a power line and a ground line,
 said plural leads include a signal lead, a power lead and a ground lead, and
 said signal line is electrically connected with said signal lead, said power line is electrically connected with said power lead, and said ground line is electrically connected with said ground lead.

2. The semiconductor device of claim 1,
 wherein said insulating supporting substrate of said wiring body has a first surface and a second surface, with said second surface of said insulating supporting substrate in contact with said first surface of said semiconductor chip, and
 said part of said signal line, power line and ground line connected with said bonding pads are formed on said first surface of said insulating supporting substrate so as to be disposed in the vicinity of said bonding pads of said semiconductor chip.

3. The semiconductor device of claim 2,
 wherein a narrow signal line including said part of said signal line is formed on said first surface of said insulating supporting substrate, and
 a power line and a ground line, which are electrically connected with said part of said power line and ground line formed on said first surface, are formed on said second surface of said insulating supporting substrate so as to be separated from each other and together occupy substantially an entire area of said second surface.

4. The semiconductor device of claim 1,
 wherein said power line and said ground line are formed to oppose each other with a narrow opposing area sandwiched therebetween on at least one of said first surface and said second surface of said insulating supporting substrate.

5. The semiconductor device of claim 1,
 wherein said insulating supporting substrate includes a first substrate and a second substrate stacked on said first substrate,
 when an upper face of said second substrate, a lower face of said first substrate, and a lower face of said second substrate or an upper face of said first substrate are respectively designated as a first surface, a second surface and a third surface of said insulating supporting substrate, a narrow signal line including said part of said signal line, at least said part of said power line and at least said part of said ground line are formed on said first surface of said insulating supporting substrate, a ground line, which is electrically connected with said ground line formed on said first surface, is formed substantially entirely on one of said second surface and said third surface of said insulating supporting substrate, and a power line, which is electrically connected with said power line formed on said first surface, is formed substantially entirely on the other of said second surface and said third surface of said insulating supporting substrate.

6. The semiconductor device of claim 1, wherein said signal line is plural in number, and between at least two of said plural signal lines, a noise preventing line electrically connected with at least either said power line or said ground line formed on said second surface is formed.

7. The semiconductor device of claim 1, further comprising a ferroelectric chip disposed over said ground line and said power line.

8. The semiconductor device of claim 1, further comprising a chip capacitor disposed over said ground line and said power line.

9. The semiconductor device of claim 1, wherein a part of said wiring body is provided with a microstrip line consisting of said signal line, said insulating supporting substrate functioning as a dielectric film and said ground line.

10. The semiconductor device of claim 1, wherein a part of said wiring body is provided with a coplanar line consisting of said signal line, said insulating supporting substrate functioning as a dielectric film and said ground line.

11. The semiconductor device of claim 2, wherein a narrow signal line, a wide power line and a wide ground line respectively including said part of said signal line, power line and ground line are formed on said first surface of said insulating supporting substrate, and a power line and a ground line, which are electrically connected with said part of said power line and ground line formed on said first surface, are formed on said second surface of said insulating supporting substrate so as to be separated from each other and together occupy substantially an entire area of said second surface.

12. The semiconductor device of claim 2, wherein a narrow signal line and a wide power line respectively including said part of said signal line and power line are formed on said first surface of said insulating supporting substrate, and a ground line, which is electrically connected with said part of said ground line formed on said first surface of said insulating supporting substrate, is formed substantially entirely on said second surface of said insulating supporting substrate.

13. The semiconductor device of claim 2, wherein a narrow signal line and a wide ground line respectively including said part of said signal line and ground line are formed on said first surface of said insulating supporting substrate, and a power line, which is electrically connected with said part of said power line formed on said first surface of said insulating supporting substrate, is formed substantially entirely on said second surface of said insulating supporting substrate.

14. The semiconductor device of claim 2, wherein a narrow signal line, a wide power line and a wide ground line respectively including said part of said signal line, power line and ground line are formed on said first surface of said insulating supporting substrate, and no line is formed on said second surface of said insulating supporting substrate.

15. The semiconductor device of claim 2, wherein said signal lead, said power lead and said ground lead respectively stretch over said other part of said signal line, power line and ground line of said insulating supporting substrate, and said leads are connected with said other part of said lines by soldering, brazing, welding or using a conductive adhesive.

16. The semiconductor device of claim 2, wherein said signal lead is connected with said other part of said signal line of said insulating supporting substrate through one of a metal line, a bump and a metal thin plate.

17. The semiconductor device of claim 3, wherein said other part of said signal line, power line and ground line are formed on said second surface of said insulating supporting substrate, said signal lead, said power lead and said ground lead respectively stretch over said other part of said signal line, power line and ground line formed on said second surface of said insulating supporting substrate, and said leads are connected with said other part of said lines by soldering, brazing, welding or using a conductive adhesive.

18. The semiconductor device of claim 3, wherein said insulating supporting substrate is in the shape of a rectangular plate having a pair of longer sides and a pair of shorter sides in a plan view, said signal line and said signal lead are plural in number, said signal leads are aligned to be perpendicular to said longer sides of said insulating supporting substrate and parallel to one another with tips thereof disposed in the vicinity of said longer sides, and said power lead and said ground lead extend from said shorter sides of said insulating supporting substrate over said second surface of said insulating supporting substrate, so as to be respectively connected with said power line and said ground line formed on said second surface by soldering, brazing, welding or using a conductive adhesive.

19. The semiconductor device of claim 4, wherein at least a part of said opposing area is formed in a zigzag manner.

20. The semiconductor device of claim 18, wherein at least either said power lead or said ground lead is formed in a belt shape crossing over said second surface of said wiring body.

21. The semiconductor device of claim 18, wherein bottom portions of said power lead and said ground lead are aligned in parallel to said signal lead.

22. The semiconductor device of claim 21, wherein each of said power lead and said ground lead is provided with a cut portion formed by cutting off a dummy lead connecting between said power or ground lead and a part of an outer frame of a lead frame parallel to said shorter sides of said insulating supporting substrate.

23. A semiconductor device comprising:
a semiconductor chip having a first surface, a second surface and plural bonding pads on said first surface;
a wiring body including a plate-shaped insulating supporting substrate and plural lines supported by said insulating supporting substrate, said wiring body being mounted on said first surface of said semiconductor chip;
a bonding member for electrically connecting said bonding pads of said semiconductor chip with a part of each of said plural lines of said wiring body; and
plural leads connected with another part of each of said plural lines of said wiring body,
wherein said insulating supporting substrate of said wiring body is provided with at least either an opening or a notch, and
said bonding pads of said semiconductor chip are formed so as to be disposed on inside of said opening or notch.

24. A semiconductor device comprising:
a semiconductor chip having a first surface, a second surface and plural bonding pads on said first surface;
a wiring body including a plate-shaped insulating supporting substrate and plural lines supported by said insulating supporting substrate, said wiring body being mounted on said first surface of said semiconductor chip;
a bonding member for electrically connecting said bonding pads of said semiconductor chip with a part of each of said plural lines of said wiring body; and
plural leads connected with another part of each of said plural lines of said wiring body,
wherein said insulating supporting substrate is made from an organic material including at least one of glass epoxy, polyimide, polyester, a benzocyclobutene resin, a BT resin and polyimide amide ether.

25. A semiconductor device comprising:
a semiconductor chip having a first surface, a second surface and plural bonding pads on said first surface;
a wiring body including a plate-shaped insulating supporting substrate and plural lines supported by said insulating supporting substrate, said wiring body being mounted on said first surface of said semiconductor chip;
a bonding member for electrically connecting said bonding pads of said semiconductor chip with a part of each of said plural lines of said wiring body; and
plural leads connected with another part of each of said plural lines of said wiring body,
wherein said insulating supporting substrate is made from an inorganic material including at least one of alumina, silicon nitride, aluminum nitride, silicon carbide, beryllium oxide, silicon, an insulating film-coated metal and high purity glass.

26. A semiconductor device comprising:
a semiconductor chip having a first surface, a second surface and plural bonding pads on said first surface;
a wiring body including a plate-shaped insulating supporting substrate and plural lines supported by said insulating supporting substrate, said wiring body being mounted on said first surface of said semiconductor chip;
a bonding member for electrically connecting said bonding pads of said semiconductor chip with a part of each of said plural lines of said wiring body; and
plural leads connected with another part of each of said plural lines of said wiring body,
wherein said lines are formed by printing a conductive film on said insulating supporting substrate.

27. A semiconductor device comprising:
a semiconductor chip having a first surface, a second surface and plural bonding pads on said first surface;
a wiring body including a plate-shaped insulating supporting substrate and plural lines supported by said insulating supporting substrate, said wiring body being mounted on said first surface of said semiconductor chip;
a bonding member for electrically connecting said bonding pads of said semiconductor chip with a part of each of said plural lines of said wiring body;
plural leads connected with another part of each of said plural lines of said wiring body, and
a second wiring body including a substrate disposed on said first surface of said insulating supporting substrate and lines formed on an upper face of said substrate.

28. The semiconductor device of claim 27,
wherein a part of each of said lines of said second wiring body are connected with either said bonding pads of said semiconductor chip or said part of said lines of said wiring body.

29. A semiconductor device comprising:
a semiconductor chip having a first surface, a second surface and plural bonding pads on said first surface;
a wiring body including a plate-shaped insulating supporting substrate and plural lines supported by said insulating supporting substrate, said wiring body being mounted on said first surface of said semiconductor chip;
a bonding member for electrically connecting said bonding pads of said semiconductor chip with a part of each of said plural lines of said wiring body;
plural leads connected with another part of each of said plural lines of said wiring body, and
a fixing lead for supporting said wiring body at either said first surface or said second surface of said insulating supporting substrate,
wherein said fixing lead functions as at least one of a power lead and a ground lead.

30. A semiconductor device comprising:
a semiconductor chip having a first surface, a second surface and plural bonding pads on said first surface;
a wiring body including a plate-shaped insulating supporting substrate and plural lines supported by said insulating supporting substrate, said wiring body being mounted on said first surface of said semiconductor chip;
a bonding member for electrically connecting said bonding pads of said semiconductor chip with a part of each of said plural lines of said wiring body; and
plural leads connected with another part of each of said plural lines of said wiring body,
wherein a second wiring body is disposed on said second surface of said semiconductor chip, and
said second wiring body includes:
a plate-shaped insulating supporting substrate having a first surface and a second surface opposing said first surface; and
first and second conductive films respectively formed on said first and second surfaces of said insulating supporting substrate and functioning as at least one of a ground line and a power line.

31. The semiconductor device of claim 30, wherein one of said first and second conductive films of said second wiring body functions as a ground line, and the other functions as a power line.

32. The semiconductor device of claim 30, wherein both of said first and second conductive films of said second wiring body function as a ground line.

33. The semiconductor device of claim 30, wherein both of said first and second conductive films of said second wiring body function as a power line.

34. A semiconductor device comprising:
a semiconductor chip including a high frequency semiconductor element and plural bonding pads connected with said semiconductor element;
leads connected with said bonding pads through bonding wires; and
a wiring body for supporting said semiconductor chip,
wherein said wiring body includes:
  a plate-shaped insulating supporting substrate having a first surface and a second surface opposing said first surface; and
  first and second conductive films respectively formed on said first and second surfaces of said insulating supporting substrate and functioning as at least one of a ground line and a power line.

35. The semiconductor device of claim 34, wherein one of said first and second conductive films of said wiring body functions as a ground line and the other functions as a power line.

36. The semiconductor device of claim 34, wherein both of said first and second conductive films of said wiring body function as a ground line.

37. The semiconductor device of claim 34, wherein both of said first and second conductive films of said wiring body function as a power line.

38. A wiring body disposed in a circuit where a high frequency signal flows, comprising:
a plate-shaped insulating supporting substrate having a first surface and a second surface opposing said first surface;
a signal line formed on at least one of said first surface and said second surface of said insulating supporting substrate; and
a power line and a ground line formed on at least one of said first surface and said second surface of said insulating supporting substrate with a substantially constant narrow opposing area sandwiched therebetween on the same surface.

39. The wiring body of claim 38, wherein at least a part of said opposing area is formed in a zigzag manner.

40. The wiring body of claim 38, wherein said signal line, said power line and said ground line are formed on said first surface of said insulating supporting substrate, and
a power line and a ground line, which are electrically connected with said power line and said ground line formed on said first surface, are formed on said second surface of said insulating supporting substrate so as to be separated from each other and together occupy substantially an entire area of said second surface.

41. The wiring body of claim 38, wherein, on both of said first surface and said second surface, said power line and said ground line have a substantially constant narrow opposing area therebetween.

42. The wiring body of claim 38, wherein said signal line, said power line and said ground line are formed on said first surface of said insulating supporting substrate, and a ground line, which is electrically connected with said ground line formed on said first surface, is formed substantially entirely on said second surface of said insulating supporting substrate.

43. The Pairing body of claim 38, wherein said signal line, said power line and said ground line are formed on said first surface of said insulating supporting substrate, and
a power line, which is electrically connected with said power line formed on said first surface, is formed substantially entirely on said second surface of said insulating supporting substrate.

44. The wiring body of claim 38, wherein said signal line, said power line and said ground line are formed on said first surface of said insulating supporting substrate, and
no line is formed on said second surface of said insulating supporting substrate.

45. The wiring body of claim 38, wherein said insulating supporting substrate includes a first substrate and a second substrate stacked on said first substrate,
when an upper face of said second substrate, a lower face of said first substrate, and a lower face of said second substrate or an upper face of said first substrate are respectively designated as a first surface, a second surface and a third surface of said insulating supporting substrate, said signal line, and said power line and said ground line a part of which oppose each other with a small distance therebetween are formed on said first surface of said insulating supporting substrate,
a ground line, which is electrically connected with said ground line formed on said first surface, is formed substantially entirely on one of said second surface and said third surface of said insulating supporting substrate, and
a power line, which is electrically connected with said power line formed on said first surface, is formed substantially entirely on the other of said second surface and said third surface of said insulating supporting substrate.

46. The wiring body of claim 38, wherein said signal line is plural in number, and
between at least two of said plural signal lines, a noise preventing line electrically connected with said ground line formed on said second surface is formed.

47. A wiring body disposed in a circuit where a high frequency signal flows, comprising:
a plate-shaped insulating supporting substrate having a first surface and a second surface opposing said first surface; and
first and second conductive films respectively formed on said first and second surfaces of said insulating supporting substrate and functioning as at least one of a ground line and a power line.

48. The wiring body of claim 47, wherein one of said first and second conductive films functions as a ground line and the other functions as a power line.

49. The wiring body of claim 47, wherein both of said first and second conductive films function as a ground line.

50. The wiring body of claim 47, wherein both of said first and second conductive films function as a power line.

* * * * *